US012796115B2

(12) United States Patent
Yoneda et al.

(10) Patent No.: US 12,796,115 B2
(45) Date of Patent: Nov. 10, 2026

(54) IMAGING DEVICE AND ELECTRONIC DEVICE

(71) Applicant: SEMICONDUCTOR ENERGY LABORATORY CO., LTD., Atsugi (JP)

(72) Inventors: Seiichi Yoneda, Isehara (JP); Takayuki Ikeda, Atsugi (JP); Hiroki Inoue, Atsugi (JP); Yusuke Negoro, Osaka (JP); Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 1074 days.

(21) Appl. No.: 17/904,400

(22) PCT Filed: Feb. 22, 2021

(86) PCT No.: PCT/IB2021/051462
§ 371 (c)(1),
(2) Date: Aug. 17, 2022

(87) PCT Pub. No.: WO2021/176295
PCT Pub. Date: Sep. 10, 2021

(65) Prior Publication Data

US 2023/0054986 A1 Feb. 23, 2023

(30) Foreign Application Priority Data

Mar. 6, 2020 (JP) ................................ 2020-038882

(51) Int. Cl.
*H10F 39/18* (2025.01)
*H04N 25/77* (2023.01)
*H10F 39/00* (2025.01)

(52) U.S. Cl.
CPC ............ *H10F 39/18* (2025.01); *H04N 25/77* (2023.01); *H10F 39/8037* (2025.01); *H10F 39/8063* (2025.01); *H10F 39/811* (2025.01)

(58) Field of Classification Search
CPC ...... H10F 39/18; H10F 39/8037; H04N 25/77
See application file for complete search history.

(56) References Cited

U.S. PATENT DOCUMENTS 7,847,846 B1 12/2010 Ignjatovic et al.
8,378,391 B2 2/2013 Koyama et al.
(Continued)

FOREIGN PATENT DOCUMENTS

CN 110651468 A 1/2020
CN 110870299 A 3/2020
(Continued)

OTHER PUBLICATIONS

International Search Report (Application No. PCT/IB2021/051462) Dated Jun. 8, 2021.
(Continued)

*Primary Examiner* — Yara B Green
*Assistant Examiner* — Christopher M Roland
(74) *Attorney, Agent, or Firm* — Fish & Richardson P.C.

(57) ABSTRACT

An imaging device capable of image processing is provided. The imaging device has an image recognition function. In the imaging device, cells have a function of acquiring imaging data and a function of retaining weight data. Among the cells arranged in a matrix, some of the cells acquire imaging data and the rest of the cells retain weight data. Then, arithmetic operation is performed using the imaging data and the weight data. For example, all the imaging data can be subjected to arithmetic operation where products of the imaging data and the weight data are calculated and the sum of the calculated products is calculated. That is, prod- (Continued)

uct-sum operation can be performed. When an arithmetic operation result is captured by a neural network such as a convolutional neural network (CNN) or the like, the additional function can be used because image processing can be performed on the imaging data.

18 Claims, 32 Drawing Sheets

(56) References Cited

U.S. PATENT DOCUMENTS

| | | | |
|---|---|---|---|
| 9,583,521 | B2 | 2/2017 | Otaka |
| 10,074,687 | B2 | 9/2018 | Kurokawa |
| 11,101,302 | B2 | 8/2021 | Ikeda et al. |
| 11,302,726 | B2 | 4/2022 | Kobayashi et al. |
| 2010/0054550 | A1* | 3/2010 | Okada .................. G06V 40/175 382/118 |
| 2010/0328482 | A1* | 12/2010 | Chang ....................... G06T 5/50 348/222.1 |
| 2015/0319388 | A1 | 11/2015 | Ohshitanai et al. |
| 2016/0172410 | A1 | 6/2016 | Kurokawa |
| 2017/0155856 | A1 | 6/2017 | Ohshitanai et al. |
| 2017/0186800 | A1 | 6/2017 | Ikeda et al. |
| 2020/0099881 | A1 | 3/2020 | Kurokawa |
| 2020/0169683 | A1* | 5/2020 | Yamamoto ............. H10D 30/67 |
| 2020/0176493 | A1 | 6/2020 | Ikeda et al. |
| 2020/0193928 | A1 | 6/2020 | Kawashima et al. |
| 2020/0201603 | A1 | 6/2020 | Kozuma et al. |
| 2020/0304691 | A1 | 9/2020 | Ohmaru |
| 2020/0382730 | A1 | 12/2020 | Kurokawa et al. |
| 2021/0026861 | A1 | 1/2021 | Higashi et al. |
| 2021/0090513 | A1 | 3/2021 | Takahashi et al. |
| 2021/0134860 | A9 | 5/2021 | Ikeda et al. |
| 2021/0151486 | A1 | 5/2021 | Kobayashi et al. |
| 2021/0173249 | A1 | 6/2021 | Kawashima et al. |
| 2021/0202549 | A1 | 7/2021 | Yoneda et al. |
| 2021/0225912 | A1 | 7/2021 | Ikeda |
| 2021/0273007 | A1 | 9/2021 | Takahashi et al. |
| 2021/0281777 | A1 | 9/2021 | Watanabe et al. |
| 2021/0291771 | A1 | 9/2021 | Yamazaki et al. |
| 2021/0318856 | A1 | 10/2021 | Ikeda et al. |
| 2021/0384239 | A1 | 12/2021 | Ikeda et al. |
| 2021/0391468 | A1 | 12/2021 | Yamazaki |
| 2022/0102419 | A1 | 3/2022 | Yamazaki et al. |
| 2022/0201234 | A1 | 6/2022 | Yoneda et al. |
| 2022/0216254 | A1 | 7/2022 | Kobayashi et al. |
| 2022/0264046 | A1 | 8/2022 | Inoue et al. |
| 2022/0321794 | A1 | 10/2022 | Yoneda et al. |
| 2022/0359592 | A1 | 11/2022 | Yoneda et al. |
| 2023/0333816 | A1* | 10/2023 | Hanzawa .............. G06F 7/5443 |

FOREIGN PATENT DOCUMENTS

| | | | |
|---|---|---|---|
| JP | 2011-119711 | A | 6/2011 |
| JP | 2014-220559 | A | 11/2014 |
| JP | 2016-123087 | A | 7/2016 |
| KR | 2020-0012917 | A | 2/2020 |
| KR | 2020-0024151 | A | 3/2020 |
| WO | WO-2018/203169 | | 11/2018 |
| WO | WO-2018/215882 | | 11/2018 |
| WO | WO-2019/012370 | | 1/2019 |

OTHER PUBLICATIONS

Written Opinion (Application No. PCT/IB2021/051462) Dated Jun. 8, 2021.

* cited by examiner

FIG. 4A

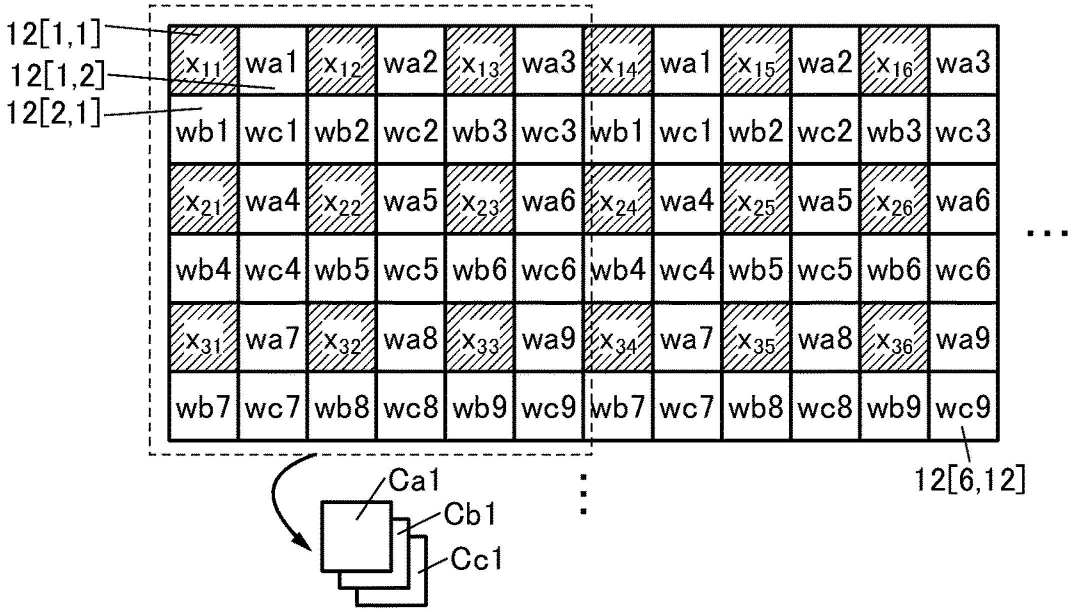

$$Ca1 = x_{11} \cdot wa1 + x_{12} \cdot wa2 + x_{13} \cdot wa3 + x_{21} \cdot wa4 + x_{22} \cdot wa5 + x_{23} \cdot wa6 + x_{31} \cdot wa7 + x_{32} \cdot wa8 + x_{33} \cdot wa9$$

$$Cb1 = x_{11} \cdot wb1 + x_{12} \cdot wb2 + x_{13} \cdot wb3 + x_{21} \cdot wb4 + x_{22} \cdot wb5 + x_{23} \cdot wb6 + x_{31} \cdot wb7 + x_{32} \cdot wb8 + x_{33} \cdot wb9$$

$$Cc1 = x_{11} \cdot wc1 + x_{12} \cdot wc2 + x_{13} \cdot wc3 + x_{21} \cdot wc4 + x_{22} \cdot wc5 + x_{23} \cdot wc6 + x_{31} \cdot wc7 + x_{32} \cdot wc8 + x_{33} \cdot wc9$$

FIG. 4B

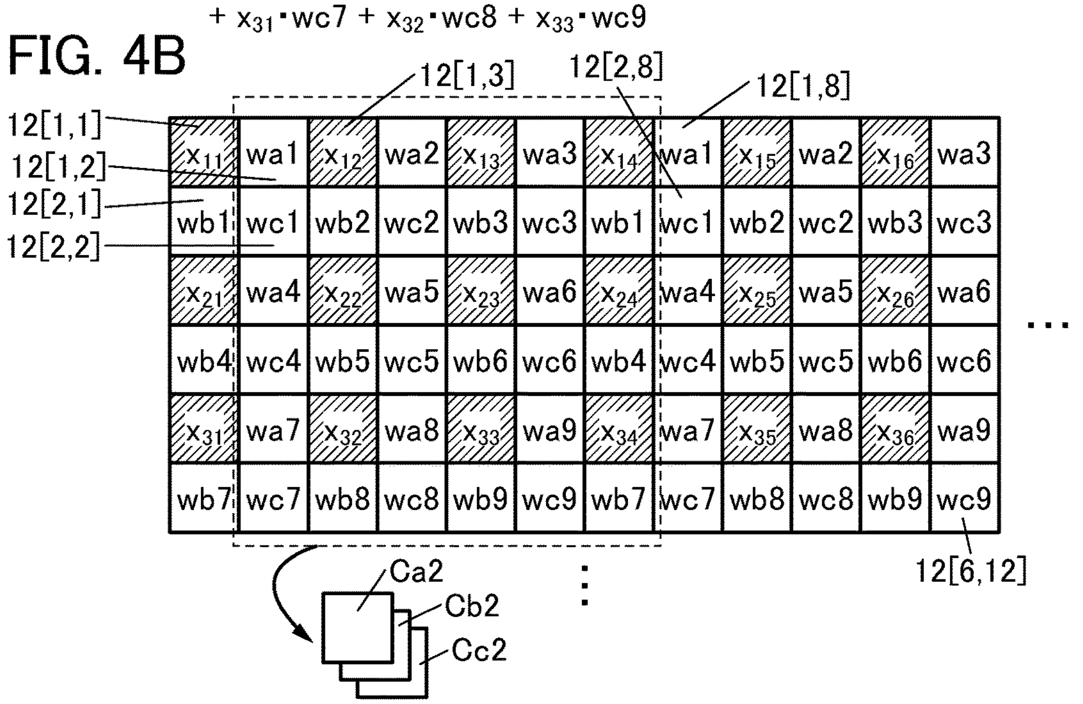

$$Ca2 = x_{12} \cdot wa1 + x_{13} \cdot wa2 + x_{14} \cdot wa3 + x_{22} \cdot wa4 + x_{23} \cdot wa5 + x_{24} \cdot wa6 + x_{32} \cdot wa7 + x_{33} \cdot wa8 + x_{34} \cdot wa9$$

$$Cb2 = x_{12} \cdot wb1 + x_{13} \cdot wb2 + x_{14} \cdot wb3 + x_{22} \cdot wb4 + x_{23} \cdot wb5 + x_{24} \cdot wb6 + x_{32} \cdot wb7 + x_{33} \cdot wb8 + x_{34} \cdot wb9$$

$$Cc2 = x_{12} \cdot wc1 + x_{13} \cdot wc2 + x_{14} \cdot wc3 + x_{22} \cdot wc4 + x_{23} \cdot wc5 + x_{24} \cdot wc6 + x_{32} \cdot wc7 + x_{33} \cdot wc8 + x_{34} \cdot wc9$$

FIG. 5A

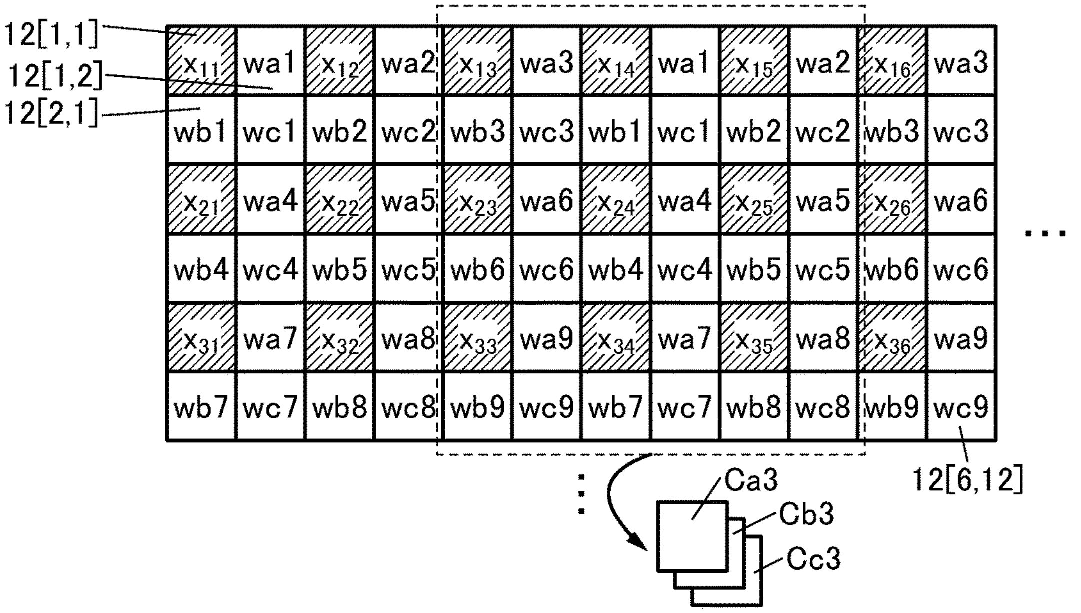

$$Ca3 = x_{13} \cdot wa1 + x_{14} \cdot wa2 + x_{15} \cdot wa3 + x_{23} \cdot wa4 + x_{24} \cdot wa5 + x_{25} \cdot wa6 + x_{33} \cdot wa7 + x_{34} \cdot wa8 + x_{35} \cdot wa9$$

$$Cb3 = x_{13} \cdot wb1 + x_{14} \cdot wb2 + x_{15} \cdot wb3 + x_{23} \cdot wb4 + x_{24} \cdot wb5 + x_{25} \cdot wb6 + x_{33} \cdot wb7 + x_{34} \cdot wb8 + x_{35} \cdot wb9$$

$$Cc3 = x_{13} \cdot wc1 + x_{14} \cdot wc2 + x_{15} \cdot wc3 + x_{23} \cdot wc4 + x_{24} \cdot wc5 + x_{25} \cdot wc6 + x_{33} \cdot wc7 + x_{34} \cdot wc8 + x_{35} \cdot wc9$$

FIG. 5B

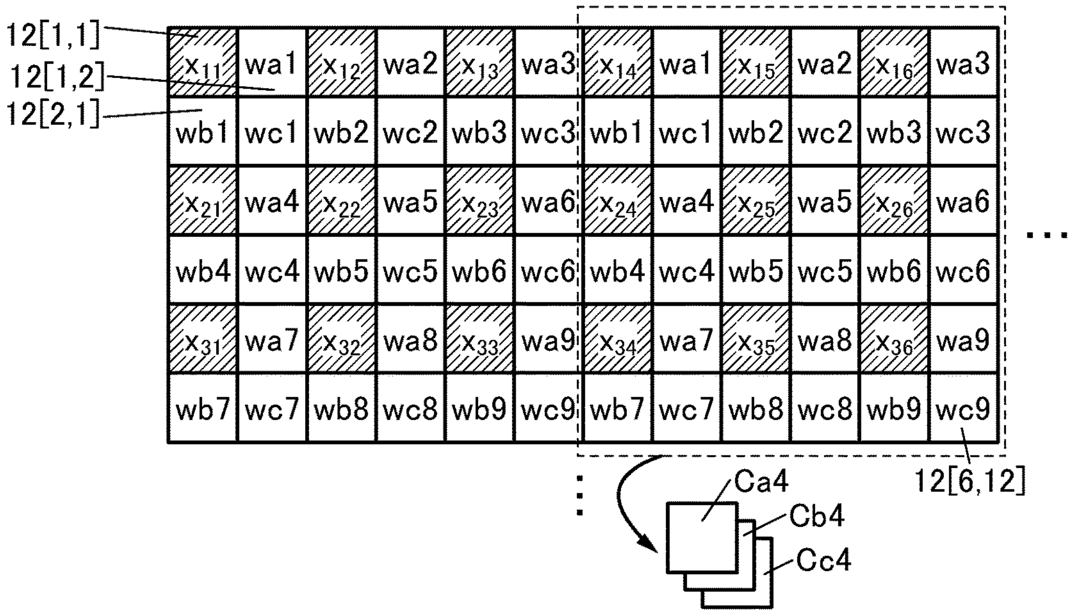

$$Ca4 = x_{14} \cdot wa1 + x_{15} \cdot wa2 + x_{16} \cdot wa3 + x_{24} \cdot wa4 + x_{25} \cdot wa5 + x_{26} \cdot wa6 + x_{34} \cdot wa7 + x_{35} \cdot wa8 + x_{36} \cdot wa9$$

$$Cb4 = x_{14} \cdot wb1 + x_{15} \cdot wb2 + x_{16} \cdot wb3 + x_{24} \cdot wb4 + x_{25} \cdot wb5 + x_{26} \cdot wb6 + x_{34} \cdot wb7 + x_{35} \cdot wb8 + x_{36} \cdot wb9$$

$$Cc4 = x_{14} \cdot wc1 + x_{15} \cdot wc2 + x_{16} \cdot wc3 + x_{24} \cdot wc4 + x_{25} \cdot wc5 + x_{26} \cdot wc6 + x_{34} \cdot wc7 + x_{35} \cdot wc8 + x_{36} \cdot wc9$$

FIG. 6

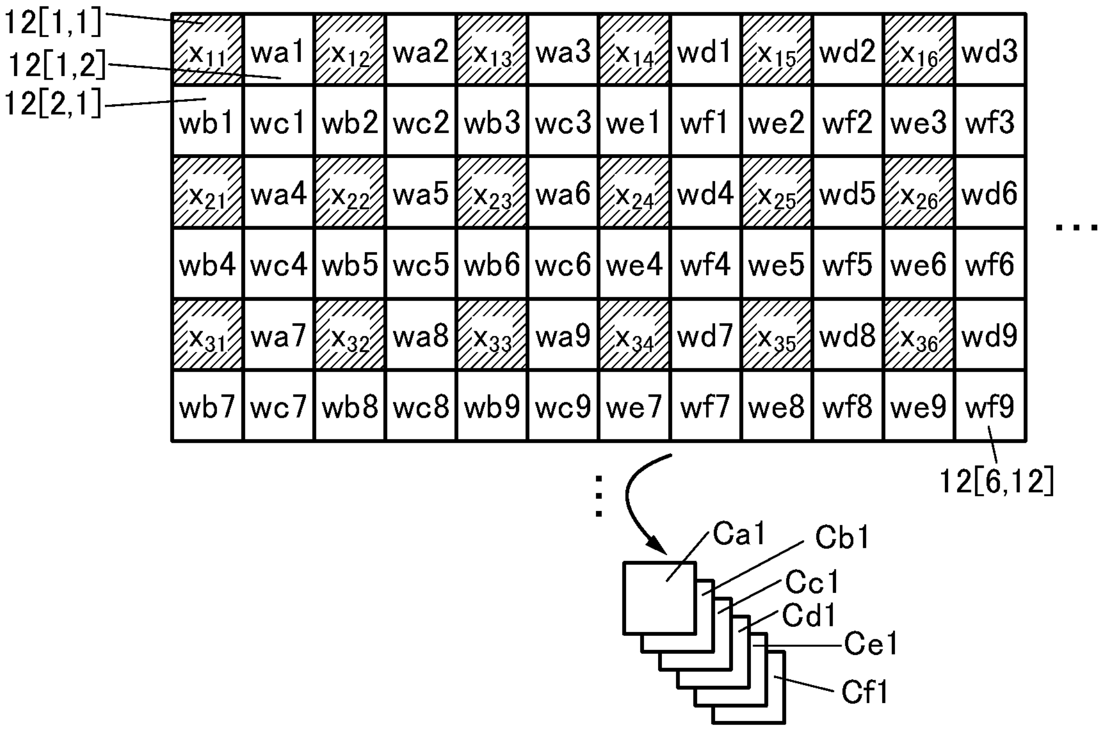

$$Ca1 = x_{11} \cdot wa1 + x_{12} \cdot wa2 + x_{13} \cdot wa3 + x_{21} \cdot wa4 + x_{22} \cdot wa5 + x_{23} \cdot wa6 + x_{31} \cdot wa7 + x_{32} \cdot wa8 + x_{33} \cdot wa9$$

$$Cb1 = x_{11} \cdot wb1 + x_{12} \cdot wb2 + x_{13} \cdot wb3 + x_{21} \cdot wb4 + x_{22} \cdot wb5 + x_{23} \cdot wb6 + x_{31} \cdot wb7 + x_{32} \cdot wb8 + x_{33} \cdot wb9$$

$$Cc1 = x_{11} \cdot wc1 + x_{12} \cdot wc2 + x_{13} \cdot wc3 + x_{21} \cdot wc4 + x_{22} \cdot wc5 + x_{23} \cdot wc6 + x_{31} \cdot wc7 + x_{32} \cdot wc8 + x_{33} \cdot wc9$$

$$Cd1 = x_{11} \cdot wd1 + x_{12} \cdot wd2 + x_{13} \cdot wd3 + x_{21} \cdot wd4 + x_{22} \cdot wd5 + x_{23} \cdot wd6 + x_{31} \cdot wd7 + x_{32} \cdot wd8 + x_{33} \cdot wd9$$

$$Ce1 = x_{11} \cdot we1 + x_{12} \cdot we2 + x_{13} \cdot we3 + x_{21} \cdot we4 + x_{22} \cdot we5 + x_{23} \cdot we6 + x_{31} \cdot we7 + x_{32} \cdot we8 + x_{33} \cdot we9$$

$$Cf1 = x_{11} \cdot wf1 + x_{12} \cdot wf2 + x_{13} \cdot wf3 + x_{21} \cdot wf4 + x_{22} \cdot wf5 + x_{23} \cdot wf6 + x_{31} \cdot wf7 + x_{32} \cdot wf8 + x_{33} \cdot wf9$$

FIG. 29A
Intermediate state
New crystalline region
| Amorphous | Crystalline | Crystal |
|---|---|---|
| ・completely amorphous | ・CAAC<br>・nc<br>・CAC<br><br>excluding single crystal and poly crystal | ・single crystal<br>・poly crystal |
FIG. 29B
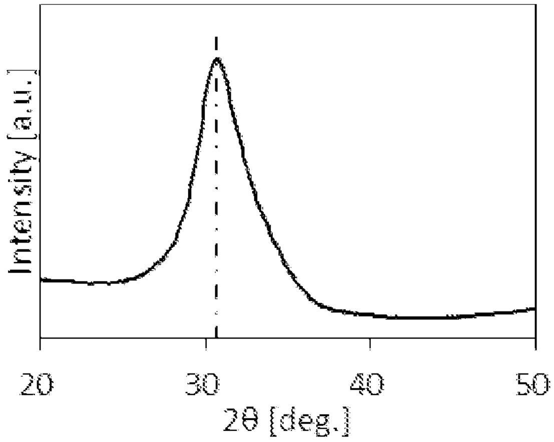
FIG. 29C
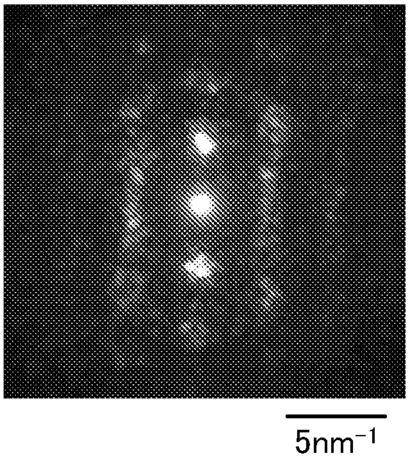

FIG. 30A1
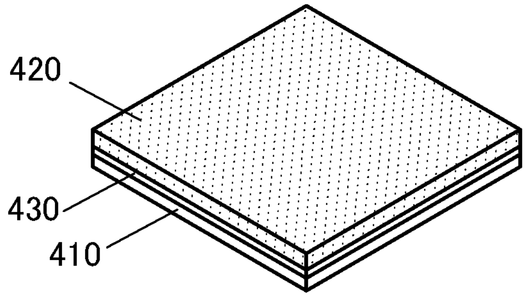
FIG. 30B1
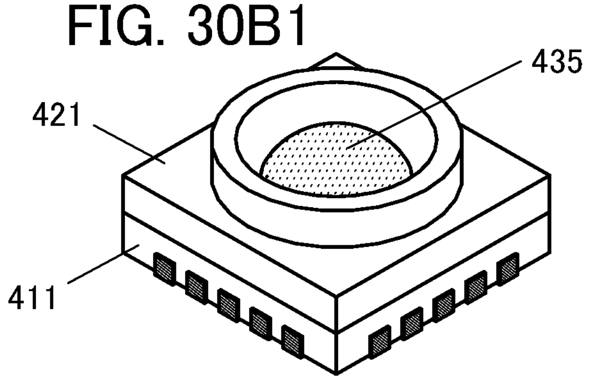
FIG. 30A2
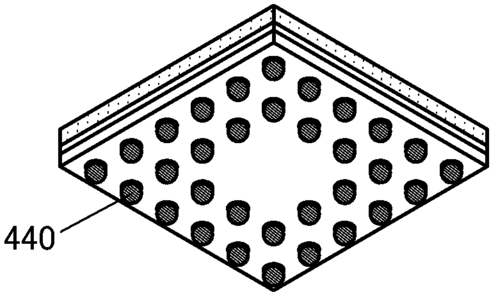
FIG. 30B2
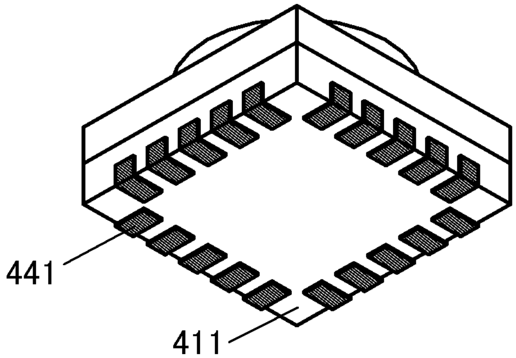
FIG. 30A3
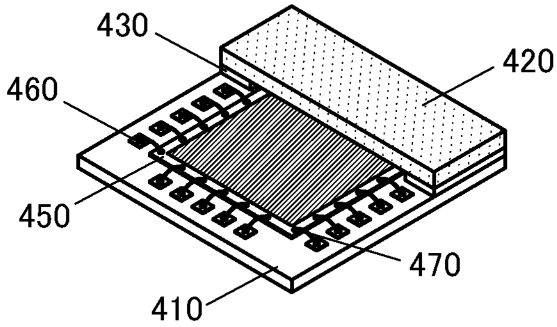
FIG. 30B3
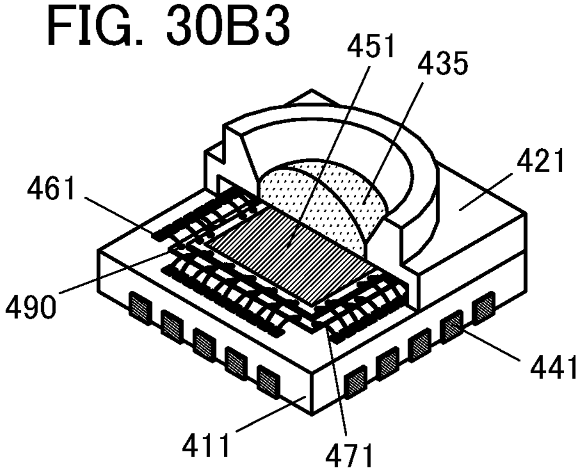

IMAGING DEVICE AND ELECTRONIC DEVICE

CROSS REFERENCE TO RELATED APPLICATIONS

This application is a U.S. National Phase Application under 35 U.S.C. § 371 of International Application PCT/IB2021/051462, filed on Feb. 22, 2021, which is incorporated by reference and claims the benefit of a foreign priority application filed in Japan on Mar. 6, 2020, as Application No. 2020-038882.

TECHNICAL FIELD

One embodiment of the present invention relates to an imaging device and an electronic device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Thus, more specific examples of the technical field of one embodiment of the present invention disclosed in this specification include a semiconductor device, a display device, a liquid crystal display device, a light-emitting device, a lighting device, a power storage device, a memory device, an imaging device, a driving method thereof, and a manufacturing method thereof.

Note that in this specification and the like, a semiconductor device refers to any device that can function by utilizing semiconductor characteristics. A transistor and a semiconductor circuit are embodiments of semiconductor devices. In addition, in some cases, a memory device, a display device, an imaging device, or an electronic device includes a semiconductor device.

BACKGROUND ART

A technique for forming a transistor by using an oxide semiconductor thin film formed over a substrate has attracted attention. For example, an imaging device with a structure in which a transistor that includes an oxide semiconductor and has an extremely low off-state current is used in a pixel circuit is disclosed in Patent Document 1.

In addition, a technique for adding an arithmetic function to an imaging device is disclosed in Patent Document 2.

REFERENCE

Patent Documents

[Patent Document 1] Japanese Published Patent Application No. 2011-119711

[Patent Document 2] Japanese Published Patent Application No. 2016-123087

SUMMARY OF THE INVENTION

Problems to be Solved by the Invention

With development in technology, a high-quality image can be easily captured by an imaging device provided with a solid-state imaging element such as a CMOS image sensor. In the next generation, for example, an imaging device needs to have a variety of additional functions such as an image recognition function through image processing or the like performed on a captured image.

Thus, an object of one embodiment of the present invention is to provide an imaging device capable of image processing. Another object is to provide an imaging device with low power consumption. Another object is to provide an imaging device that can be driven at high speed. Another object is to provide a small imaging device. Another object is to provide a highly reliable imaging device. Another object is to provide an imaging device with high light detection sensitivity. Another object is to provide a novel imaging device or the like. Another object is to provide a method for driving the imaging device or the like. Another object is to provide a novel semiconductor device or the like.

Note that the description of these objects does not preclude the existence of other objects. Note that one embodiment of the present invention does not have to achieve all these objects. Note that other objects will be apparent from the descriptions of the specification, the drawings, the claims, and the like, and other objects can be derived from the descriptions of the specification, the drawings, the claims, and the like.

Means for Solving the Problems

One embodiment of the present invention is an imaging device that includes a cell array where a plurality of cells are arranged in a matrix and a logic circuit. The cell includes a photoelectric conversion element. The cell has a function of acquiring imaging data using the photoelectric conversion element. The cell has a function of retaining weight data. The logic circuit has a function of performing arithmetic operation using the imaging data acquired by the cell and the weight data retained by the cell different from the cell that has acquired the imaging data.

Alternatively, in the above embodiment, the logic circuit may have a function of calculating a product of the imaging data and the weight data.

Alternatively, one embodiment of the present invention is an imaging device that includes a cell array where a plurality of cells are arranged in a matrix and a logic circuit. The cell includes a photoelectric conversion element. The cell has a function of acquiring imaging data using the photoelectric conversion element. The cell has a function of retaining weight data. The logic circuit has a function of performing arithmetic operation using first imaging data, second imaging data, first weight data, and second weight data in the case where, among the plurality of cells, a first cell acquires the first imaging data, a second cell acquires the second imaging data, a third cell retains the first weight data, and a fourth cell retains the second weight data.

Alternatively, in the above embodiment, the logic circuit may have a function of calculating the sum of a product of the first imaging data and the first weight data and a product of the second imaging data and the second weight data.

Alternatively, in the above embodiment, the imaging device may further include a read circuit. The cell may include a first transistor, a second transistor, a third transistor, and a fourth transistor. One electrode of the photoelectric conversion element may be electrically connected to one of a source and a drain of the first transistor. The other of the source and the drain of the first transistor may be electrically connected to one of a source and a drain of the second transistor. The one of the source and the drain of the second transistor may be electrically connected to a gate of the third transistor. One of a source and a drain of the third transistor may be electrically connected to one of a source and a drain of the fourth transistor. The other of the source and the drain of the third transistor may be electrically connected to the logic circuit. The other of the source and the drain of the fourth transistor may be electrically connected to the read circuit. The cell may have a function of retaining the weight data supplied through the source and the drain of the second transistor. The cell may have a function of outputting the imaging data from the other of the source and the drain of the third transistor or the other of the source and the drain of the fourth transistor. The cell may have a function of outputting the weight data from the other of the source and the drain of the third transistor.

Alternatively, in the above embodiment, the cell may have a function of outputting the imaging data as binary data from the other of the source and the drain of the third transistor, and the cell may have a function of outputting the weight data as binary data from the other of the source and the drain of the third transistor.

Alternatively, in the above embodiment, the first transistor and the second transistor may each include a metal oxide in a channel formation region, and the metal oxide may contain In, Zn, and M (M is Al, Ti, Ga, Ge, Sn, Y, Zr, La, Ce, Nd, or Hf).

Alternatively, in the above embodiment, a coloring layer may be further included. At least one of the first to fourth transistors, the photoelectric conversion element, and the coloring layer may have a region where they overlap each other. The coloring layer may have a function of a microlens.

Alternatively, in the above embodiment, the logic circuit may include a fifth transistor and may have a region where the fifth transistor, at least one of the first to fourth transistors, the photoelectric conversion element, and the coloring layer overlap each other.

Alternatively, in the above embodiment, the imaging device may further include a read circuit and an A/D converter circuit. The cell may include a first transistor, a second transistor, a third transistor, a fourth transistor, and a fifth transistor. One electrode of the photoelectric conversion element may be electrically connected to one of a source and a drain of the first transistor. The other of the source and the drain of the first transistor may be electrically connected to one of a source and a drain of the second transistor. The one of the source and the drain of the second transistor may be electrically connected to a gate of the third transistor. One of a source and a drain of the third transistor may be electrically connected to one of a source and a drain of the fourth transistor. The one of the source and the drain of the fourth transistor may be electrically connected to one of a source and a drain of the fifth transistor. The other of the source and the drain of the fourth transistor may be electrically connected to the read circuit. The one of the source and the drain of the fifth transistor may be electrically connected to the A/D converter circuit. The A/D converter circuit may be electrically connected to the logic circuit. A first potential may be supplied to the other of the source and the drain of the third transistor. A second potential may be supplied to the other of the source and the drain of the fifth transistor. The cell may have a function of retaining the weight data supplied through the source and the drain of the second transistor. The cell may have a function of outputting the imaging data from the one of the source and the drain of the third transistor or the other of the source and the drain of the fourth transistor. The cell may have a function of outputting the weight data from the one of the source and the drain of the third transistor.

Alternatively, in the above embodiment, the first transistor and the second transistor may each include a metal oxide in a channel formation region, and the metal oxide may contain In, Zn, and M (M is Al, Ti, Ga, Ge, Sn, Y, Zr, La, Ce, Nd, or Hf).

Alternatively, in the above embodiment, a coloring layer may be further included. At least one of the first to fifth transistors, the photoelectric conversion element, and the coloring layer may have a region where they overlap each other. The coloring layer may have a function of a microlens.

Alternatively, in the above embodiment, the logic circuit may include a sixth transistor and may have a region where the sixth transistor, at least one of the first to fifth transistors, the photoelectric conversion element, and the coloring layer overlap each other.

An electronic device including the imaging device according to one embodiment of the present invention and a display portion is also one embodiment of the present invention.

Effect of the Invention

With the use of one embodiment of the present invention, an imaging device capable of image processing can be provided. Alternatively, an imaging device with low power consumption can be provided. Alternatively, an imaging device that can be driven at high speed can be provided. Alternatively, a small imaging device can be provided. Alternatively, a highly reliable imaging device can be provided. Alternatively, an imaging device with high light detection sensitivity can be provided. Alternatively, a novel imaging device or the like can be provided. Alternatively, a method for driving the imaging device or the like can be provided. Alternatively, a novel semiconductor device or the like can be provided.

Note that the effects of one embodiment of the present invention are not limited to the effects listed above. The effects listed above do not preclude the existence of other effects. Note that the other effects are effects that are not described in this section and will be described below. The other effects that are not described in this section will be derived from the description of the specification, the drawings, and the like and can be extracted from the description by those skilled in the art. Note that one embodiment of the present invention is to have at least one of the effects listed above and/or the other effects. Accordingly, depending on the case, one embodiment of the present invention does not have the effects listed above in some cases.

BRIEF DESCRIPTION OF THE DRAWINGS

FIG. 4A and FIG. 4B are diagrams each illustrating an example of arithmetic operation.

FIG. 5A and FIG. 5B are diagrams each illustrating an example of arithmetic operation.

FIG. 6 is a diagram illustrating an example of arithmetic operation.

FIG. 29A is a diagram showing classification of crystal structures of IGZO. FIG. 29B is a diagram showing an XRD spectrum of a CAAC-IGZO film. FIG. 29C is a diagram showing a nanobeam electron diffraction pattern of a CAAC-IGZO film.

FIG. 30A1 to FIG. 30B3 are perspective views illustrating a package and a module in each of which an imaging device is placed.

MODE FOR CARRYING OUT THE INVENTION

Figure 1:
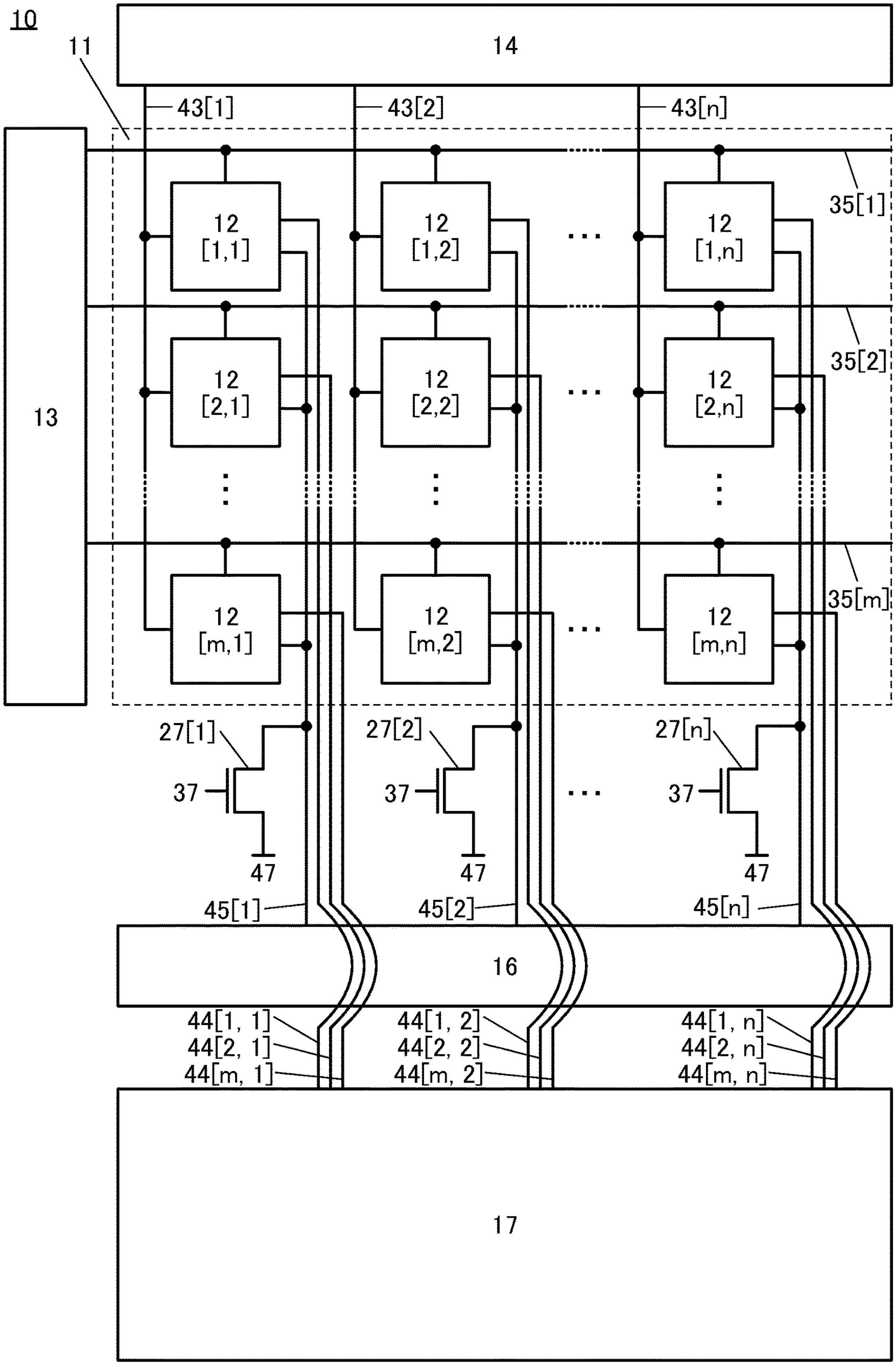
FIG. 1 is a block diagram illustrating a structure example of an imaging device.

Embodiments will be described in detail with reference to the drawings. Note that the present invention is not limited to the following description, and it will be readily understood by those skilled in the art that modes and details of the present invention can be modified in various ways without departing from the spirit and scope of the present invention. Therefore, the present invention should not be construed as being limited to the description of embodiments below. Note that in structures of the invention described below, the same reference numerals are used in common, in different drawings, for the same portions or portions having similar functions, and a repeated description thereof is omitted in some cases. Note that the hatching of the same component that constitutes a drawing is sometimes omitted or changed as appropriate in different drawings.

In addition, even in the case where a single component is illustrated in a circuit diagram, the component may be composed of a plurality of parts as long as there is no functional inconvenience. For example, in some cases, a plurality of transistors that operate as a switch are connected in series or in parallel. Furthermore, in some cases, capacitors are divided and arranged in a plurality of positions.

In addition, one conductor has a plurality of functions such as a wiring, an electrode, and a terminal in some cases. In this specification, a plurality of names are used for the same component in some cases. Furthermore, even in the case where elements are illustrated in a circuit diagram as if they were directly connected to each other, the elements may actually be connected to each other through a plurality of conductors. In this specification, even such a structure is included in the category of direct connection.

Embodiment 1

In this embodiment, an imaging device that is one embodiment of the present invention will be described.

One embodiment of the present invention is an imaging device having an additional function such as an image recognition function. In the imaging device, pixels arranged in a matrix have a function of acquiring imaging data and a function of retaining weight data. Among the pixels arranged in a matrix, some of the pixels acquire imaging data and the rest of the pixels retain weight data. Then, arithmetic operation is performed using the imaging data and the weight data. For example, all the imaging data can be subjected to arithmetic operation where products of the imaging data and the weight data are calculated and the sum of the calculated products is calculated. When an arithmetic operation result is captured by a neural network such as a convolutional neural network (CNN) or the like, the additional function can be used because image processing can be performed on the imaging data.

<Imaging Device Structure Example_1>

FIG. 1 is a block diagram illustrating a structure example of an imaging device 10 that is the imaging device according to one embodiment of the present invention. In the imaging device 10, cells 12 are arranged in a matrix of m rows and n columns (each of m and n is an integer greater than or equal to 1) to form a cell array 11. In addition, the imaging device 10 includes a row driver circuit 13, a data generation circuit 14, a read circuit 16, an arithmetic circuit 17, and transistors 27. Note that each of the circuits illustrated in FIG. 1 is not limited to a single circuit structure and consists of a plurality of circuits in some cases. Alternatively, any of the plurality of circuits described above may be integrated.

In this specification and the like, for example, the cell 12 in a first row and a first column is denoted by a cell 12[1,1], and the cell 12 in an m-th row and an n-th column is denoted by a cell 12[*m,n*].

The row driver circuit 13 is electrically connected to the cells 12 through wirings 35. Here, for example, the cells 12 in the same row can be electrically connected to the row driver circuit 13 through the same wiring 35. In this specification and the like, for example, the wiring 35 that is electrically connected to the cell 12 in the first row is denoted by a wiring 35[1], the wiring 35 that is electrically connected to the cell 12 in a second row is denoted by a wiring 35[2], and the wiring 35 that is electrically connected to the cell 12 in the m-th row is denoted by a wiring 35[*m*]. Note that similar descriptions are sometimes made for other drawings and the like.

The data generation circuit 14 is electrically connected to the cells 12 through wirings 43. Here, for example, the cells 12 in the same column can be electrically connected to the data generation circuit 14 through the same wiring 43. In this specification and the like, for example, the wiring 43 that is electrically connected to the cells 12 in the first column is denoted by a wiring 43[1], the wiring 43 that is electrically connected to the cells 12 in a second column is denoted by a wiring 43[2], and the wiring 43 that is electrically connected to the cells 12 in the n-th column is denoted by a wiring 43[*n*]. Note that similar descriptions are sometimes made for other drawings and the like.

The read circuit 16 is electrically connected to the cells 12 through wirings 45. Here, for example, the cells 12 in the same column can be electrically connected to the read circuit 16 through the same wiring 45.

The arithmetic circuit 17 is electrically connected to the cells 12 through wirings 44. Here, for example, the cells 12 can be electrically connected to different wirings 44. In this specification and the like, for example, the wiring 44 that is electrically connected to the cell 12[1,1] is denoted by a wiring 44[1,1], and the wiring 44 that is electrically connected to the cell 12[*m*,*n*] is denoted by a wiring 44[*m*,*n*]. Note that similar descriptions are sometimes made for other drawings and the like.

One of a source and a drain of the transistor 27 is electrically connected to the wiring 45. The other of the source and the drain of the transistor 27 is electrically connected to a wiring 47. A gate of the transistor 27 is electrically connected to a wiring 37. Here, for example, the transistor 27 that is electrically connected to a wiring 45[1] is denoted by a transistor 27[1], the transistor 27 that is electrically connected to a wiring 45[2] is denoted by a transistor 27[2], and the transistor 27 that is electrically connected to a wiring 45[*n*] is denoted by a transistor 27[*n*].

The wiring 47 functions as a power supply line. For example, a low potential can be supplied to the wiring 47. Moreover, the wiring 37 has a function of a scan line that controls conduction/non-conduction of the transistors 27.

The cell 12 includes a photoelectric conversion element and has a function of acquiring imaging data by using the photoelectric conversion element. That is, the cell 12 has a function of a pixel. In addition, although details will be described later, the cell 12 has a function of retaining weight data generated by the data generation circuit 14. Thus, the cell 12 has a function of a memory.

In this specification and the like, the term "element" can be replaced with the term "device" in some cases. For example, "photoelectric conversion element" can be replaced with "photoelectric conversion device."

The row driver circuit 13 has a function of selecting the cell 12. For example, the row driver circuit 13 has a function of selecting the cell 12 from which imaging data is read. For example, the row driver circuit 13 has a function of generating a selection signal and supplying the generated selection signal to the cells 12 through the wiring 35 to select the cell 12. Thus, the wiring 35 has a function of a signal line.

The data generation circuit 14 has a function of generating weight data. The generated weight data is supplied to the cell 12 through the wiring 43 and retained. Specifically, the weight data is supplied to the cell 12 by which imaging data is not acquired and the supplied weight data is retained. In addition, the data generation circuit 14 has a function of generating reset data that is data supplied to the cell 12 in reset operation performed by the cell 12 before imaging operation and supplying the reset data to the cell 12 through the wiring 43. Thus, the wiring 43 has a function of a data line.

The read circuit 16 includes a column driver circuit. The column driver circuit has a function of selecting the cell 12 from which imaging data is read. In addition, the read circuit 16 can include a correlated double sampling circuit (a CDS circuit), an analog-to-digital converter circuit (an A/D converter circuit), or the like. Here, imaging data output from the cell 12 to the wiring 45 is supplied to the read circuit 16. Thus, the wiring 45 has a function of an output line.

The arithmetic circuit 17 has a function of performing arithmetic operation using imaging data and weight data. As described above, when an arithmetic operation result is captured by a neural network such as a convolutional neural network (CNN) or the like, image processing can be performed. Details of arithmetic operation performed by the arithmetic circuit 17 will be described later. Here, imaging data and weight data output from the cells 12 to the wiring 44 are supplied to the arithmetic circuit 17. Thus, the wiring 44 has a function of an output line.

The imaging device 10 can be driven in a first mode or a second mode. In the first mode, for example, all the cells 12 acquire imaging data and output the acquired imaging data to the read circuit 16. On the other hand, in the second mode, some of the cells 12 acquire imaging data and the rest of the cells 12 retain weight data. Then, the imaging data and the weight data are output to the arithmetic circuit 17.

Accordingly, in the first mode, arithmetic operation using the weight data generated by the data generation circuit 14 is not performed, and the imaging data is output to the outside of the imaging device 10. Thus, the first mode is a mode in which an additional function is not used. On the other hand, in the second mode, arithmetic operation using the imaging data and the weight data is performed so that image processing is performed. Thus, the second mode is a mode in which the additional function is used. In the first mode, for example, all the cells 12 are used to acquire the imaging data and thus the additional function is not able to be used; instead, the resolution of an image represented by the imaging data can be made higher than the resolution of an image represented by the imaging data in the second mode. Note that in the first mode, driving of the arithmetic circuit 17 can be stopped. In addition, in the second mode, driving of the read circuit 16 can be stopped.

Figure 2A:
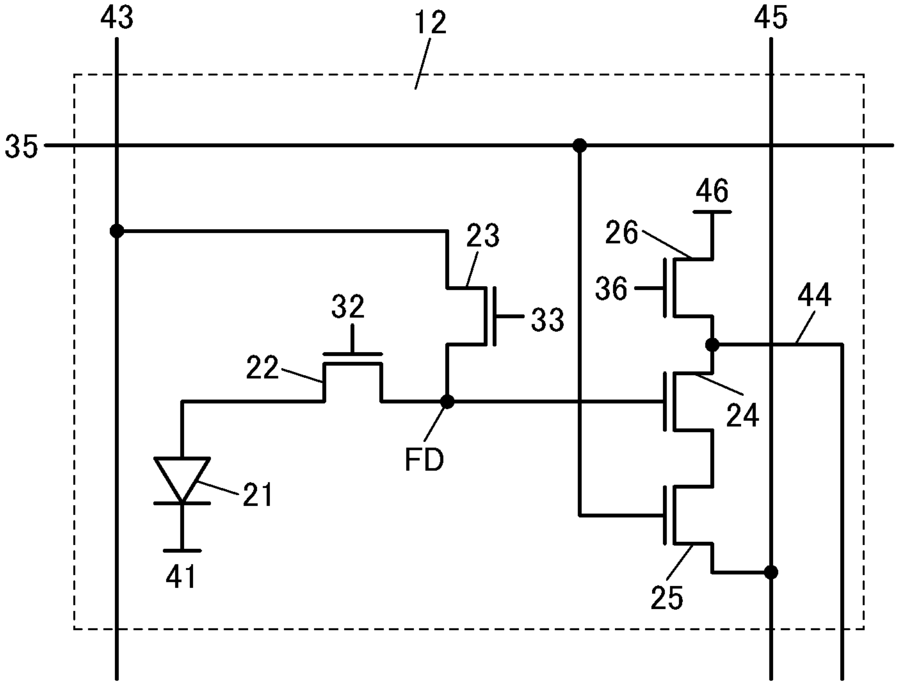
FIG. 2A and FIG. 2B are circuit diagrams each illustrating a cell structure example.

FIG. 2A is a circuit diagram illustrating a structure example of the cell 12. The cell 12 includes a photoelectric conversion element 21, a transistor 22, a transistor 23, a transistor 24, a transistor 25, and a transistor 26.

One electrode of the photoelectric conversion element 21 is electrically connected to one of a source and a drain of the transistor 22. The other of the source and the drain of the transistor 22 is electrically connected to one of a source and a drain of the transistor 23. The one of the source and the drain of the transistor 23 is electrically connected to a gate of the transistor 24. One of a source and a drain of the transistor 24 is electrically connected to one of a source and a drain of the transistor 25.

The other electrode of the photoelectric conversion element 21 is electrically connected to a wiring 41. A gate of the transistor 22 is electrically connected to a wiring 32. The other of the source and the drain of the transistor 23 is electrically connected to the wiring 43. A gate of the transistor 23 is electrically connected to a wiring 33. The other of the source and the drain of the transistor 24 and one of a source and a drain of the transistor 26 are electrically connected to the wiring 44. The other of the source and the drain of the transistor 25 is electrically connected to the wiring 45. A gate of the transistor 25 is electrically connected to the wiring 35. The other of the source and the drain of the transistor 26 is electrically connected to a wiring 46. A gate of the transistor 26 is electrically connected to a wiring 36.

In FIG. 2A, the one electrode of the photoelectric conversion element 21 is an anode, and the other electrode of the photoelectric conversion element 21 is a cathode. Thus, in FIG. 2A, the anode of the photoelectric conversion element 21 is electrically connected to the one of the source and the drain of the transistor 22, and the cathode of the photoelectric conversion element 21 is electrically connected to the wiring 41.

Here, a point where the other of the source and the drain of the transistor 22, the one of the source and the drain of the transistor 23, and the gate of the transistor 24 are electrically connected is referred to as a node FD.

The wiring 41 and the wiring 46 each have a function of a power supply line. For example, a high potential can be supplied to each of the wiring 41 and the wiring 46. In addition, a signal that controls the conduction/non-conduction of each transistor is supplied to each of the wiring 32, the wiring 33, and the wiring 36. Therefore, the wiring 32, the wiring 33, and the wiring 36 each have a function of a signal line.

The photoelectric conversion element 21 has a function of acquiring imaging data. For the photoelectric conversion element 21, a photodiode can be used. To increase light detection sensitivity at low illuminance, an avalanche photodiode is preferably used.

The transistor 22 has a function of controlling transfer of electric charge accumulated in the photoelectric conversion element 21 to the node FD in accordance with illuminance of light delivered to the photoelectric conversion element 21. Thus, the transistor 22 has a function of a transfer transistor.

The transistor 23 has a function of controlling supply of a potential corresponding to reset data and weight data generated by the data generation circuit 14 to the node FD. Thus, the transistor 23 has a function of a reset transistor.

The transistor 24 has a function of setting the potential of the wiring 44 or the potential of the wiring 45 to a potential that corresponds to the potential of the node FD. Accordingly, imaging data acquired by the cell 12 is read through the wiring 44 or the wiring 45, and weight data retained in the cell 12 is read through the wiring 44. Here, the imaging data or weight data retained in the cell 12 is amplified by the transistor 24 and the amplified data is output. Thus, the transistor 24 has a function of an amplifier transistor.

The transistor 25 has a function of controlling selection of the cell 12 from which imaging data is output to the read circuit 16. Thus, the transistor 25 has a function of a selection transistor.

The transistor 26 has a function of controlling the potential of the wiring 44. When the transistor 26 is brought into conduction, the potential of the wiring 44 is set to a potential that corresponds to the potential of the wiring 46. This makes it possible to precharge the wiring 44. Thus, the transistor 26 has a function of controlling precharge of the wiring 44. Accordingly, the transistor 26 has a function of a precharge transistor.

In this specification and the like, a state where a transistor is conducting or a state where the transistor is in an on state refers to a state where current flows between a drain and a source of the transistor. For example, when a difference between a gate potential and a source potential of the transistor is higher than or equal to the threshold voltage of the transistor, the transistor can be brought into conduction. In addition, a state where the transistor is non-conducting or a state where the transistor is in an off state refers to a state where current does not flow between the drain and the source of the transistor. When the difference between the gate potential and the source potential of the transistor is lower than the threshold voltage of the transistor, the transistor can be brought out of conduction.

Here, a transistor with extremely low off-state current is preferably used as each of the transistor 22 and the transistor 23. Thus, a period during which electric charge can be retained in the node FD can be extremely long. Therefore, the cell 12 can retain imaging data and weight data for a long period. Since the cell 12 can retain weight data for a long period, the frequency of refresh operation can be reduced. Accordingly, the power consumption of the imaging device 10 can be reduced. In addition, since the cell 12 can retain imaging data for a long period, a global shutter method can be employed in which electric charge accumulate operation is concurrently performed in all the cells 12 without a complicated circuit configuration or driving method. Furthermore, while imaging data is retained at the node FD, arithmetic operation using the imaging data can be performed more than once. Examples of the transistor with extremely low off-state current include a transistor using a metal oxide in a channel formation region (hereinafter, an OS transistor) and the like.

In addition, the OS transistor has a feature of high breakdown voltage. Here, in the case where an avalanche photodiode is used as the photoelectric conversion element 21, high voltage is sometimes applied; thus, a transistor having high breakdown voltage is preferably used as the transistor connected to the photoelectric conversion element 21. Accordingly, in the case where an avalanche photodiode is used as the photoelectric conversion element 21, the OS transistor is preferably used as the transistor 22.

Here, in the case where each of the transistor 22 and the transistor 23 is an OS transistor, it is preferable that each of the transistor 24 to the transistor 26 be an OS transistor. When all the transistor 22 to the transistor 26 are transistors of the same kind, all the transistors included in the cells 12 can be formed in the same step. Accordingly, the imaging device 10 can be manufactured by a simple method.

Note that as each of the transistor 22 to the transistor 26, a transistor other than the OS transistor may be used. For example, as each of the transistor 22 to the transistor 26, a transistor using silicon in a channel formation region (hereinafter, a Si transistor) is preferably used. For example, when a transistor using single crystal silicon in a channel formation region is used as each of the transistor 22 to the transistor 26, on-state current of each of the transistor 22 to the transistor 26 is increased. Thus, the imaging device 10 can be driven at high speed.

Figure 2B:
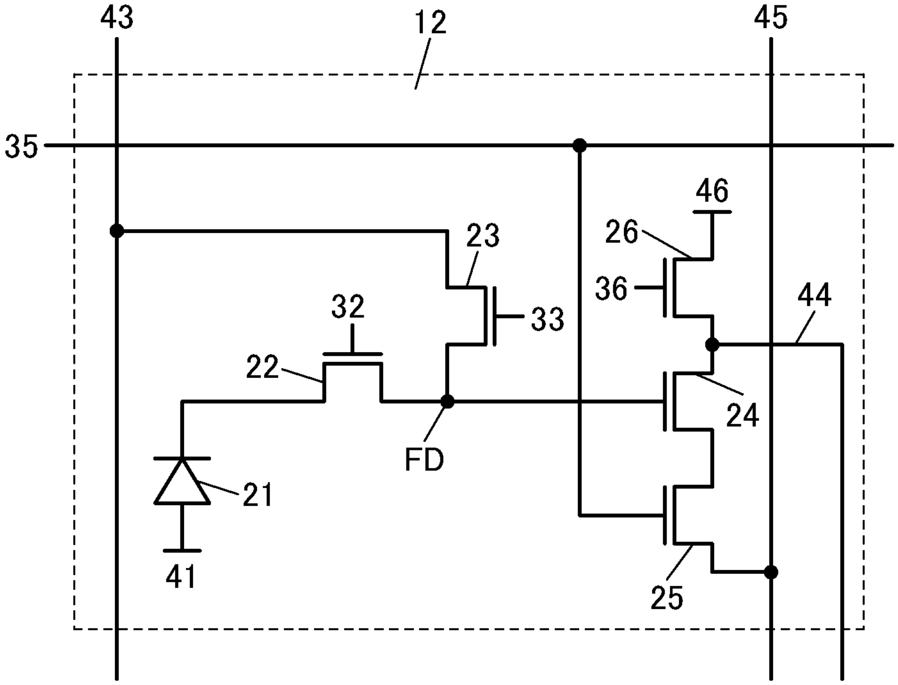

FIG. 2B is a circuit diagram illustrating a structure example of the cell 12, which is a modification example of the structure illustrated in FIG. 2A. The cell 12 illustrated in FIG. 2B differs from the cell 12 illustrated in FIG. 2A in that the cathode of the photoelectric conversion element 21 is electrically connected to the one of the source and the drain of the transistor 22 and the anode of the photoelectric conversion element 21 is electrically connected to the wiring 41. In the cell 12 illustrated in FIG. 2B, the potential of the wiring 41 can be a low potential.

Figure 3:
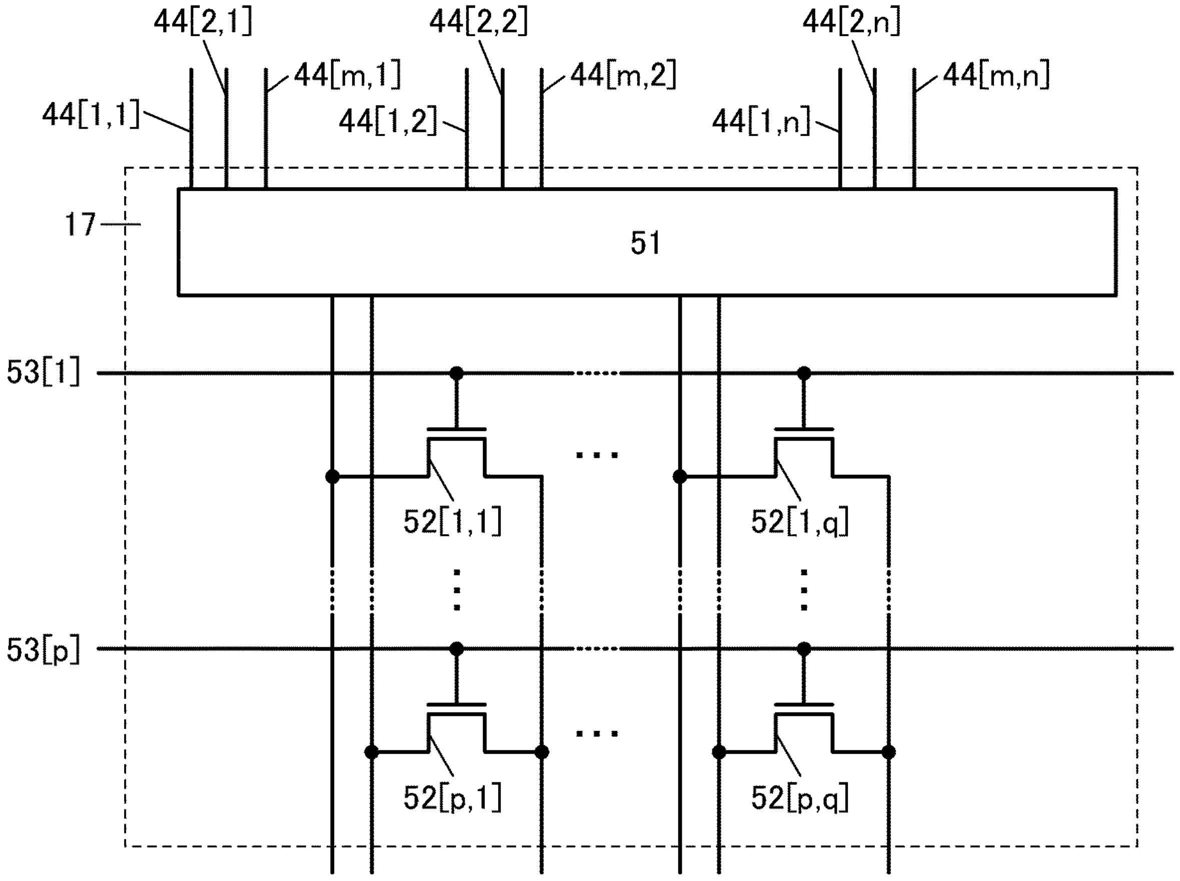
FIG. 3 is a circuit diagram illustrating a structure example of an arithmetic circuit.

FIG. 3 is a circuit diagram illustrating a structure example of the arithmetic circuit 17. The arithmetic circuit 17 includes a logic circuit 51 and a transistor 52[1,1] to a transistor 52[*p,q*] (each of p and q is an integer greater than or equal to 1). Note that the arithmetic circuit 17 in FIG. 3 has a structure where transistors 52 are arranged in a matrix of p×q.

Input terminals of the logic circuit 51 are electrically connected to the wiring 44[1,1] to the wiring 44[*m,n*]. Output terminals of the logic circuit 51 are electrically connected to one of a source and a drain of each of the transistor 52[1,1] to the transistor 52[*p,q*]. Here, the logic circuit 51 can include, for example, m×n input terminals, and a structure can be employed in which the input terminals are electrically connected to different wirings 44. In addition, the logic circuit 51 can include, for example, p×q output terminals, and a structure can be employed in which the output terminals are electrically connected to different transistors 52.

Furthermore, for example, the others of the sources and the drains of the transistors 52 in the same column can be electrically connected to each other. For example, the others of the sources and the drains of the transistor 52[1,1] to the transistor 52[*p*,1] in a first column can be electrically connected to each other, and the others of the sources and the drains of the transistor 52[1,*q*] to the transistor 52[*p,q*] positioned in a q-th column can be electrically connected to each other.

A gate of the transistor 52 is electrically connected to a wiring 53. Here, for example, gates of the transistors 52 in the same row can be electrically connected to each other through the same wiring 53. A signal that controls conduction/non-conduction of the transistor 52 is supplied to the wiring 53. Thus, the wiring 53 has a function of a signal line.

The logic circuit 51 has a function of performing logical operation by using imaging data and weight data output from the cells 12. The logic circuit 51 has a function of performing logical operation by using digital data. An arithmetic operation result can be expressed by, for example, a matrix of p rows and q columns, and data representing each component of the matrix is output from the output terminals of the logic circuit 51.

The transistor 52 has a function of controlling reading of the arithmetic operation result obtained by the logic circuit 51. For example, the logic circuit 51 outputs the matrix of p rows and q columns as the arithmetic operation result. In that case, components in the first row and the first column can be read when the transistor 52[1,1] is brought into conduction, and components in a p-th row and a q-th column can be read when the transistor 52[*p,q*] is brought into conduction.

A Si transistor is preferably used as each of the transistor included in the logic circuit 51 and the transistor 52. For example, as each of the transistor included in the logic circuit 51 and the transistor 52, a transistor using single crystal silicon in a channel formation region is preferably used. As described above, the transistor using single crystal silicon in a channel formation region has high on-state current. Thus, when the transistor using single crystal silicon in a channel formation region is used for the logic circuit 51, the logic circuit 51 can perform arithmetic operation at high speed. In addition, when the transistor using single crystal silicon in a channel formation region is used as the transistor 52, an arithmetic operation result obtained by the logic circuit 51 can be read at high speed. Note that a transistor using amorphous silicon, microcrystalline silicon, or polycrystalline silicon in a channel formation region may be used as the Si transistor.

<Arithmetic Operation Example>

FIG. 4A, FIG. 4B, FIG. 5A, and FIG. 5B are diagrams showing examples of data retained in the cell 12 and arithmetic operation performed by the logic circuit 51. Here, imaging data is denoted by "x," and weight data is denoted by "w." In addition, a numeric character is added to "x" in order to distinguish different imaging data, and a numeric character is added to "w" in order to distinguish different weight data.

In FIG. 4A, FIG. 4B, FIG. 5A, and FIG. 5B, the cell 12[1,1] to the cell 12[6,12] are shown, and hatchings are added to the cells 12 in which imaging data is retained. In FIG. 4A, FIG. 4B, FIG. 5A, and FIG. 5B, among four cells 12, one cell 12 retains imaging data and three cells 12 retain weight data. Specifically, the cell 12 in an odd-numbered row and an odd-numbered column retains imaging data, and the other cells 12 retain weight data.

FIG. 4A shows a situation where product-sum operation is performed between imaging data $x_{11}$ to imaging data $x_{33}$ and weight data wa1 to weight data wa9 so that convolutional data Ca1 is acquired. In addition, FIG. 4A shows a situation where product-sum operation is performed between the imaging data $x_{11}$ to the imaging data $x_{33}$ and weight data wb1 to weight data wb9 so that convolutional data Cb1 is acquired. Furthermore, FIG. 4A shows a situation where product-sum operation is performed between the imaging data $x_{11}$ to the imaging data $x_{33}$ and weight data wc1 to weight data wc9 so that convolutional data Cc1 is acquired.

FIG. 4B shows a situation where product-sum operation is performed between imaging data $x_{12}$ to imaging data $x_{34}$ and the weight data wa1 to the weight data wa9 so that convolutional data Ca2 is acquired. In addition, FIG. 4B shows a situation where product-sum operation is performed between the imaging data $x_{12}$ to the imaging data $x_{34}$ and the weight data wb1 to the weight data wb9 so that convolutional data Cb2 is acquired. Furthermore, FIG. 4B shows a situation where product-sum operation is performed between the imaging data $x_{12}$ to the imaging data $x_{34}$ and the weight data wc1 to the weight data wc9 so that convolutional data Cc2 is acquired.

As shown in FIG. 4B, for example, when the convolutional data Ca2 is acquired, the product of the imaging data $x_{12}$ and the weight data wa1 is calculated. Here, the weight data wa1 is retained in the cell 12[1,8] in addition to the cell 12[1,2]. However, the coordinate of the cell 12[1,2] is closer to the coordinate of the cell 12[1,3] that retains the imaging data $x_{12}$. Thus, the weight data wa1 retained in the cell 12[1,2] is preferably used when the convolutional data Ca2 is acquired because delay time can be reduced as compared to the case where the weight data wa1 retained in the cell 12[1,8] is used. Similarly, for example, the weight data wc1 retained in the cell 12[2,2] is preferably used when the convolutional data Cc2 is acquired because delay time can be reduced as compared to the case where the weight data wc1 retained in the cell 12[2,8] is used. The same applies to other weight data used when the convolutional data Ca2, the convolutional data Cb2, or the convolutional data Cc2 is acquired.

FIG. 5A shows a situation where product-sum operation is performed between imaging data $x_{13}$ to imaging data $x_{35}$ and the weight data wa1 to the weight data wa9 so that convolutional data Ca3 is acquired. In addition, FIG. 5A shows a situation where product-sum operation is performed between the imaging data $x_{13}$ to the imaging data $x_{35}$ and the weight data wb1 to the weight data wb9 so that convolutional data Cb3 is acquired. Furthermore, FIG. 5A shows a situation where product-sum operation is performed between the imaging data $x_{13}$ to the imaging data $x_{35}$ and the weight data wc1 to the weight data wc9 so that convolutional data Cc3 is acquired.

FIG. 5B shows a situation where product-sum operation is performed between imaging data $x_{14}$ to imaging data $x_{36}$ and the weight data wa1 to the weight data wa9 so that convolutional data Ca4 is acquired. In addition, FIG. 5B shows a situation where product-sum operation is performed between the imaging data $x_{14}$ to the imaging data $x_{36}$ and the weight data wb1 to the weight data wb9 so that convolutional data Cb4 is acquired. Furthermore, FIG. 5B shows a situation where product-sum operation is performed between the imaging data $x_{14}$ to the imaging data $x_{36}$ and the weight data wc1 to the weight data wc9 so that convolutional data Cc4 is acquired.

As described above, product-sum operation is performed so that convolutional data can be acquired. In the examples shown in FIG. 4A, FIG. 4B, FIG. 5A, and FIG. 5B, convolutional arithmetic operation (product-sum operation) using three kinds of 3×3 filters with a stride 1 can be performed. Note that, for example, a stride 2 can be obtained by performing not the operation shown in FIG. 4B but the operation shown in FIG. 5A after the operation shown in FIG. 4A.

Here, when the same weight data is retained in a plurality of cells 12, for example, as shown in FIG. 4B, the coordinate of the cell 12 that retains imaging data and the coordinate of the cell 12 that retains a weight coefficient that is to be multiplied by the imaging data can be inhibited from being apart from each other. Accordingly, the increase in the delay time can be inhibited, and thus arithmetic operation by the logic circuit 51 can be performed at high speed. On the other hand, when the number of cells 12 that retain the same weight data is reduced, for example, the number of kinds of filters that can be used in convolutional arithmetic operation can be increased.

FIG. 6 shows examples of data retained in the cell 12 and arithmetic operation performed by the logic circuit 51 when the number of cells 12 that retain weight data is halved as compared to the examples shown in FIG. 4A, FIG. 4B, FIG. 5A, and FIG. 5B. In the examples shown in FIG. 4A, FIG. 4B, FIG. 5A, and FIG. 5B, one kind of weight data is retained in two cells 12 among the cell 12[1,1] to the cell 12[6,12]. In contrast, in the example shown in FIG. 6, one kind of weight data is retained in one cell 12 among the cell 12[1,1] to the cell 12[6,12]. Thus, in the example shown in FIG. 6, weight data Wa1 to weight data Wa9, weight data Wb1 to weight data Wb9, weight data Wc1 to weight data Wc9, weight data Wd1 to weight data Wd9, weight data We1 to weight data We9, and weight data Wf1 to weight data Wf9 can be retained in the cells 12. That is, 54 kinds of weight data can be retained in the cells 12. Consequently, convolutional arithmetic operation using six kinds of 3×3 filters can be performed. Accordingly, for example, in the case where convolutional arithmetic operation is performed using the imaging data $x_{11}$ to the imaging data $x_{33}$, convolutional data Cd1, convolutional data Ce1, and convolutional data Cf1 can be acquired in addition to the convolutional data Ca1, the convolutional data Cb1, and the convolutional data Cc1, as shown in FIG. 6. Consequently, for example, many image feature values can be extracted, and thus the imaging device 10 can perform image processing with high accuracy. As a result, the performance of the additional function of the imaging device 10 can be higher.

In addition, in the examples shown in FIG. 4A, FIG. 4B, FIG. 5A, FIG. 5B, and FIG. 6, among four cells 12, one cell 12 retains imaging data and three cells 12 retain weight data. That is, among the cells 12 that constitute the cell array 11, one of the four cells 12 retains imaging data and three of the four cells 12 retain weight data. Here, when the proportion of the cells 12 that retain the imaging data is increased, the resolution of an image represented by the imaging data can be increased. In contrast, when the proportion of the cells 12 that retain the weight data is increased, image processing can be performed with higher accuracy, and the performance of the additional function of the imaging device 10 can be higher.

Note that the logic circuit 51 may have a function of performing arithmetic operation other than product-sum operation. For example, the logic circuit 51 may have a function of performing pooling. When the logic circuit 51 has a function of performing pooling, the capacity of data output to the outside of the imaging device 10 can be decreased.

As described above, in the case where the imaging device 10 is driven in the second mode, the arithmetic circuit 17 including the logic circuit 51 performs arithmetic operation. Thus, the arithmetic operation shown in FIG. 4A, FIG. 4B, FIG. 5A, FIG. 5B, and FIG. 6 is performed when the imaging device 10 is driven in the second mode. Note that in the case where the imaging device 10 is driven in the first mode, all the cells 12 can retain imaging data x.

<Imaging Device Driving Method Example_1>

Figure 7:
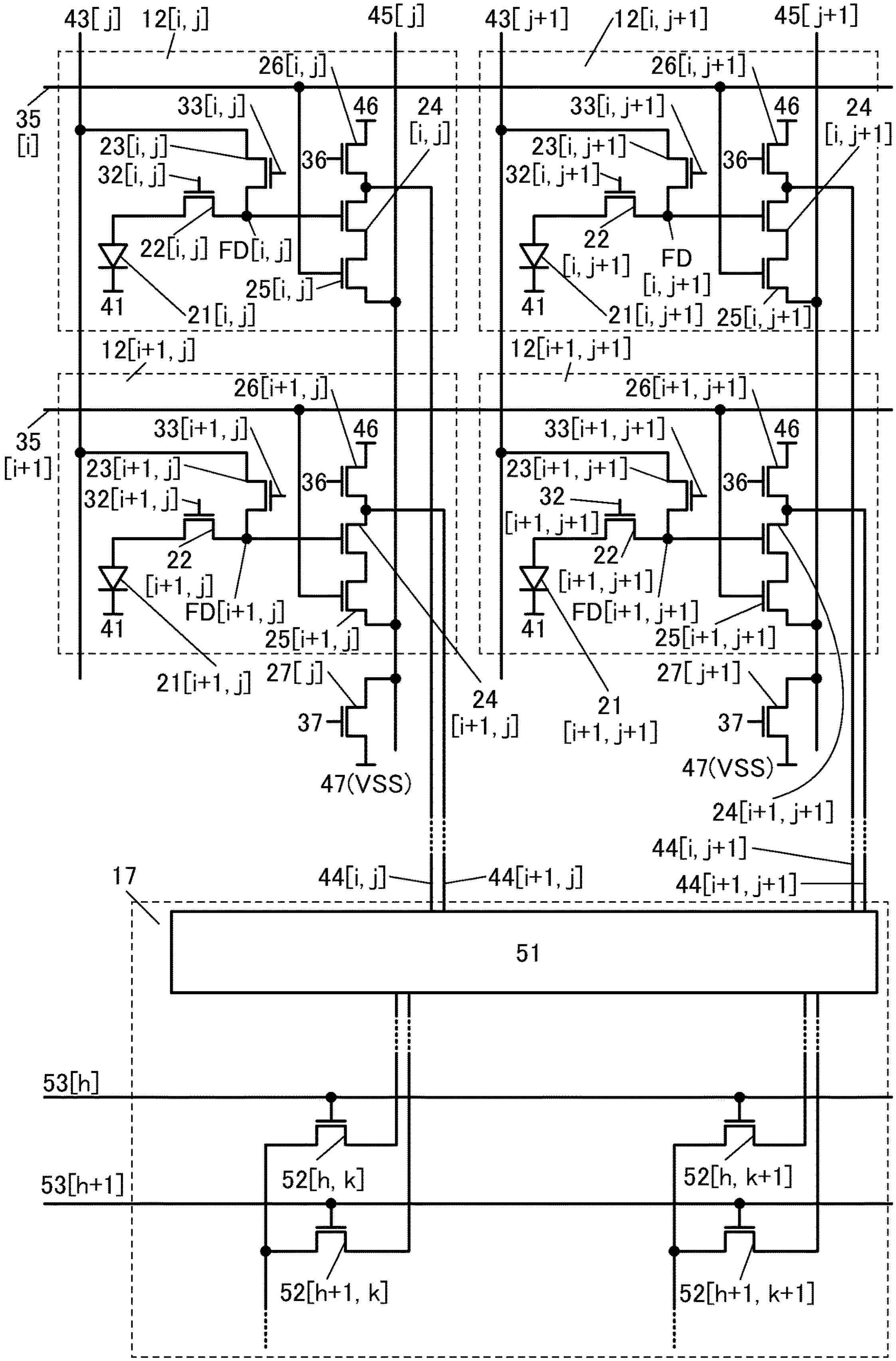
FIG. 7 is a circuit diagram illustrating a structure example of the imaging device.

An example of a method for driving the imaging device 10 is described below. Specifically, an example of a method for driving the cell 12[*i,j*] (i is an integer greater than or equal to 1 and less than or equal to m−1 and j is an integer greater than or equal to 1 and less than or equal to n−1), the cell 12[*i,j*+1], the cell 12[*i*+1,*j*], the cell 12[*i*+1,*j*+1], a transistor 27[*j*], a transistor 27[*j*+1], a transistor 52[*h,k*] (h is an integer greater than or equal to 1 and less than or equal to p−1 and k is an integer greater than or equal to 1 and less than or equal to q−1), a transistor 52[*h,k*+1], a transistor 52[*h*+1,*k*], and a transistor 52[*h*+1,*k*+1] is described. FIG. 7 is a circuit diagram illustrating components for illustrating the example of the driving method among the components of the imaging device 10. As illustrated in FIG. 7, a potential VSS is supplied to the wiring 47 as a low potential. In addition, a high potential is supplied to each of the wiring 41 and the wiring 46.

In the following description, all the transistors related to the description of the driving method are n-channel transistors; however, when the magnitude relationship of potentials is switched as appropriate, for example, the following description of the driving method can be referred to even when some or all of the transistors are p-channel transistors. In addition, as illustrated in FIG. 7, the driving method is described on the assumption that the cell 12 has the structure illustrated in FIG. 2A; however, when the magnitude relationship of potentials is switched as appropriate, for example, the following description can be referred to even when the cell 12 has the structure illustrated in FIG. 2B.

Figure 8:
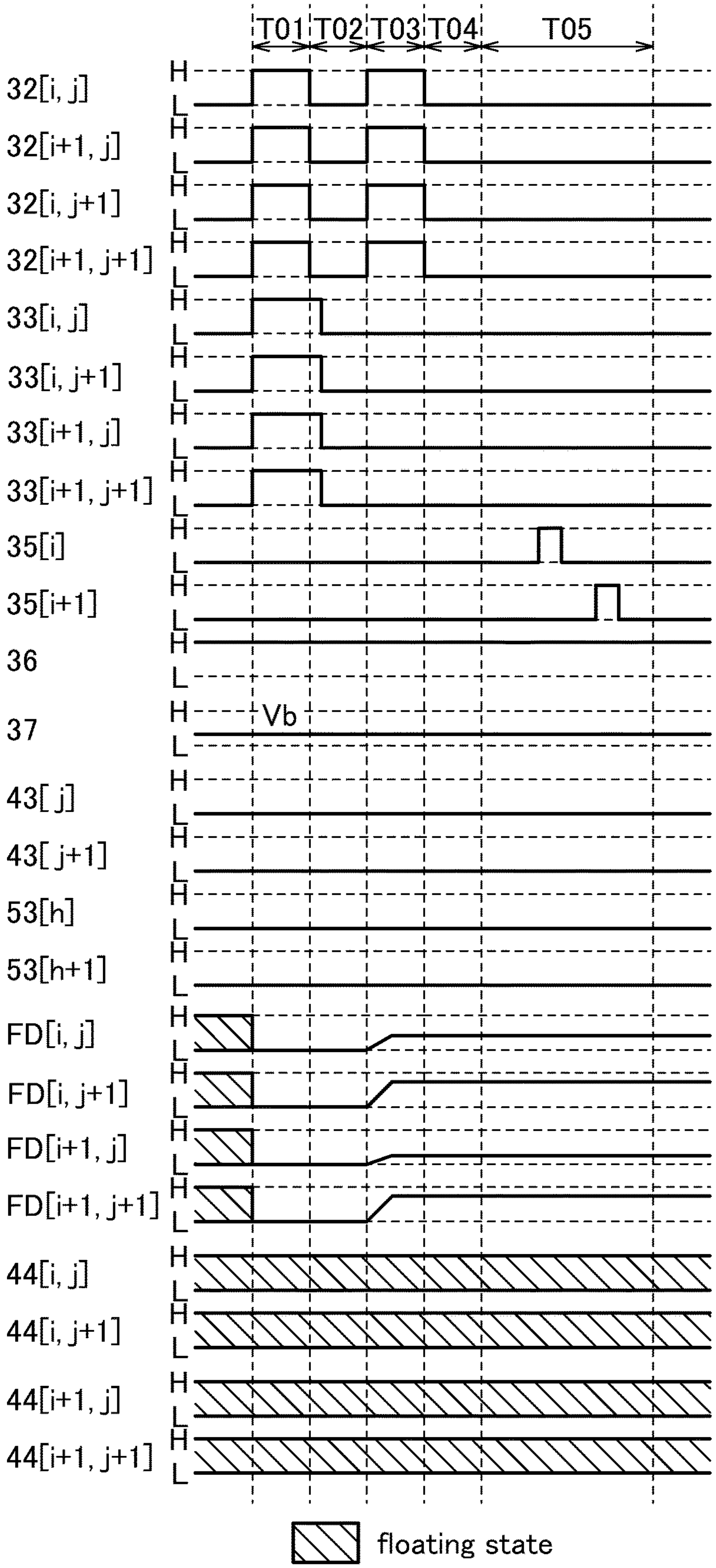
FIG. 8 is a timing chart showing an example of a method for driving the imaging device.

FIG. 8 is a timing chart showing an example of the method for driving the imaging device 10 when the imaging device 10 is driven in the first mode. As described above, the arithmetic operation using the weight data is not performed in the first mode.

In the timing chart shown in FIG. 8, a high potential is denoted by “H” and a low potential is denoted by “L.” In addition, in the timing chart shown in FIG. 8, delay and the like inside the circuit are not taken into consideration. The same applies to other timing charts and the like.

In a period T01, high potentials are supplied to a wiring 32[*i,j*], a wiring 32[*i*+1,*j*], a wiring 32[*i,j*+1], a wiring 32[*i*+1,*j*+1], a wiring 33[*i,j*], a wiring 33[*i*+1,*j*], a wiring 33[*i,j*+1], a wiring 33[*i*+1,*j*+1], and the wiring 36. Accordingly, a transistor 22[*i,j*], a transistor 22[*i,j*+1], a transistor 22[*i*+1,*j*], a transistor 22[*i*+1,*j*+1], a transistor 23[*i,j*], a transistor 23[*i,j*+1], a transistor 23[*i*+1,*j*], a transistor 23[*i*+1,*j*+1], a transistor 26[*i,j*], a transistor 26[*i,j*+1], a transistor 26[*i*+1,*j*], and a transistor 26[*i*+1,*j*+1] are brought into conduction. In addition, low potentials are supplied to a wiring 35[*i*], a wiring 35[*i*+1], a wiring 43[*j*], a wiring 43[*j*+1], a wiring 53[*h*], and a wiring 53[*h*+1]. Consequently, a transistor 25[*i,j*], a transistor 25[*i,j*+1], a transistor 25[*i*+1,*j*], a transistor 25[*i*+1,*j*+1], the transistor 52[*h,k*], the transistor 52[*h,k*+1], the transistor 52[*h*+1,*k*], and the transistor 52[*h*+1,*k*+1] are brought out of conduction. Furthermore, a bias potential Vb is supplied to the wiring 37. Here, the bias potential refers to a potential that drives a transistor as a current source when the potential is supplied to a gate of the transistor. For example, the bias potential refers to a potential that drives a transistor in a saturation region when the potential is supplied to a gate of the transistor.

In the period T01, the potentials of a node FD[*i,j*], a node FD[*i,j*+1], a node FD[*i*+1,*j*], and a node FD[*i*+1,*j*+1] are set to low potentials that are the potentials of the wiring 43[*j*] and the wiring 43[*j*+1]. Accordingly, the potentials of the node FD[*i,j*], the node FD[*i,j*+1], the node FD[*i*+1,*j*], and the node FD[*i*+1,*j*+1] are reset. Thus, the period T01 is a period for reset operation. In the period T01, the data generation circuit 14 generates reset data, and the reset data is supplied to the cell 12 through the wiring 43.

In a period T02, after the potentials of the wiring 32[*i,j*], the wiring 32[*i*+1,*j*], the wiring 32[*i,j*+1], and the wiring 32[*i*+1,*j*+1] are set to low potentials, the potentials of the wiring 33[*i,j*], the wiring 33[*i*+1,*j*], the wiring 33[*i,j*+1], and the wiring 33[*i*+1,*j*+1] are set to low potentials. Thus, after the transistor 22[*i,j*], the transistor 22[*i,j*+1], the transistor 22[*i*+1,*j*], and the transistor 22[*i*+1,*j*+1] are brought out of conduction, the transistor 23[*i,j*], the transistor 23[*i,j*+1], the transistor 23[*i*+1,*j*], and the transistor 23[*i*+1,*j*+1] are brought out of conduction. Accordingly, reset operation is terminated.

In a period T03, the potentials of the wiring 32[*i,j*], the wiring 32[*i*+1,*j*], the wiring 32[*i,j*+1], and the wiring 32[*i*+1,*j*+1] are set to high potentials. Thus, the transistor 22[*i,j*], the transistor 22[*i,j*+1], the transistor 22[*i*+1,*j*], and the transistor 22[*i*+1,*j*+1] are brought into conduction, and the potentials of the node FD[*i,j*], the node FD[*i,j*+1], the node FD[*i*+1,*j*], and the node FD[*i*+1,*j*+1] are increased in accordance with illuminance of light delivered to a photoelectric conversion element 21[*i,j*], a photoelectric conversion element 21[*i,j*+1], a photoelectric conversion element 21[*i*+1,*j*], and a photoelectric conversion element 21[*i*+1,*j*+1], respectively. Accordingly, the period T03 is a period for exposure operation.

In a period T04, the potentials of the wiring 32[*i,j*], the wiring 32[*i*+1,*j*], the wiring 32[*i,j*+1], and the wiring 32[*i*+1,*j*+1] are set to low potentials. Thus, the transistor 22[*i,j*], the transistor 22[*i,j*+1], the transistor 22[*i*+1,*j*], and the transistor 22[*i*+1,*j*+1] are brought out of conduction, and the exposure operation is terminated. Accordingly, the cell 12[*i,j*], the cell 12[*i,j*+1], the cell 12[*i*+1,*j*], and the cell 12[*i*+1,*j*+1] can acquire imaging data.

In a period T05, first, the potential of the wiring 35[*i*] is set to a high potential so that the transistor 25[*i,j*] and the transistor 25[*i,j*+1] are brought into conduction, and then, the potential of the wiring 35[*i*] is set to a low potential so that the transistor 25[*i,j*] and the transistor 25[*i,j*+1] are brought out of conduction. When the transistor 25[*i,j*] is brought into conduction, the imaging data acquired by the cell 12[*i,j*] is output to the read circuit 16 through a wiring 45[*j*], and the imaging data acquired by the cell 12[*i,j*] is read. In addition, when the transistor 25[*i,j*+1] is brought into conduction, the imaging data acquired by the cell 12[*i,j*+1] is output to the read circuit 16 through a wiring 45[*j*+1], and the imaging data acquired by the cell 12[*i,j*+1] is read.

Next, the potential of the wiring 35[*i*+1] is set to a high potential so that the transistor 25[*i*+1,*j*] and the transistor 25[*i*+1,*j*+1] are brought into conduction, and then, the potential of the wiring 35[*i*+1] is set to a low potential so that the transistor 25[*i*+1,*j*] and the transistor 25[*i*+1,*j*+1] are brought out of conduction. When the transistor 25[*i*+1,*j*] is brought into conduction, the imaging data acquired by the cell 12[*i*+1,*j*] is output to the read circuit 16 through a wiring 45[*j*], and the imaging data acquired by the cell 12[*i*+1,*j*] is read. In addition, when the transistor 25[*i*+,*j*+1] is brought into conduction, the imaging data acquired by the cell 12[*i*+1,*j*+1] is output to the read circuit 16 through the wiring 45[*j*+1], and the imaging data acquired by the cell 12[*i*+,*j*+1] is read. Accordingly, the period T05 is a period for read operation.

The above is the example of the method for driving the imaging device 10 in the first mode.

Figure 9:
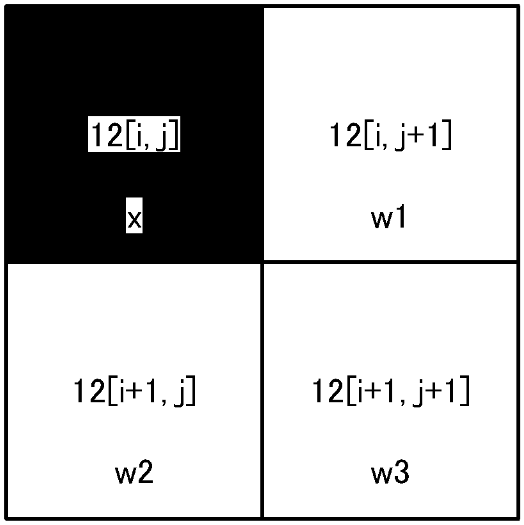
FIG. 9 is a circuit diagram showing an example of a method for driving the imaging device.
Figure 10:
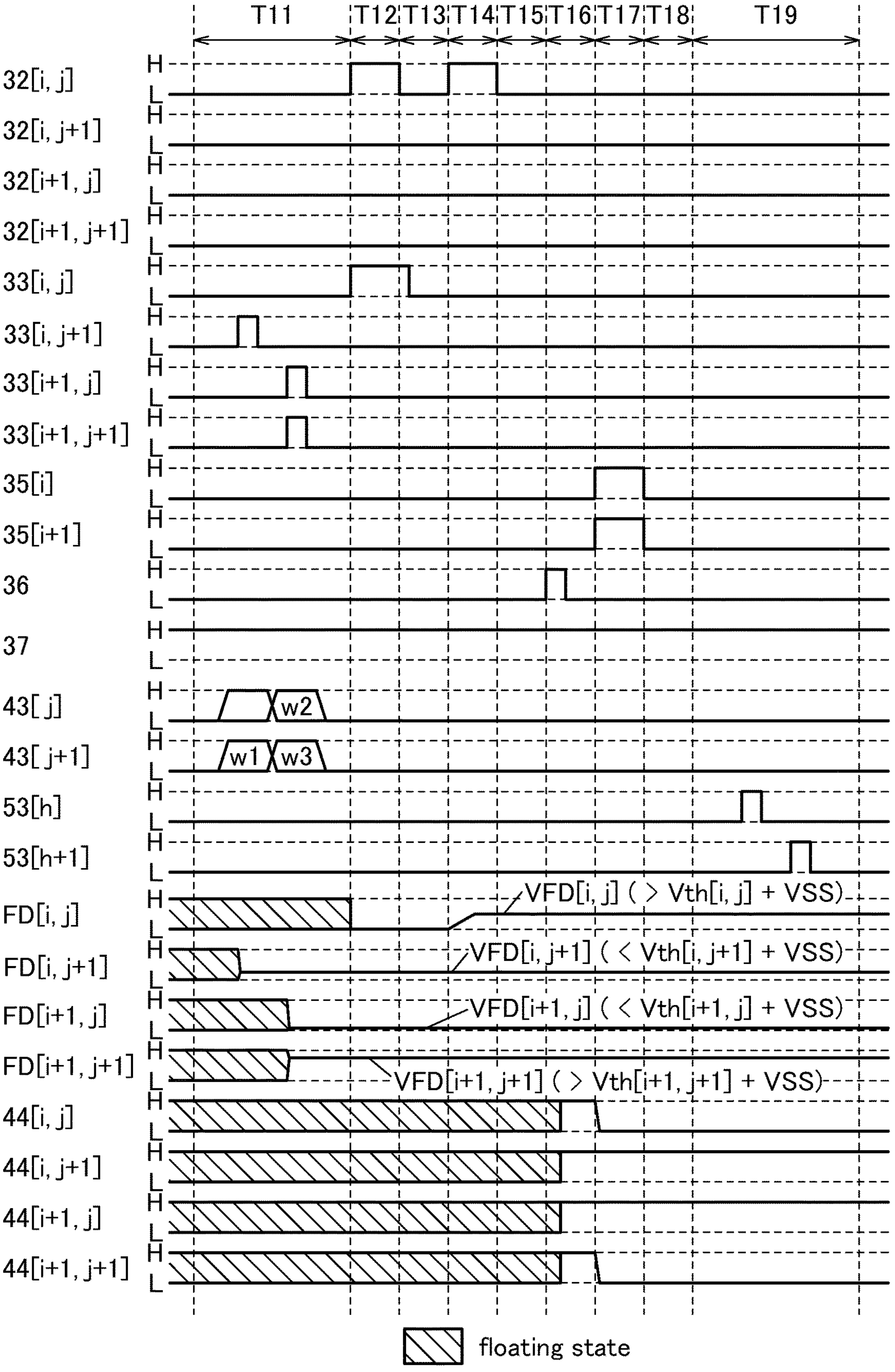
FIG. 10 is a timing chart showing an example of a method for driving the imaging device.

Next, an example of a method for driving the imaging device 10 in the second mode is described. Specifically, as shown in FIG. 9, an example of a method for driving the imaging device 10 when the cell 12[*i,j*] acquires the imaging data x and weight data w1, weight data w2, and weight data w3 are written to the cell 12[*i,j*+1], the cell 12[*i*+1,*j*], and the cell 12[*i*+1,*j*+1], respectively, is described. FIG. 10 is a timing chart showing an example of the method for driving the imaging device 10 when the imaging device 10 is driven in the second mode.

In a period T11, first, a high potential is supplied to the wiring 37. Thus, the transistor 27[*j*] and the transistor 27[*j*+1] are brought into conduction. In addition, low potentials are supplied to the wiring 32[*i,j*], the wiring 32[*i,j*+1], the wiring 32[*i*+1,*j*], the wiring 32[*i*+,*j*+1], the wiring 33[*i,j*], the wiring 33[*i,j*+1], the wiring 33[*i*+1,*j*], the wiring 33[*i*+1,*j*+1], the wiring 35[*i*], the wiring 35[*i*+1], the wiring 36, the wiring 53[*h*], and the wiring 53[*h*+1]. Accordingly, the transistor 22[*i,j*], the transistor 22[*i,j*+1], the transistor 22[*i*+1,*j*], the transistor 22[*i*+1,*j*+1], the transistor 23[*i,j*], the transistor 23[*i,j*+1], the transistor 23[*i*+1,*j*], the transistor 23[*i*+1,*j*+1], the transistor 25[*i,j*], the transistor 25[*i,j*+1], the transistor 25[*i*+1,*j*], the transistor 25[*i*+1,*j*+1], the transistor 26[*i,j*], the transistor 26[*i,j*+1], the transistor 26[*i*+1,*j*], the transistor 26[*i*+1,*j*+1], the transistor 52[*h,k*], the transistor 52[*h,k*+1], the transistor 52[*h*+1,*k*], and the transistor 52[*h*+1,*k*+1] are brought out of conduction.

Next, the data generation circuit 14 supplies the weight data w1 to the wiring 43[*j*+1]. In addition, the potential of the wiring 33[*i,j*+1] is set to a high potential so that the transistor 23[*i,j*+1] is brought into conduction. Thus, the potential of the node FD[*i,j*+1] is set to a potential that corresponds to the weight data w1, and the weight data w1 is written to the cell 12[*i,j*+1]. After that, the potential of the wiring 33[*i,j*+1] is set to a low potential so that the transistor 23[*i,j*+1] is brought out of conduction. Accordingly, the potential of the node FD[*i,j*+1] is retained, and thus the weight data w1 is retained in the cell 12[*i,j*+1].

Next, the data generation circuit 14 supplies the weight data w2 to the wiring 43 [*j*] and supplies the weight data w3 to the wiring 43[*j*+1]. In addition, the potential of the wiring 33[*i*+1,*j*] and the potential of the wiring 33[*i*+1,*j*+1] are set to high potentials so that the transistor 23[*i*+1,*j*] and the transistor 23[*i*+1,*j*+1] are brought into conduction. Thus, the potential of the node FD[*i*+1,*j*] is set to a potential that corresponds to the weight data w2, and the weight data w2 is written to the cell 12[*i*+1,*j*]. Furthermore, the potential of the node FD[*i*+1,*j*+1] is set to a potential that corresponds to the weight data w3, and the weight data w3 is written to the cell 12[*i*+1,*j*+1]. After that, the potential of the wiring 33[*i*+1,*j*] and the potential of the wiring 33[*i*+1,*j*+1] are set to low potentials so that the transistor 23[*i*+1,*j*] and the transistor 23[*i*+1,*j*+1] are brought out of conduction. Accordingly, the potential of the node FD[*i*+1,*j*] and the potential of the node FD[*i*+1,*j*+1] are retained, and thus the weight data w2 is retained in the cell 12[*i*+1,*j*] and the weight data w3 is retained in the cell 12[*i*+1,*j*+1].

Consequently, the period T11 is a period for writing weight data to the cell 12. Note that in the period T11, for example, among a wiring 33[*i*,1] to a wiring 33[*i*,*n*], high potentials can be concurrently supplied to all the wirings 33 that are electrically connected to the cells 12 to which weight data is written. After that, for example, among a wiring 33[*i*+1,j] to a wiring 33[*i*+1,n], high potentials can be concurrently supplied to all the wirings 33 that are electrically connected to the cells 12 to which weight data is written.

In a period T12, the potentials of the wiring 32[*i*,*j*] and the wiring 33[*i*,*j*] are set to high potentials. Thus, the transistor 22[*i*,*j*] and the transistor 23[*i*,*j*] are brought into conduction. In addition, the potential of the wiring 43[*j*] is set to a low potential. Accordingly, the potential of the node FD[*i*,*j*] is set to a low potential. Thus, the potential of the node FD[*i*,*j*] is reset. Consequently, the period T12 is a period for performing reset operation by the cell 12 that acquires imaging data. In the period T12, the data generation circuit 14 generates reset data, and the reset data is supplied to the cell 12[*i*,*j*] through the wiring 43[*j*].

In a period T13, the potential of the wiring 32[*i*,*j*] is set to a low potential, and then the potential of the wiring 33[*i*,*j*] is set to a low potential. Thus, the transistor 22[*i*,*j*] is brought out of conduction, and then the transistor 23[*i*,*j*] is brought out of conduction. Accordingly, reset of the cell 12[*i*,*j*] is terminated.

In a period T14, the potential of the wiring 32[*i*,*j*] is set to a high potential. Thus, the transistor 22[*i*,*j*] is brought into conduction, and the potential of the node FD[*i*,*j*] is increased in accordance with illuminance of light delivered to the photoelectric conversion element 21[*i*,*j*]. Accordingly, the period T14 is a period for performing exposure operation on the cell 12 that acquires imaging data.

In a period T15, the potential of the wiring 32[*i*,*j*] is set to a low potential. Thus, the transistor 22[*i*,*j*] is brought out of conduction, and the exposure operation is terminated. Accordingly, the cell 12[*i*,*j*] can acquire imaging data.

In FIG. 10, after the weight data is written to the cell 12[*i*,*j*+1], the cell 12[*i*+1,*j*], and the cell 12[*i*+1,*j*+1], the cell 12[*i*,*j*] acquires the imaging data; however, one embodiment of the present invention is not limited thereto. After the imaging data is acquired, the weight data may be written. That is, the operation shown in the period T11 may be performed after the operation shown in the period T12 to the period T15 is performed. For example, after the imaging data is written to each of a the cell 12[*i*,*j*+1], the cell 12[*i*+1,*j*], and the cell 12[*i*+1,*j*+1], the weight data may be written so that the imaging data retained in the cell 12[*i*,*j*+1], the cell 12[*i*+1,*j*] and the cell 12[*i*+1,*j*+1] is rewritten into weight data.

In a period T16, the potential of the wiring 36 is set to a high potential so that the transistor 26[*i*,*j*], the transistor 26[*i*,*j*+1], the transistor 26[*i*+1,*j*], and the transistor 26[*i*+1,*j*+1] are brought into conduction. As described above, a high potential is supplied to the wiring 46. Thus, a wiring 44[*i*,*j*], a wiring 44[*i*,*j*+1], a wiring 44[*i*+1,*j*], and a wiring 44[*i*+1,*j*+1] are set to high potentials. Accordingly, the wiring 44[*i*,*j*], the wiring 44[*i*,*j*+1], the wiring 44[*i*+1,*j*], and the wiring 44[*i*+1,*j*+1] are precharged. After termination of precharge, the potential of the wiring 36 is set to a low potential so that the transistor 26[*i*,*j*], the transistor 26[*i*,*j*+1], the transistor 26[*i*+1,*j*], and the transistor 26[*i*+,*j*+1] are brought out of conduction.

In a period T17, the potentials of the wiring 35[*i*] and the wiring 35[*i*+1] are set to high potentials so that the transistor 25[*i*,*j*], the transistor 25[*i*,*j*+1], the transistor 25[*i*+1,*j*], and the transistor 25[*i*+1,*j*+1] are brought into conduction. Note that in the period T17, for example, high potentials can be concurrently supplied to the wiring 35[1] to the wiring 35[*m*].

Here, in the period T17, the potential of the node FD[*i*,*j*] is set to a potential VFD[*i*,*j*], the potential of the node FD[*i*,*j*+1] is set to a potential VFD[*i*,*j*+1], the potential of the node FD[*i*+1,*j*] is set to a potential VFD[*i*+1,*j*], and the potential of the node FD[*i*+1,*j*+1] is set to a potential VFD[*i*+1,*j*+1]. In addition, the threshold voltage of a transistor 24[*i*,*j*] is set to a potential Vth[*i*,*j*], the threshold voltage of a transistor 24[*i*,*j*+1] is set to a potential Vth[*i*,*j*+1], the threshold voltage of a transistor 24[*i*+1,*j*] is set to a potential Vth[*i*+1,*j*], and the threshold voltage of a transistor 24[*i*+1,*j*+1] is set to a potential Vth[*i*+1,*j*+1]. Furthermore, as described above, the potential of the wiring 47 is set to the potential VSS. Moreover, the potential VFD[*i*,*j*] is set higher than a potential "Vth[*i*,*j*]+VSS," the potential VFD[*i*,*j*+1] is set lower than a potential "Vth[*i*,*j*+1]+VSS," the potential VFD[*i*+1,*j*] is set lower than a potential "Vth[*i*+1,*j*]+VSS," and the potential VFD[*i*+1,*j*+1] is set higher than a potential "Vth[*i*+1,*j*+11]+VSS."

Figure 11:
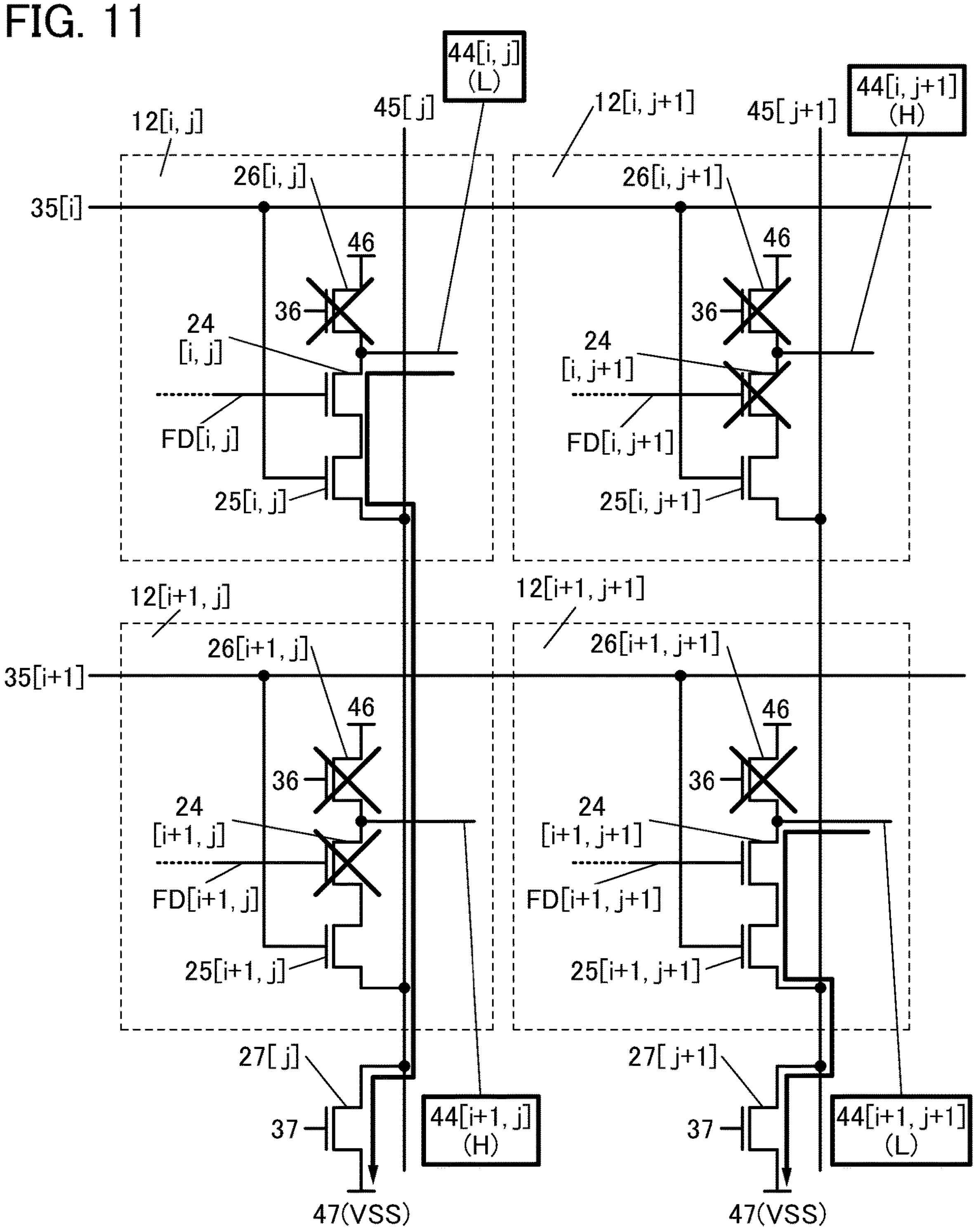
FIG. 11 is a circuit diagram illustrating an example of a method for driving the imaging device.

FIG. 11 is a circuit diagram illustrating operation of the imaging device 10 in the period T17. In FIG. 11, non-conducting transistors are marked with crosses. In addition, current is denoted by arrows.

As illustrated in FIG. 11, in the period T17, the transistor 25[*i*,*j*], the transistor 25[*i*,*j*+1], the transistor 25[*i*+1,*j*], the transistor 25[*i*+1,*j*+1], the transistor 27[*j*], and the transistor 27[*j*+1] are in a conducting state. In addition, the transistor 26[*i*,*j*], the transistor 26[*i*,*j*+1], the transistor 26[*i*+1,*j*], and the transistor 26[*i*+1,*j*+1] are in a non-conducting state.

In the period T16, the wiring 44[*i*,*j*], the wiring 44[*i*,*j*+1], the wiring 44[*i*+1,*j*], and the wiring 44[*i*+1,*j*+1] are precharged to high potentials. In addition, as described above, a low potential is supplied to the wiring 47. Accordingly, the wiring 44 is electrically connected to the drain of the transistor 24, and the wiring 45 is electrically connected to the source of the transistor 24 through the transistor 25.

As described above, in the period T17, the transistor 25 and the transistor 27 are brought into conduction. Thus, a source potential of the transistor 24 is set to the potential VSS. Accordingly, when a gate potential of the transistor 24 is higher than or equal to the sum of the threshold voltage of the transistor 24 and the potential VSS, the transistor 24 is brought into conduction. In contrast, when the gate potential of the transistor 24 is lower than the sum of the threshold voltage of the transistor 24 and the potential VSS, the transistor 24 is brought out of conduction. As described above, the potential VFD[*i,j*] that is a gate potential of the transistor 24[*i,j*] is higher than the sum of the threshold voltage Vth[*i,j*] and the potential VSS. Furthermore, the potential VFD[*i*+1,*j*+1] that is a gate potential of the transistor 24[*i*+1,*j*+1] is higher than the sum of the threshold voltage Vth[*i*+1,*j*+1] and the potential VSS. Accordingly, the transistor 24[*i,j*] and the transistor 24[*i*+1,*j*+1] are brought into conduction. Consequently, the wiring 44[*i,j*] and the wiring 47 are brought into conduction, and the potential of the wiring 44[*i,j*] is set to a low potential. Moreover, the wiring 44[*i*+1,*j*+1] and the wiring 47 are brought into conduction, and the potential of the wiring 44[*i*+1,j+1] is set to a low potential.

In contrast, the potential VFD[*i,j*+1] that is a gate potential of the transistor 24[*i,j*+1] is lower than the sum of the threshold voltage Vth[i,j+1] and the potential VSS. In addition, the potential VFD[*i*+1,*j*] that is a gate potential of the transistor 24[*i*+1,*j*] is lower than the sum of the threshold voltage Vth[*i*+1,*j*] and the potential VSS. Accordingly, the transistor 24[*i,j*+1] and the transistor 24[*i*+1,*j*] are brought out of conduction. Consequently, the potentials of the wiring 44[*i,j*+1] and the wiring 44[*i*+1,*j*] remain high potentials that are precharge potentials.

Accordingly, in the period T17, the imaging data and the weight data retained in the cell 12 can be output from the wiring 44 as binary data. Consequently, the imaging data and the weight data retained in the cell 12 are read.

The imaging data and the weight data output from the cells 12 to the wiring 44 are supplied to the logic circuit 51. Arithmetic operation using the imaging data and the weight data is performed by the logic circuit 51. For example, product-sum operation as shown in FIG. 4A, FIG. 4B, FIG. 5A, and FIG. 5B is performed. Note that since the imaging data and the weight data output from the cells 12 to the wiring 44 are binary data, the imaging data and the weight data can be supplied to the logic circuit 51 without A/D conversion.

In a period T18, the potentials of the wiring 35[*i*] and the wiring 35[*i*+1] are set to low potentials so that the transistor 25[*i,j*], the transistor 25[*i,j*+1], the transistor 25[*i*+1,*j*], and the transistor 25[*i*+1,*j*+1] are brought out of conduction. Thus, reading of the imaging data x, the weight data w1, the weight data w2, and the weight data w3 is terminated. Note that in the period T17, for example, low potentials can be concurrently supplied to the wiring 35[1] to the wiring 35[*m*].

In a period T19, first, the potential of the wiring 53[*h*] is set to a high potential so that the transistor 52[*h,k*] and the transistor 52[*h,k*+1] are brought into conduction, and then, the potential of wiring 53[*h*] is set to a low potential so that the transistor 52[*h,k*] and the transistor 52[*h,k*+1] are brought out of conduction. After that, the potential of the wiring 53[*h*+1] is set to a high potential so that the transistor 52[*h*+1,*k*] and the transistor 52[*h*+1,*k*+1] are brought into conduction, and then, the potential of the wiring 53[*h*+1] is set to a low potential so that the transistor 52[*h*+1,*k*] and the transistor 52[*h*+1,*k*+1] are brought out of conduction. Accordingly, a result of the arithmetic operation by the logic circuit 51 can be read. As described above, when the read arithmetic operation result is captured by a neural network such as a CNN or the like, image processing can be performed.

The above is the example of the method for driving the imaging device 10 in the second mode.

<Imaging Device Structure Example_2>

Figure 12A:
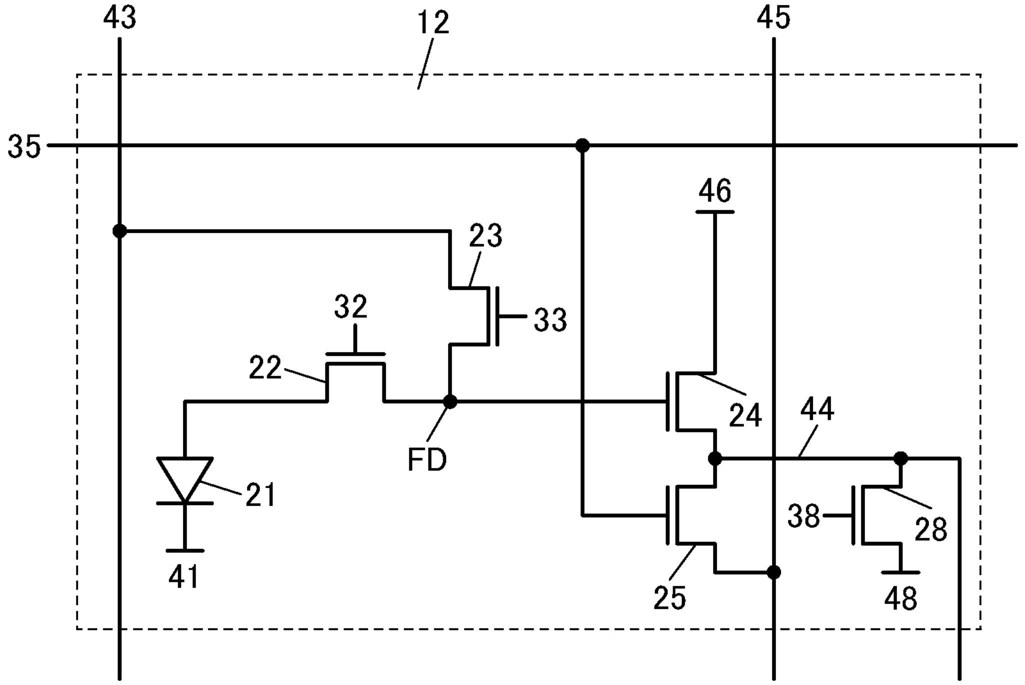
FIG. 12A and FIG. 12B are circuit diagrams each illustrating a cell structure example.

FIG. 12A is a circuit diagram illustrating a structure example of the cell 12, which is a modification example of the structure illustrated in FIG. 2A. The cell 12 illustrated in FIG. 12A differs from the cell 12 illustrated in FIG. 2A in that the transistor 26 is not included and a transistor 28 is included. Structures that are different from the structure of the cell 12 illustrated in FIG. 2A are mainly described below.

The one of the source and the drain of the transistor 24 is electrically connected to the one of the source and the drain of the transistor 25, one of a source and a drain of the transistor 28, and the wiring 44. The other of the source and the drain of the transistor 24 is electrically connected to the wiring 46. The other of the source and the drain of the transistor 25 is electrically connected to the wiring 45. The other of the source and the drain of the transistor 28 is electrically connected to a wiring 48. A gate of the transistor 28 is electrically connected to a wiring 38.

The wiring 48 has a function of a power supply line. For example, a low potential can be supplied to the wiring 48.

As described in detail later, by supply of a bias potential to the wiring 38, a source follower circuit is composed of the transistor 24 and the transistor 28. In that case, an input terminal of the source follower circuit is electrically connected to the node FD, and an output terminal of the source follower circuit is electrically connected to the wiring 44. Thus, the imaging data and the weight data retained in the cell 12 can be output to the wiring 44 as analog data.

As the transistor 28, a transistor of the same kind of the transistor 22 to the transistor 25 can be used. For example, an OS transistor or a Si transistor can be used as the transistor 28.

Figure 12B:
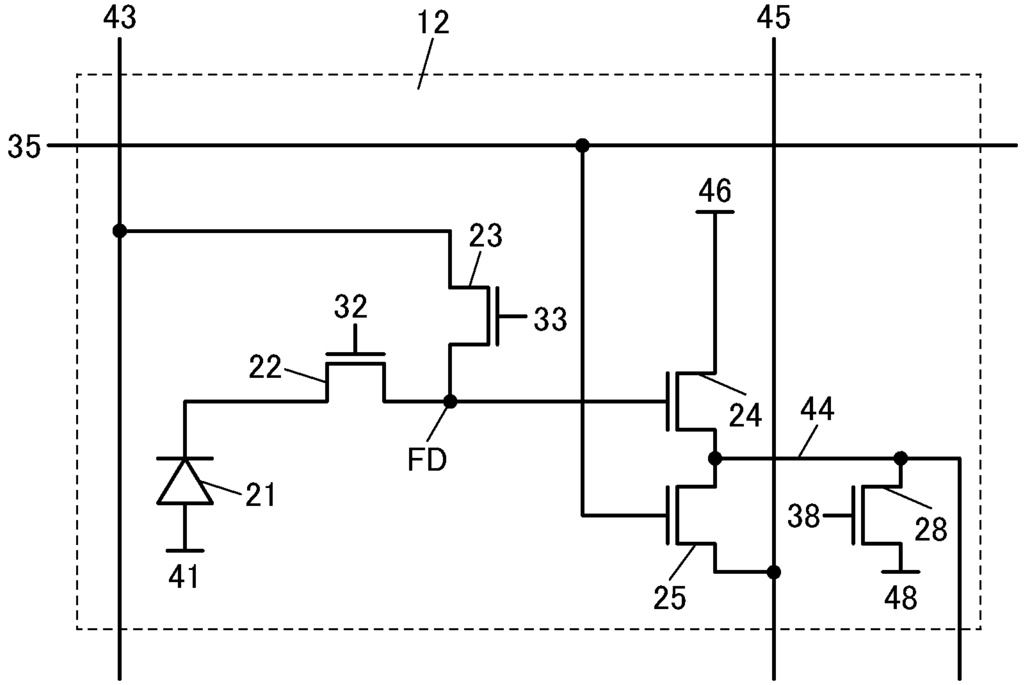

FIG. 12B is a circuit diagram illustrating a structure example of the cell 12, which is a modification example of the structure illustrated in FIG. 12A. The cell 12 illustrated in FIG. 12B differs from the cell 12 illustrated in FIG. 12A in that the cathode of the photoelectric conversion element 21 is electrically connected to the one of the source and the drain of the transistor 22 and the anode of the photoelectric conversion element 21 is electrically connected to the wiring 41.

Figure 13:
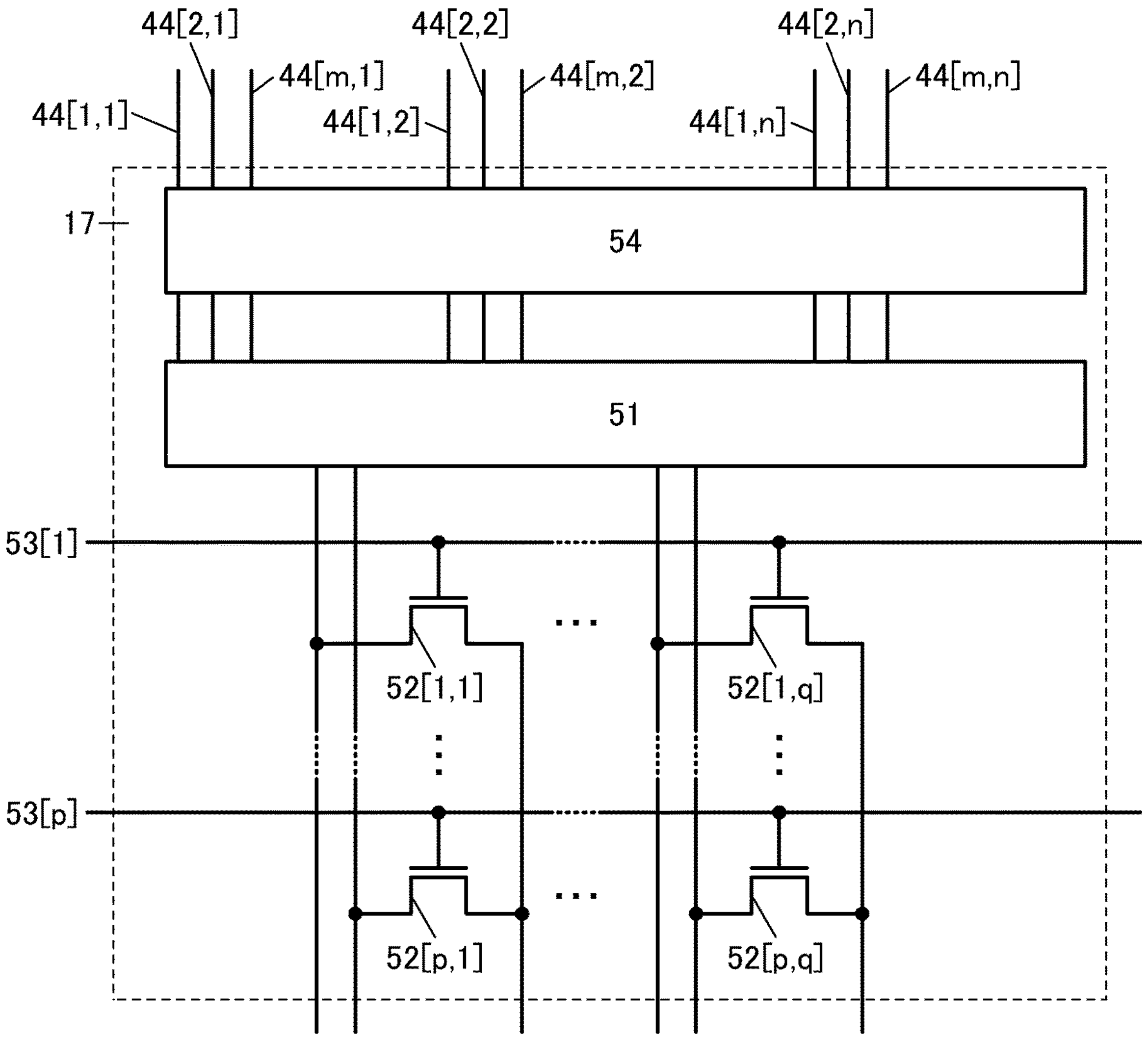
FIG. 13 is a circuit diagram illustrating a structure example of the arithmetic circuit.

FIG. 13 is a circuit diagram illustrating a structure example of the arithmetic circuit 17 when the cell 12 has the structure illustrated in FIG. 12A or FIG. 12B. The arithmetic circuit 17 illustrated in FIG. 13 differs from the arithmetic circuit 17 illustrated in FIG. 3 in that an A/D converter circuit 54 is included.

An input terminal of the A/D converter circuit 54 is electrically connected to the wiring 44, and an output terminal of the A/D converter circuit 54 is electrically connected to an input terminal of the logic circuit 51. Here, the number of input terminals of the A/D converter circuit 54 and the number of output terminals of the A/D converter circuit 54 can be the same as the number of input terminals of the logic circuit 51. For example, each of the numbers can be m×n.

The A/D converter circuit 54 has a function of converting analog data output from the cell 12 to the wiring 44 into digital data. As described above, in the case where the imaging device 10 is driven in the second mode, the imaging data or the weight data retained in the cell 12 is output to the wiring 44. Thus, by providing the A/D converter circuit 54 between the wiring 44 and the logic circuit 51, even when the cell 12 outputs the imaging data or the weight data from the wiring 44 as analog data, the logic circuit 51 can perform arithmetic operation using the imaging data and the weight data.

<Imaging Device Driving Method Example_2>

Figure 14:
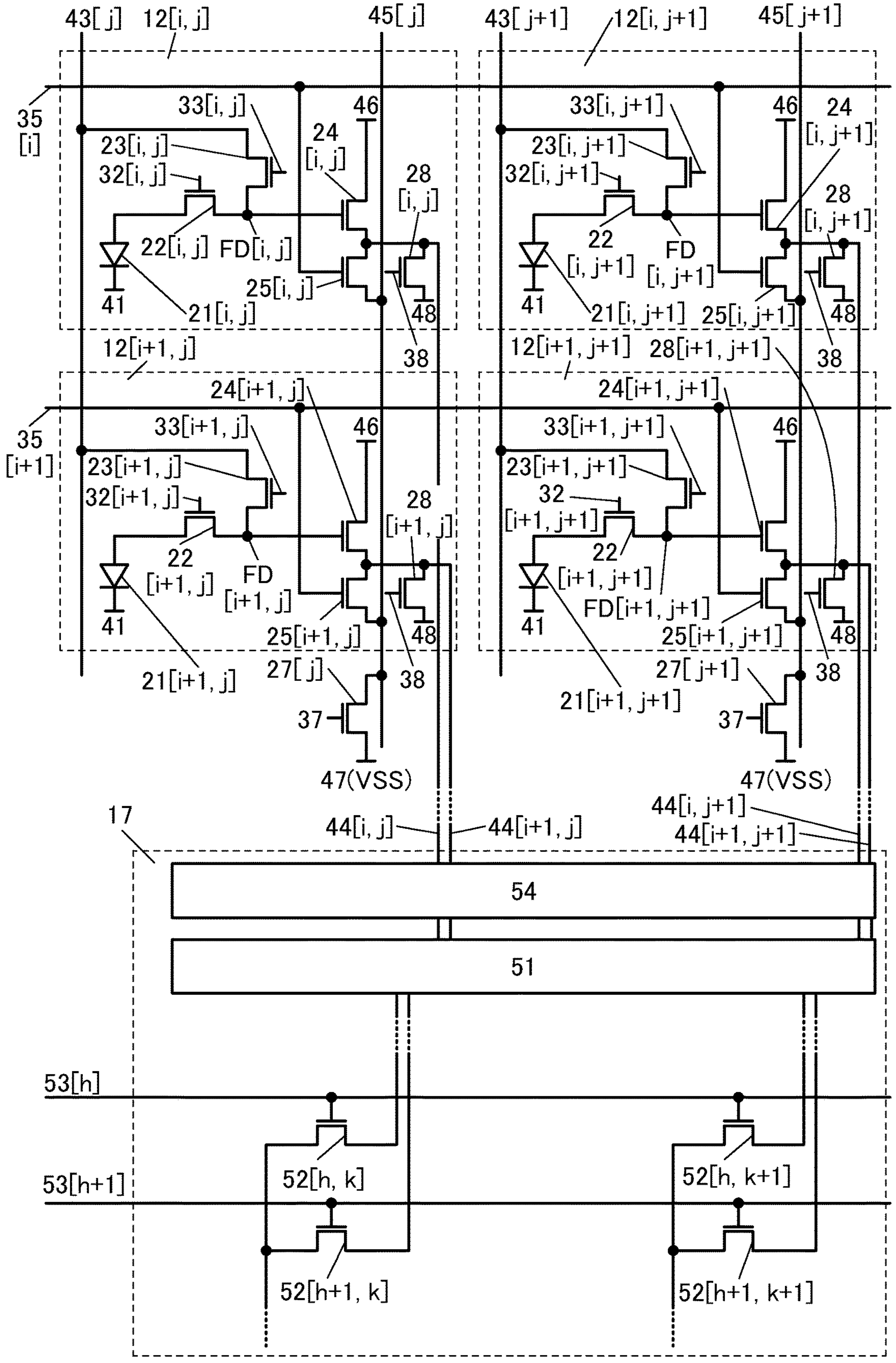
FIG. 14 is a circuit diagram illustrating a structure example of the imaging device.

An example of a method for driving the imaging device 10 in which the cell 12 has the structure illustrated in FIG. 12A and the arithmetic circuit 17 has the structure illustrated in FIG. 13 is described below using FIG. 15 to FIG. 17. Specifically, an example of a method for driving the cell 12[*i,j*] that has the structure illustrated in FIG. 12A, the cell 12[*i,j*+1], the cell 12[*i*+1,*j*], the cell 12[*i*+1,j+1], the transistor 27[*j*], the transistor 27[*j*+1], the transistor 52[*h,k*], the transistor 52[*h,k*+1], the transistor 52[*h*+1,*k*], and the transistor 52[*h*+1,*k*+1] is described. FIG. 14 is a circuit diagram illustrating components for illustrating the example of the driving method among the components of the imaging device 10. As illustrated in FIG. 14, the potential VSS is supplied to the wiring 47 as a low potential. In addition, a high potential is supplied to each of the wiring 41 and the wiring 46. Furthermore, a low potential is supplied to the wiring 48.

In the following description, all the transistors related to the description of the driving method are n-channel transistors; however, when the magnitude relationship of the potentials are switched as appropriate, for example, the following description of the driving method can be referred to even when some or all of the transistors are p-channel transistors. In addition, as illustrated in FIG. 14, the driving method is described on the assumption that the cell 12 has the structure illustrated in FIG. 12A; however, when the magnitude relationship of the potentials is switched as appropriate, for example, the following description can be referred to even when the cell 12 has the structure illustrated in FIG. 12B.

Figure 15:
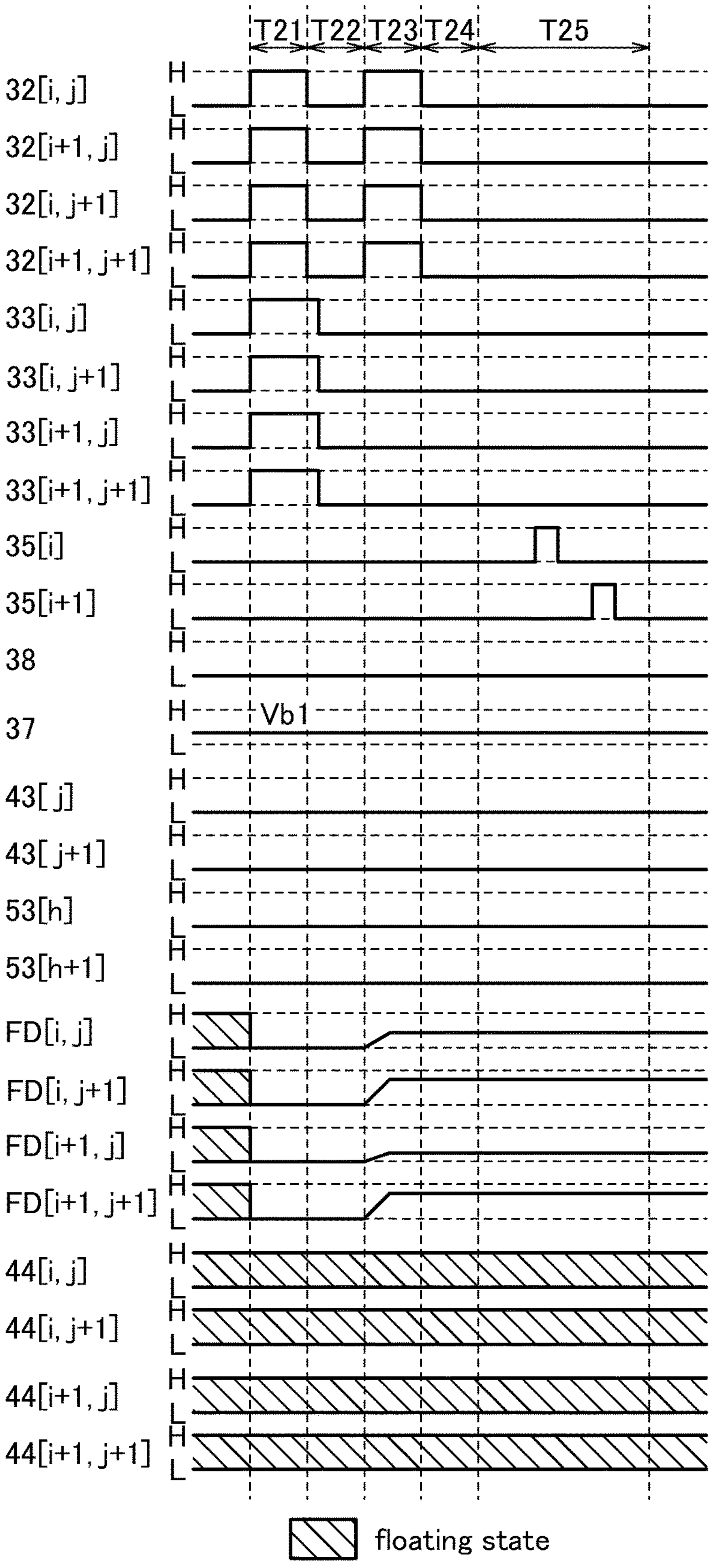
FIG. 15 is a timing chart showing an example of a method for driving the imaging device.
Figure 16:
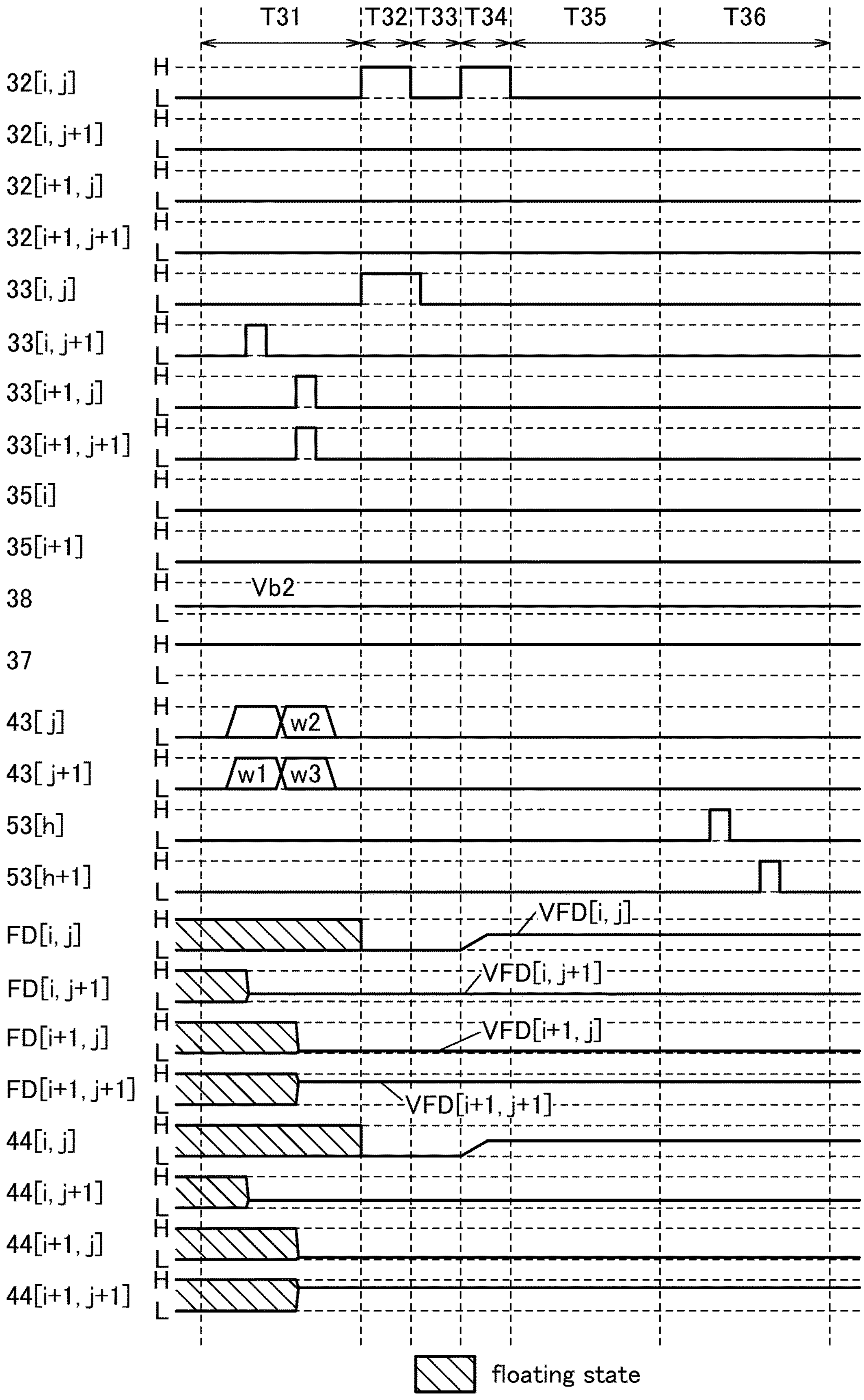
FIG. 16 is a timing chart showing an example of a method for driving the imaging device.

FIG. 15 is a timing chart showing an example of the method for driving the imaging device 10 when the imaging device 10 is driven in the first mode. As described above, the arithmetic operation using the weight data is not performed in the first mode.

In a period T21 to a period T25, a low potential is supplied to the wiring 38 so that a transistor 28[*i,j*], a transistor 28[*i,j*+1], a transistor 28[*i*+1,*j*], and a transistor 28[*i*+1,*j*+1] are brought out of conduction. Except for that, the operation in the period T21 to the period T25 can be similar to the operation in the period T01 to the period T05 in the timing chart shown in FIG. 8. Note that in the period T21 to the period T25, a bias potential supplied to the wiring 37 is the bias potential Vb1.

Figure 17A:
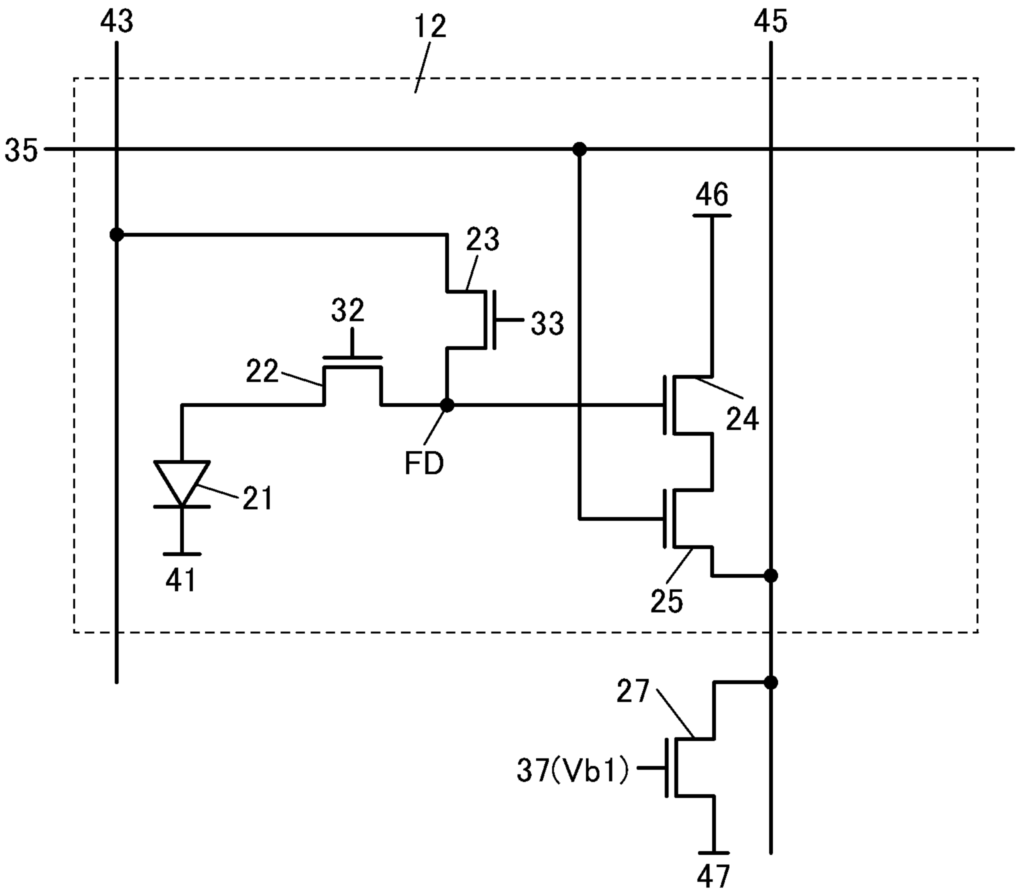
FIG. 17A and FIG. 17B are circuit diagrams each illustrating an example of a method for driving the imaging device.

FIG. 17A is a circuit diagram of a structure where the transistors that can be in a non-conducting state during all the periods in the period T21 to the period T25 are eliminated from the circuit diagram illustrated in FIG. 12A. Furthermore, in addition to the structure of the cell 12, the transistor 27 whose gate is supplied with the bias potential Vb1 in the period T21 to the period T25 is also illustrated. As described above, in the period T21 to the period T25, the transistor 28 is non-conducting. Thus, the circuit diagram illustrated in FIG. 17A does not illustrate the transistor 28.

Next, an example of a method for driving the imaging device 10 in the second mode is described. Specifically, as shown in FIG. 9, an example of a method for driving the imaging device 10 when the cell 12[*i,j*] acquires the imaging data x and the weight data w1, the weight data w2, and the weight data w3 are written to the cell 12[*i,j*+1], the cell 12[*i*+1,*j*], and the cell 12[*i*+1,j+1], respectively, is described. FIG. 16 is a timing chart showing an example of the method for driving the imaging device 10 when the imaging device 10 is driven in the second mode.

The potentials of the wiring 32, the wiring 33, the wiring 35, the wiring 37, the wiring 43, the wiring 53, and the node FD in a period T31 to a period T35 can be the same as the potentials of the wiring 32, the wiring 33, the wiring 35, the wiring 37, the wiring 43, the wiring 53, and the node FD in the period T11 to the period T15 in the timing chart shown in FIG. 10. In addition, the potentials of the wiring 32, the wiring 33, the wiring 35, the wiring 37, the wiring 43, the wiring 53, and the node FD in a period T36 can be the same as the potentials of the wiring 32, the wiring 33, the wiring 35, the wiring 37, the wiring 43, the wiring 53, and the node FD in the period T19 in the timing chart shown in FIG. 10.

Figure 17B:
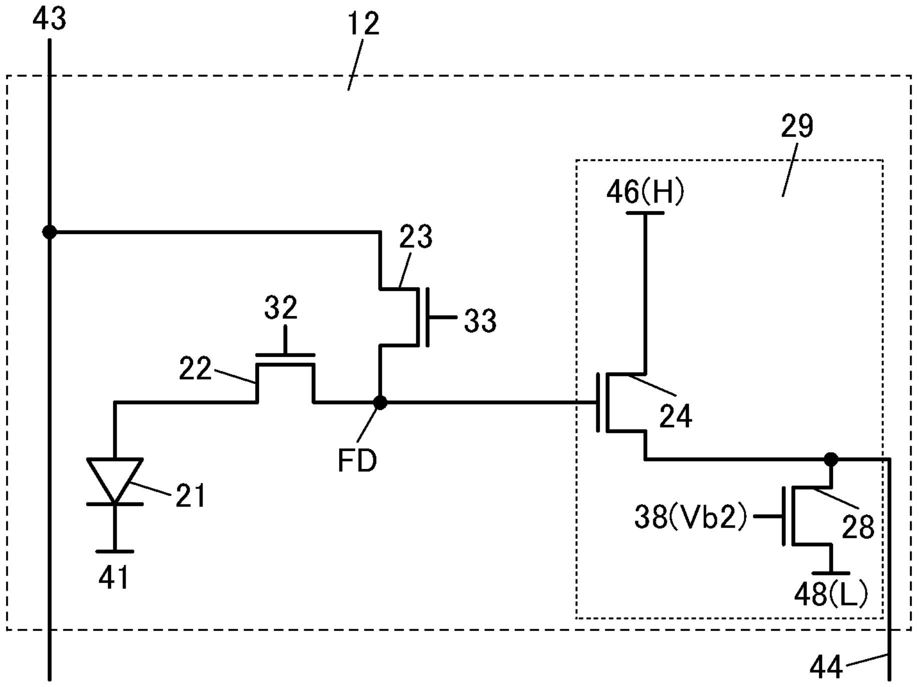

In the period T31 to the period T36, a bias potential Vb2 is supplied to the wiring 38. FIG. 17B is a circuit diagram of a structure where the transistors that can be in a non-conducting state during all the periods of the period T31 to the period T36 are eliminated from the circuit diagram illustrated in FIG. 12A. As illustrated in FIG. 16, in the period T31 to the period T36, the transistor 25 is non-conducting. Thus, the circuit diagram illustrated in FIG. 17B does not illustrate the transistor 25.

As described above, in the period T31 to the period T36, the bias potential Vb2 is supplied to the gate of the transistor 28. In addition, a high potential is supplied to the wiring 46, and a low potential is supplied to the wiring 48. Accordingly, a source follower circuit 29 is composed of the transistor 24 and the transistor 28. Here, an input terminal of the source follower circuit 29 is electrically connected to the node FD, and an output terminal of the source follower circuit 29 is electrically connected to the wiring 44. In the period T31 to the period T36, analog data of a potential that corresponds to the potential of the node FD can be continuously output from the wiring 44. Here, the imaging data x can be output from the wiring 44[*i,j*] in accordance with VFD[*i,j*] that is the potential of the node FD[*i,j*]. In addition, the weight data w1 can be output from the wiring 44[*i,j*+1] in accordance with VFD[*i,j*+1] that is the potential of the node FD[*i,j*+1]. Furthermore, the weight data w2 can be output from the wiring 44[*i*+1,*j*] in accordance with VFD[*i*+1,*j*] that is the potential of the node FD[*i*+1,*j*]. Furthermore, the weight data w3 can be output from the wiring 44[*i*+1,*j*+1] in accordance with VFD[*i*+1,*j*+1] that is the potential of the node FD[*i*+1,*j*+1].

The above is the example of the method for driving the imaging device 10 in which the cell 12 has the structure illustrated in FIG. 12A and the arithmetic circuit 17 has the structure illustrated in FIG. 13.

As described above, the cell 12 has the structure illustrated in FIG. 12A or FIG. 12B, so that the imaging data and the weight data output from the wiring 44 in the cell 12 in the second mode can be analog data. Then, after the analog data output from the wiring 44 in the cell 12 is converted into digital data by the A/D converter circuit 54, the digital data is supplied to the logic circuit 51. Accordingly, the imaging data and the weight data input to the logic circuit 51 can be multi-level digital data.

<Imaging Device Structure Example_3>

Figure 18A:
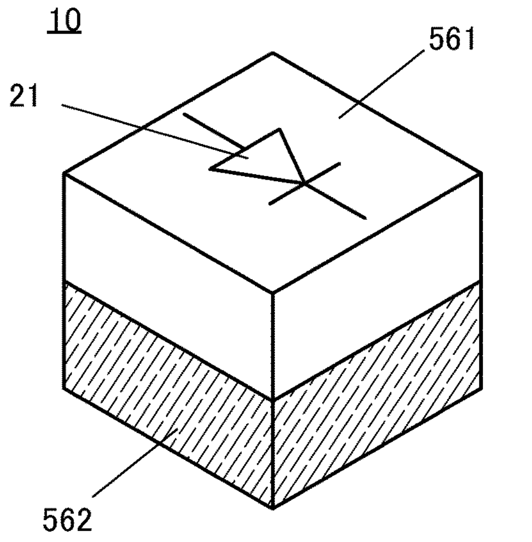
FIG. 18A to FIG. 18E are perspective views each illustrating a structure example of the imaging device.
Figure 18B:
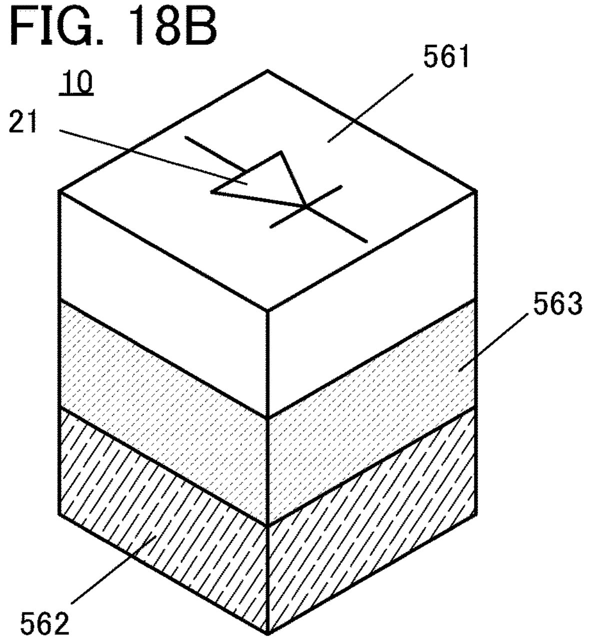

FIG. 18A and FIG. 18B are perspective views each illustrating a structure example of the imaging device 10. FIG. 18A illustrates a structure example of a stacked-layer structure of a layer 561 and a layer 562.

The layer 561 includes the photoelectric conversion element 21. The photoelectric conversion element 21 can be a stacked layer of a layer 565*a*, a layer 565*b*, and a layer 565*c*, as illustrated in FIG. 18C.

Figure 18C:
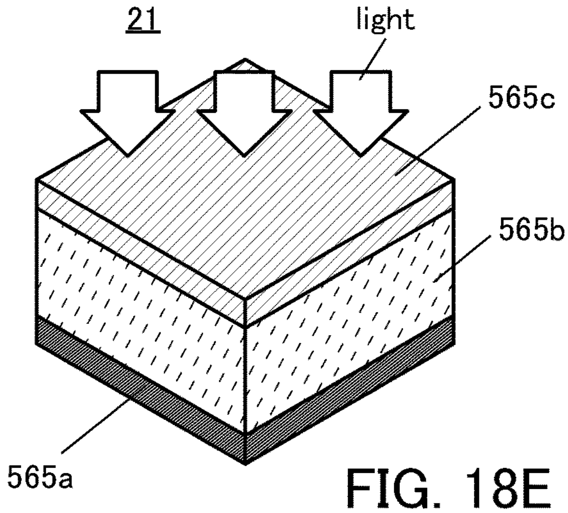

The photoelectric conversion element 21 illustrated in FIG. 18C is a pn-junction photodiode; for example, a $p^+$-type semiconductor, an n-type semiconductor, and an $n^+$-type semiconductor can be used for the layer 565*a*, the layer 565*b*, and the layer 565*c*, respectively. Alternatively, an $n^+$-type semiconductor, a p-type semiconductor, and a $p^+$-type semiconductor may be used for the layer 565*a*, the layer 565*b*, and the layer 565*c*, respectively. Alternatively, a pin-junction photodiode in which the layer 565*b* is an i-type semiconductor may be used.

The pn-junction photodiode or the pin-junction photodiode can be formed using single crystal silicon. In addition, the pin-junction photodiode can also be formed using a thin film of amorphous silicon, microcrystalline silicon, polycrystalline silicon, or the like.

Figure 18D:
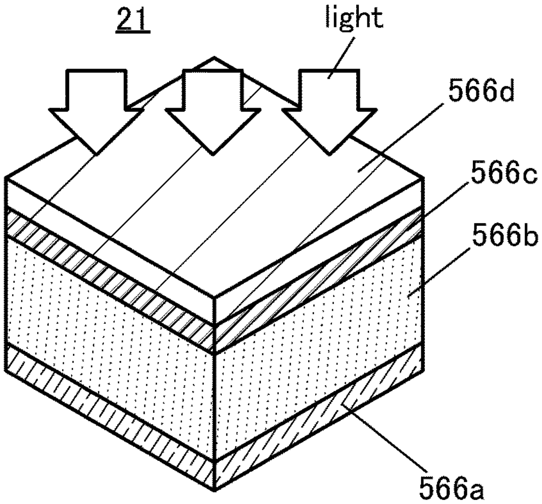

Furthermore, the photoelectric conversion element 21 included in the layer 561 may be a stacked layer of a layer 566*a*, a layer 566*b*, a layer 566*c*, and a layer 566*d*, as illustrated in FIG. 18D. The photoelectric conversion element 21 illustrated in FIG. 18D is an example of an avalanche photodiode, the layer 566*a* and the layer 566*d* correspond to electrodes, and the layer 566*b* and the layer 566*c* correspond to a photoelectric conversion portion.

The layer 566*a* is preferably a low-resistance metal layer or the like. For example, aluminum, titanium, tungsten, tantalum, silver, or a stacked layer thereof can be used.

A conductive layer having a high light-transmitting property with respect to visible light is preferably used as the layer 566*d*. For example, indium oxide, tin oxide, zinc oxide, indium tin oxide, gallium zinc oxide, indium gallium zinc oxide, graphene, or the like can be used. Note that a structure in which the layer 566*d* is omitted can also be employed.

The layer 566*b* and the layer 566*c* of the photoelectric conversion portion can have, for example, a structure of a pn-junction photodiode containing a selenium-based material in a photoelectric conversion layer. A selenium-based material, which is a p-type semiconductor, is preferably used for the layer 566*b*, and gallium oxide or the like, which is an n-type semiconductor, is preferably used for the layer 566*c*.

The photoelectric conversion element using a selenium-based material has characteristics of high external quantum efficiency with respect to visible light. In the photoelectric conversion element, the amount of amplification of electrons with respect to the amount of incident light can be increased by utilizing avalanche multiplication. In addition, a selenium-based material has a high light-absorption coefficient and thus has advantages in production; for example, a photoelectric conversion layer can be manufactured using a thin film. A thin film of a selenium-based material can be formed by a vacuum evaporation method, a sputtering method, or the like.

As the selenium-based material, crystalline selenium such as single crystal selenium or polycrystalline selenium, amorphous selenium, a compound of copper, indium, and selenium (CIS), a compound of copper, indium, gallium, and selenium (CIGS), or the like can be used.

An n-type semiconductor is preferably formed using a material with a wide band gap and a light-transmitting property with respect to visible light. For example, zinc oxide, gallium oxide, indium oxide, tin oxide, mixed oxide thereof, or the like can be used. In addition, these materials have a function of a hole-injection blocking layer, so that dark current can be decreased.

Figure 18E:
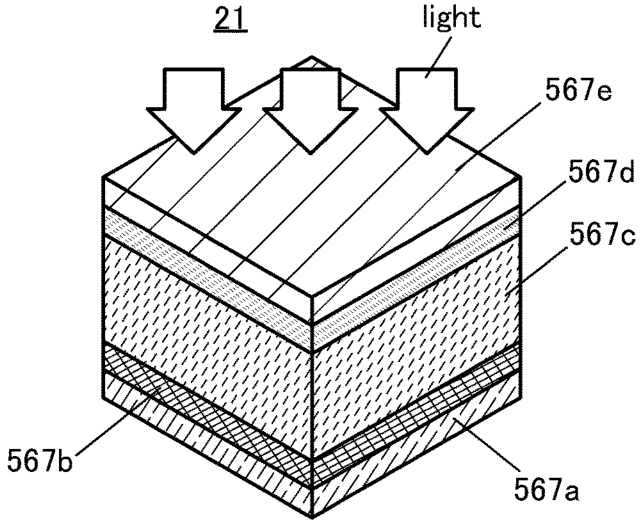

Alternatively, the photoelectric conversion element 21 included in the layer 561 may have a stacked-layer structure of a layer 567*a*, a layer 567*b*, a layer 567*c*, a layer 567*d*, and a layer 567*e*, as illustrated in FIG. 18E. The photoelectric conversion element 21 illustrated in FIG. 18E is an example of an organic optical conductive film, the layer 567*a* and the layer 567*e* correspond to electrodes, and the layer 567*b*, the layer 567*c*, and the layer 567*d* correspond to a photoelectric conversion portion.

One of the layer 567*b* and the layer 567*d* in the photoelectric conversion portion can be a hole-transport layer and the other can be an electron-transport layer. In addition, the layer 567*c* can be the photoelectric conversion layer.

For the hole-transport layer, molybdenum oxide or the like can be used, for example. For the electron-transport layer, fullerene such as C60 or C70, a derivative thereof, or the like can be used, for example.

As the photoelectric conversion layer, a mixed layer of an n-type organic semiconductor and a p-type organic semiconductor (a bulk heterojunction structure) can be used.

For the layer 562 illustrated in FIG. 18A, a silicon substrate can be used, for example. The silicon substrate includes a Si transistor or the like. For example, the transistors included in the cell 12 and the transistors included in the arithmetic circuit 17 can be provided in the layer 562. Furthermore, for example, the transistors included in the row driver circuit 13, the transistors included in the data generation circuit 14, the transistors included in the read circuit 16, and the transistor 27 can be provided in the layer 562.

Furthermore, the imaging device 10 may have a stacked-layer structure of the layer 561, a layer 563, and the layer 562, as illustrated in FIG. 18B.

The layer 563 can include an OS transistor. In that case, the layer 562 may include a Si transistor. For example, the transistors included in the cell 12 and the transistor 27 can be provided in the layer 563, and the transistors included in the arithmetic circuit 17 can be provided in the layer 562. In addition, for example, the transistors included in the row driver circuit 13, the transistors included in the data generation circuit 14, and the transistors included in the read circuit 16 can be provided in the layer 562.

With the structure illustrated in FIG. 18B, for example, the cell 12 provided in the layer 563 and the arithmetic circuit 17 provided in the layer 562 can be provided to have an overlap region. Thus, the area occupied by the imaging device 10 can be reduced, and the imaging device 10 can be downsized. Note that in the structure of FIG. 18B, the layer 562 may be a support substrate, and the cell 12 and other circuits may be provided in the layer 561 and the layer 563.

As a semiconductor material used for an OS transistor, a metal oxide whose energy gap is greater than or equal to 2 eV, preferably greater than or equal to 2.5 eV, further preferably greater than or equal to 3 eV can be used. A typical example is an oxide semiconductor containing indium, and a CAAC-OS (C-Axis Aligned Crystalline Oxide Semiconductor), a CAC-OS (Cloud-Aligned Composite Oxide Semiconductor), or the like described later can be used, for example. A CAAC-OS has a crystal structure including stable atoms and is suitable for a transistor or the like that puts emphasis on reliability. In addition, a CAC-OS exhibits excellent mobility characteristics and thus is suitable for a transistor or the like that is driven at high speed.

In an OS transistor, a semiconductor layer has a large energy gap, and thus the OS transistor exhibits extremely low off-state current characteristics of several yoctoamperes per micrometer (the value of current per micrometer of channel width). In addition, an OS transistor has features such that impact ionization, an avalanche breakdown, a short-channel effect, and the like do not occur, which are different from those of a Si transistor, and enables formation of a circuit having high breakdown voltage and high reliability. Moreover, variations in electrical characteristics due to crystallinity unevenness, which are caused in Si transistors, are less likely to occur in OS transistors.

A semiconductor layer included in an OS transistor can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where an oxide semiconductor that constitutes the semiconductor layer is an In-M-Zn-based oxide, it is preferable that the atomic ratio of metal elements in a sputtering target used to deposit an In-M-Zn oxide satisfy In≥M and Zn≥M. The atomic ratio of metal elements of such a sputtering target is preferably In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, In:M:Zn=5:1:8, or the like. Note that the atomic ratio in the deposited semiconductor layer varies from the atomic ratio of metal elements contained in the sputtering target in a range of ±40%.

An oxide semiconductor with low carrier density is used for the semiconductor layer. For example, for the semiconductor layer, an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has low density of defect states and can be referred to as an oxide semiconductor having stable characteristics.

Note that the composition is not limited to those, and a material having appropriate composition may be used depending on required semiconductor characteristics and electrical characteristics of the transistor (field-effect mobility, threshold voltage, or the like). In addition, to obtain the required semiconductor characteristics of the transistor, it is preferable that the carrier density, impurity concentration, defect density, atomic ratio between a metal element and oxygen, interatomic distance, density, and the like of the semiconductor layer be set to be appropriate.

When silicon or carbon, which is one of the Group 14 elements, is contained in the oxide semiconductor that constitutes the semiconductor layer, oxygen vacancies are increased, and the semiconductor layer becomes n-type. Thus, the concentration (concentration obtained by secondary ion mass spectrometry) of silicon or carbon in the semiconductor layer is set lower than or equal to $2\times10^{18}$ atoms/$cm^3$, preferably lower than or equal to $2\times10^{17}$ atoms/$cm^3$.

In addition, alkali metal and alkaline earth metal might generate carriers when bonded to an oxide semiconductor, in which case the off-state current of the transistor might be increased. Thus, the concentration (concentration obtained by secondary ion mass spectrometry) of alkali metal or alkaline earth metal in the semiconductor layer is set lower than or equal to $1\times10^{18}$ atoms/$cm^3$, preferably lower than or equal to $2\times10^{16}$ atoms/$cm^3$.

Furthermore, when nitrogen is contained in the oxide semiconductor that constitutes the semiconductor layer, electrons serving as carriers are generated and the carrier density is increased, so that the semiconductor layer easily becomes n-type. As a result, a transistor using an oxide semiconductor that contains nitrogen is likely to have normally-on characteristics. Therefore, the concentration (concentration obtained by secondary ion mass spectrometry) of nitrogen in the semiconductor layer is preferably set lower than or equal to $5\times10^{18}$ atoms/$cm^3$.

In addition, when hydrogen is contained in an oxide semiconductor included in the semiconductor layer, hydrogen reacts with oxygen bonded to a metal atom to be water, and thus sometimes causes an oxygen vacancy in the oxide semiconductor. When a channel formation region in the oxide semiconductor includes oxygen vacancies, the transistor sometimes has normally-on characteristics. Furthermore, in some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor using an oxide semiconductor that contains a large amount of hydrogen is likely to have normally-on characteristics.

A defect in which hydrogen has entered an oxygen vacancy can function as a donor of the oxide semiconductor. However, it is difficult to evaluate the defect quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" described in this specification and the like can be replaced with "donor concentration" in some cases.

Therefore, hydrogen in the oxide semiconductor is preferably reduced as much as possible. Specifically, the hydrogen concentration in the oxide semiconductor that is obtained by secondary ion mass spectrometry (SIMS) is set lower than $1\times10^{20}$ atoms/$cm^3$, preferably lower than $1\times10^{19}$ atoms/$cm^3$, further preferably lower than $5\times10^{18}$ atoms/$cm^3$, still further preferably lower than $1\times10^{18}$ atoms/$cm^3$. When an oxide semiconductor with a sufficiently low concentration of impurities such as hydrogen is used for a channel formation region of a transistor, the transistor can have stable electrical characteristics.

Moreover, the semiconductor layer may have a non-single-crystal structure, for example. The non-single-crystal structure includes, for example, a CAAC-OS including a c-axis aligned crystal, a polycrystalline structure, a microcrystalline structure, or an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Moreover, an oxide film having an amorphous structure has a completely amorphous structure and no crystal part, for example.

Note that the semiconductor layer may be a mixed film including two or more kinds selected from a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more kinds of regions selected from the above regions in some cases.

Figure 19A:
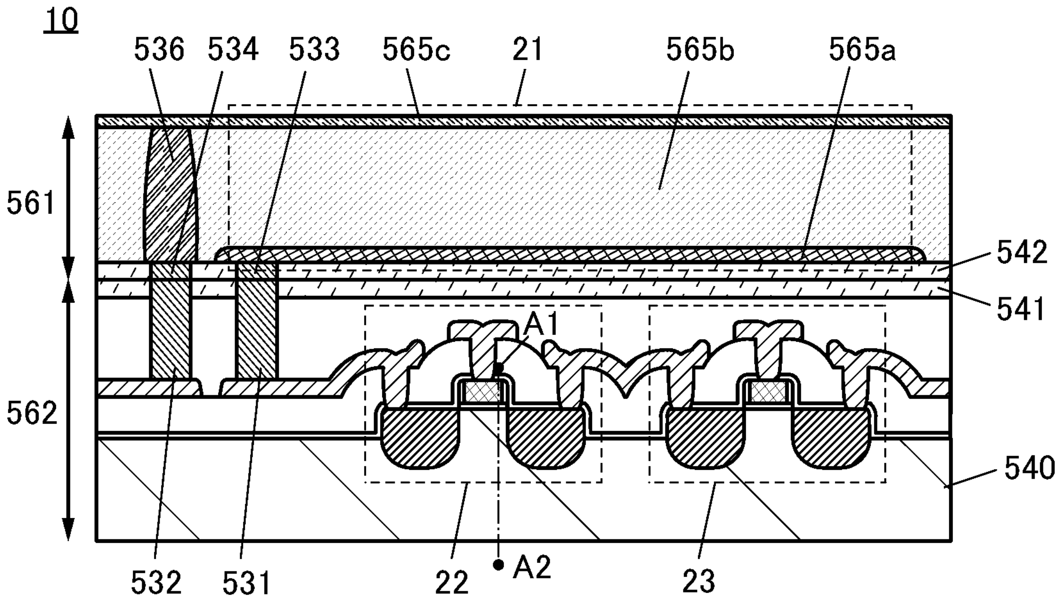
FIG. 19A and FIG. 19B are cross-sectional views each illustrating a structure example of the imaging device.

FIG. 19A is a diagram illustrating an example of a cross section of the imaging device 10 illustrated in FIG. 18A. The layer 561 includes a pn-junction photodiode using silicon for a photoelectric conversion layer, as the photoelectric conversion element 21. The layer 562 includes Si transistors, and FIG. 19A illustrates the transistor 22 and the transistor 23 among the transistors included in the cell 12 as an example.

In the photoelectric conversion element 21, the layer 565*a* can be a $p^+$-type region, the layer 565*b* can be an n-type region, and the layer 565*c* can be an $n^+$-type region. In addition, the layer 565*b* is provided with a region 536 for connecting a power supply line to the layer 565*c*. For example, the region 536 can be a $p^+$-type region.

Figure 20A:
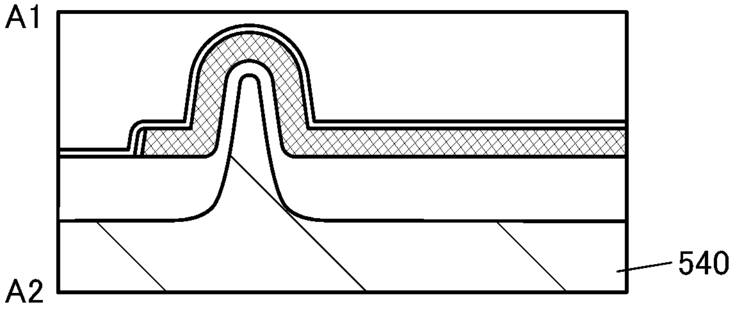
FIG. 20A to FIG. 20C are cross-sectional views each illustrating a structure example of the imaging device.
Figure 20B:
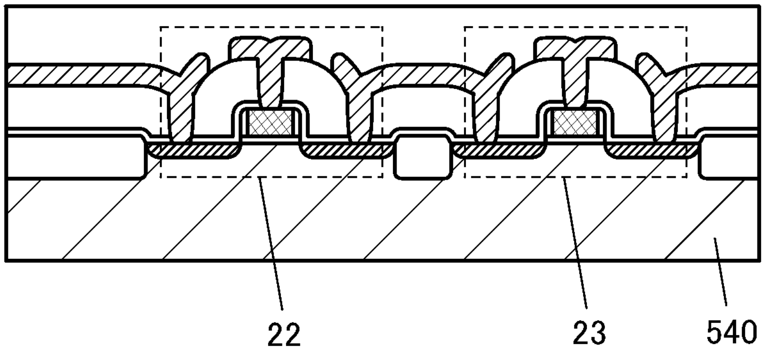

FIG. 20A is a cross-sectional view of a portion indicated by dashed-dotted line A1-A2 in FIG. 19A, and illustrates a cross section of the transistor 22 and the like in a channel width direction. As illustrated in FIG. 20A, the Si transistor can be a fin type in which a channel formation region is included in a silicon substrate 540. Alternatively, the Si transistor may be not a fin type but a planar type, as illustrated in FIG. 20B.

Figure 20C:
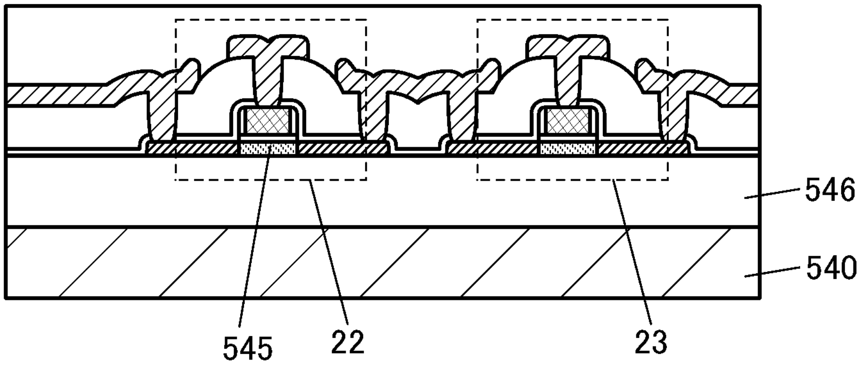

Alternatively, as illustrated in FIG. 20C, transistors each including a semiconductor layer 545 of a silicon thin film may be used. The semiconductor layer 545 can be single crystal silicon (SOI: Silicon on Insulator) formed on an insulating layer 546 on the silicon substrate 540, for example.

FIG. 19A illustrates an example of a structure in which electrical connection between components included in the layer 561 and components included in the layer 562 is obtained by a bonding technique.

An insulating layer 542, a conductive layer 533, and a conductive layer 534 are provided in the layer 561. The conductive layer 533 and the conductive layer 534 each include a region embedded in the insulating layer 542. The conductive layer 533 is electrically connected to the layer 565*a*. The conductive layer 534 is electrically connected to the region 536. Furthermore, surfaces of the insulating layer 542, the conductive layer 533, and the conductive layer 534 are planarized to have the same level.

An insulating layer 541, a conductive layer 531, and a conductive layer 532 are provided in the layer 562. The conductive layer 531 and the conductive layer 532 each include a region embedded in the insulating layer 541. The conductive layer 531 is electrically connected to the source or the drain of the transistor 22. The conductive layer 532 is electrically connected to a power supply line. Furthermore, surfaces of the insulating layer 541, the conductive layer 531, and the conductive layer 532 are planarized to have the same level.

Here, main components of the conductive layer 531 and the conductive layer 533 are preferably the same metal element. In addition, main components of the conductive layer 532 and the conductive layer 534 are preferably the same metal element. Furthermore, it is preferable that the insulating layer 541 and the insulating layer 542 be formed of the same component.

For example, for the conductive layer 531, the conductive layer 532, the conductive layer 533, and the conductive layer 534, Cu, Al, Sn, Zn, W, Ag, Pt, Au, or the like can be used. Preferably, Cu, Al, W, or Au is used for easy bonding. In addition, for the insulating layer 541 and the insulating layer 542, silicon oxide, silicon oxynitride, silicon nitride oxide, silicon nitride, titanium nitride, or the like can be used.

That is, the same metal material described above is preferably used for the combination of the conductive layer 531 and the conductive layer 533, and the same metal material described above is preferably used for the combination of the conductive layer 532 and the conductive layer 534. Furthermore, the same insulating material described above is preferably used for the insulating layer 541 and the insulating layer 542. With this structure, bonding where a boundary between the layer 561 and the layer 562 is a bonding position can be performed.

By the bonding, electrical connection of each of the combination of the conductive layer 531 and the conductive layer 533 and the combination of the conductive layer 532 and the conductive layer 534 can be obtained. In addition, connection between the insulating layer 541 and the insulating layer 542 with mechanical strength can be obtained.

For bonding metal layers to each other, a surface activated bonding method in which an oxide film, a layer adsorbing impurities, and the like on the surface are removed by sputtering treatment or the like and cleaned and activated surfaces are brought into contact to be bonded to each other can be used. Alternatively, a diffusion bonding method in which surfaces are bonded to each other by using temperature and pressure together can be used, for example. Both methods cause bonding at an atomic level, and therefore not only electrically but also mechanically excellent bonding can be obtained.

Furthermore, for bonding insulating layers to each other, a hydrophilic bonding method or the like can be used in which, after high planarity is obtained by polishing or the like, surfaces subjected to hydrophilic treatment with oxygen plasma or the like are arranged in contact with and bonded to each other temporarily, and then dehydrated by heat treatment to perform final bonding. The hydrophilic bonding method also causes bonding at an atomic level; thus, mechanically excellent bonding can be obtained.

When the layer 561 and the layer 562 are bonded to each other, the insulating layers and the metal layers coexist on their bonding surfaces; therefore, bonding is performed using the surface activated bonding method and the hydrophilic bonding method in combination, for example.

For example, a method or the like can be used in which surfaces are made clean after polishing, surfaces of the metal layers are subjected to antioxidant treatment followed by hydrophilic treatment, and then bonding is performed. Furthermore, hydrophilic treatment may be performed on surfaces of the metal layers being hardly oxidizable metal such as Au. Note that a bonding method other than the above methods may be used.

Figure 19B:
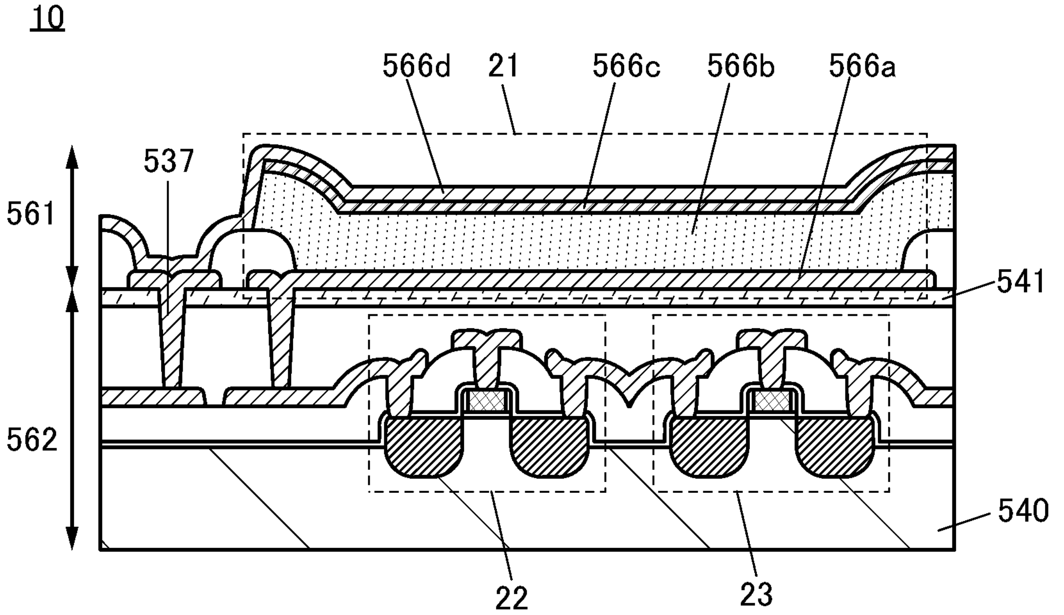

FIG. 19B is a cross-sectional view when a pn-junction photodiode with a selenium-based material for a photoelectric conversion layer is used for the photoelectric conversion element 21 illustrated in FIG. 18A. The layer 566*a* is included as one electrode, the layer 566*b* and the layer 566*c* are included as the photoelectric conversion layer, and the layer 566*d* is included as the other electrode.

In this case, the layer 561 can be directly formed on the layer 562. The layer 566*a* is electrically connected to the source or the drain of the transistor 22. The layer 566*d* is electrically connected to the power supply line through a conductive layer 537. Note that also in the case where an organic optical conductive film is used for the photoelectric conversion element 21, a similar connection mode with the transistor is employed.

Figure 21A:
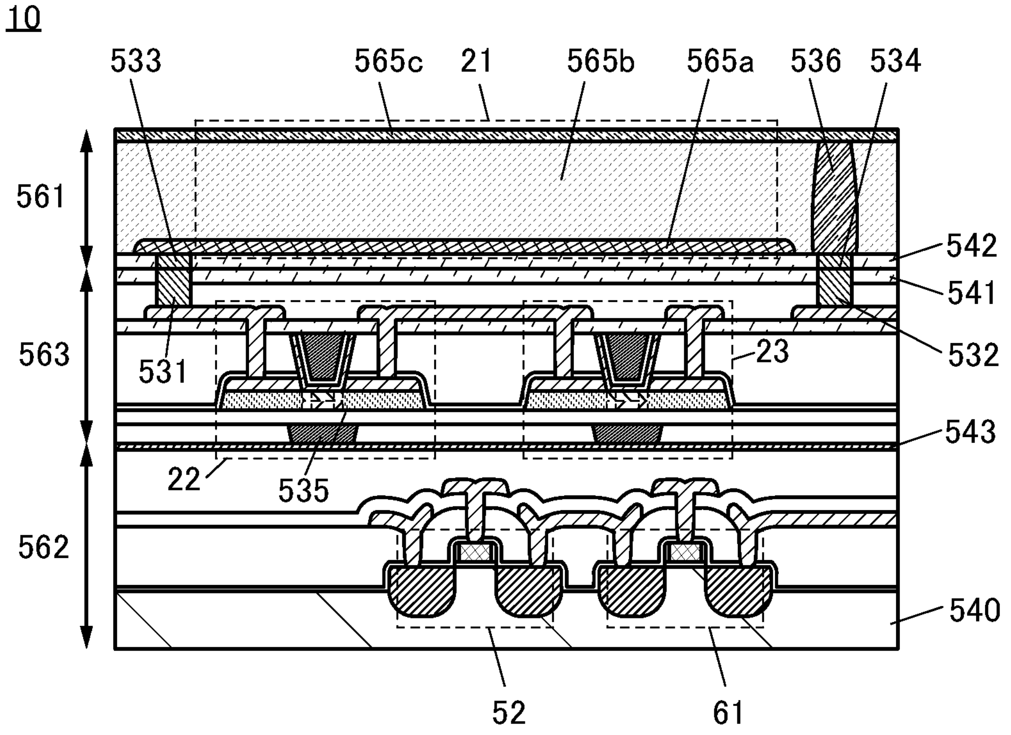
FIG. 21A and FIG. 21B are cross-sectional views each illustrating a structure example of the imaging device.

FIG. 21A is a diagram illustrating an example of a cross section of the imaging device 10 illustrated in FIG. 18B. The layer 561 includes a pn-junction photodiode using silicon for a photoelectric conversion layer, as the photoelectric conversion element 21. The layer 562 includes Si transistors, and FIG. 21A illustrates the transistor 52 and a transistor 61 among the transistors included in the arithmetic circuit 17. Here, the transistor 61 can be a transistor included in the logic circuit 51 as an example. In addition, the layer 563 includes OS transistors, and the transistor 22 and the transistor 23 included in the cell 12 are illustrated as an example. A structure example is illustrated in which electrical connection between the layer 561 and the layer 563 is obtained by bonding.

Figure 22A:
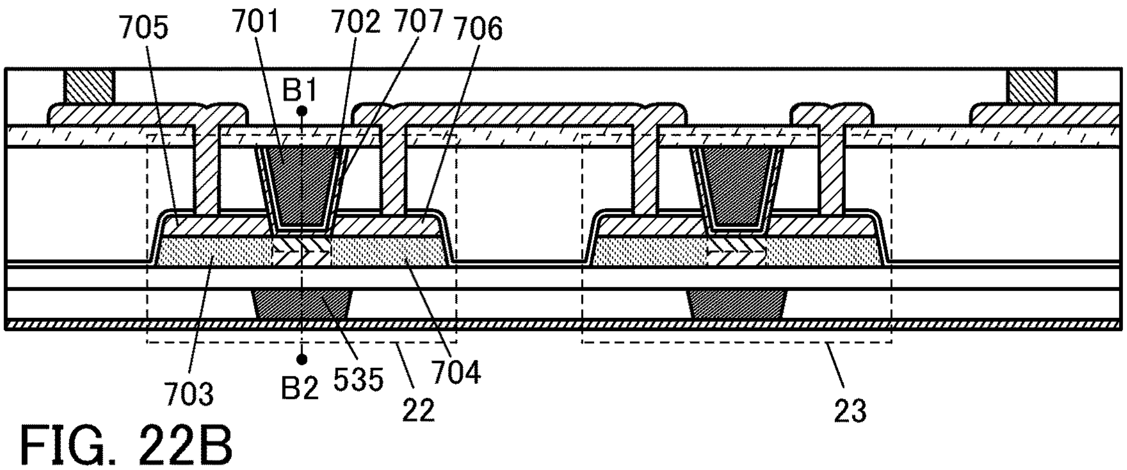
FIG. 22A to FIG. 22D are cross-sectional views each illustrating a structure example of the imaging device.

The detailed structure example of the OS transistor is illustrated in FIG. 22A. The OS transistors illustrated in FIG. 22A each have a self-aligned structure in which a source electrode 705 and a drain electrode 706 are formed through provision of an insulating layer over a stacked layer of an oxide semiconductor layer and a conductive layer and provision of grooves reaching the semiconductor layer.

The OS transistors can each include a gate electrode 701 and a gate insulating film 702 in addition to a channel formation region, a source region 703, and a drain region 704 that are formed in the oxide semiconductor layer. At least the gate insulating film 702 and the gate electrode 701 are provided in the groove. The groove may further be provided with an oxide semiconductor layer 707.

Figure 22B:
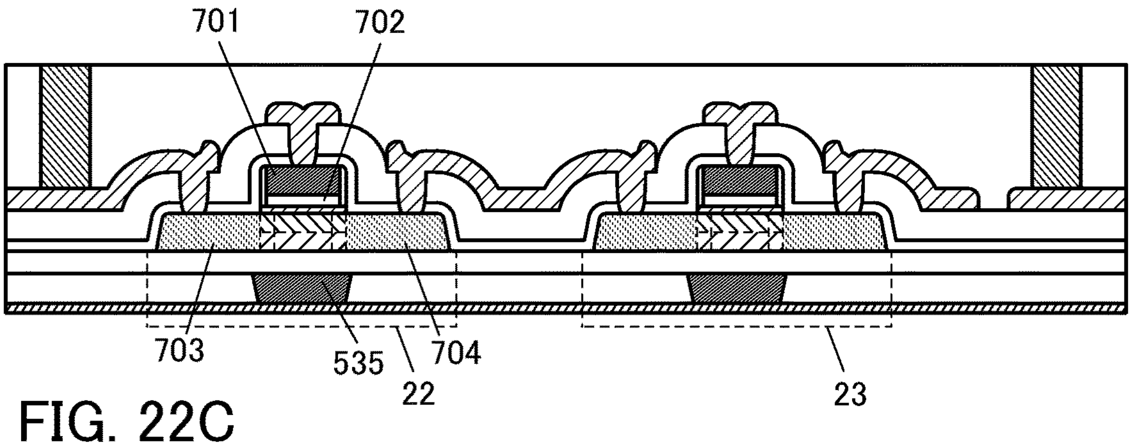

As illustrated in FIG. 22B, the OS transistors may each have a self-aligned structure in which the source region and the drain region are formed in a semiconductor layer with the gate electrode 701 as a mask.

Figure 22C:
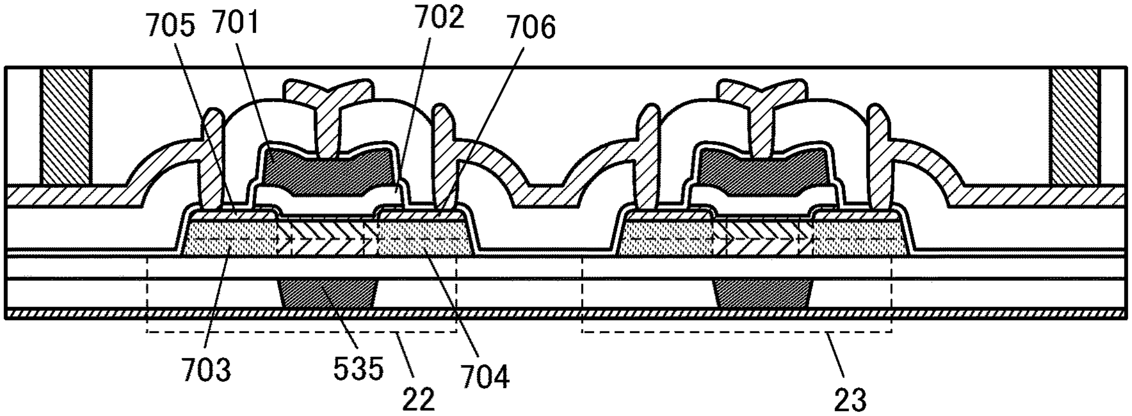

Alternatively, as illustrated in FIG. 22C, each of the OS transistors may be a non-self-aligned top-gate transistor including a region where the gate electrode 701 overlaps the source electrode 705 or the drain electrode 706.

Figure 22D:
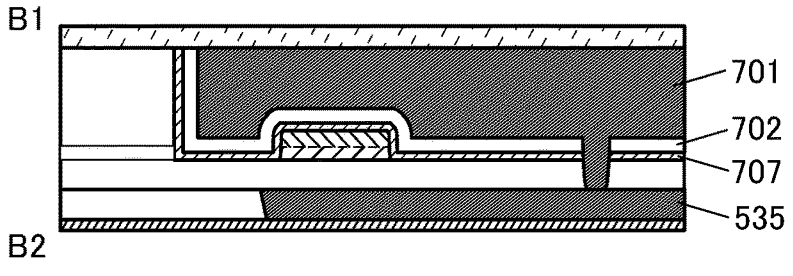

The transistor 22 and the transistor 23 each include a back gate 535. FIG. 22D is a cross-sectional view of a portion indicated by dashed-dotted line B1-B2 in FIG. 22A, and illustrates a cross section of the transistor 22 and the like in a channel width direction. As illustrated in FIG. 22D, the back gate 535 may be electrically connected to a front gate of the transistor that is provided to face the back gate 535. Note that FIG. 22D illustrates the transistors of FIG. 22A as an example, and the same applies to transistors having other structures. Alternatively, a structure where a fixed potential different from a potential supplied to the front gate can be supplied to the back gate 535 may be employed. Note that a structure where neither the transistor 22 nor the transistor 23 includes the back gate 535 may be employed.

An insulating layer 543 that has a function of preventing diffusion of hydrogen is provided between a region where the OS transistors are formed and a region where the Si transistors are formed. Hydrogen in the insulating layer provided in the vicinity of the channel formation region of each of the transistor 52 and the transistor 61 terminates a dangling bond of silicon. Meanwhile, hydrogen in the insulating layer provided in the vicinity of the channel formation region of each of the transistor 22 and the transistor 23 is one factor in generating a carrier in the oxide semiconductor layer.

Hydrogen is confined in one layer using the insulating layer 543, so that the reliability of the transistor 52 and the transistor 61 can be improved. Furthermore, diffusion of hydrogen from one layer to the other layer is inhibited, so that the reliability of the transistor 22 and the transistor 23 can also be improved.

For the insulating layer 543, for example, aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like can be used.

Figure 21B:
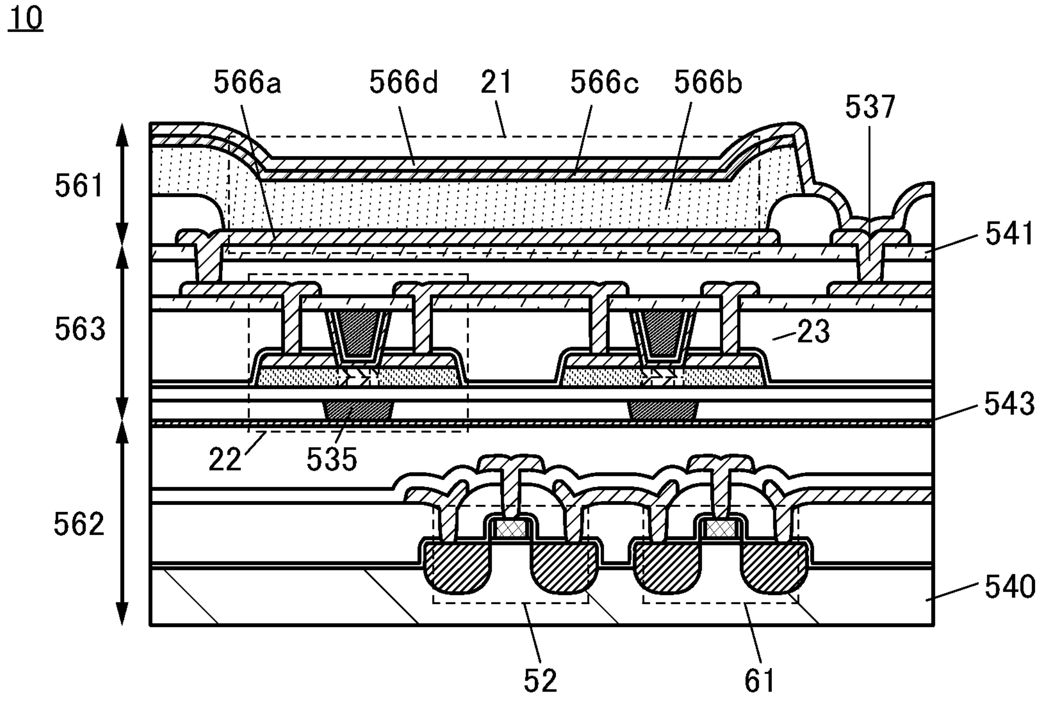

FIG. 21B is a cross-sectional view of the imaging device 10 when a pn-junction photodiode with a selenium-based material for a photoelectric conversion layer is used for the photoelectric conversion element 21. The layer 561 provided with the photoelectric conversion element 21 can be directly formed on the layer 563. The above description can be referred to for the details of the layer 561, the layer 562, and the layer 563. Note that also in the case where an organic optical conductive film is used for the photoelectric conversion element 21, a similar connection mode with the transistor is employed.

Figure 23A:
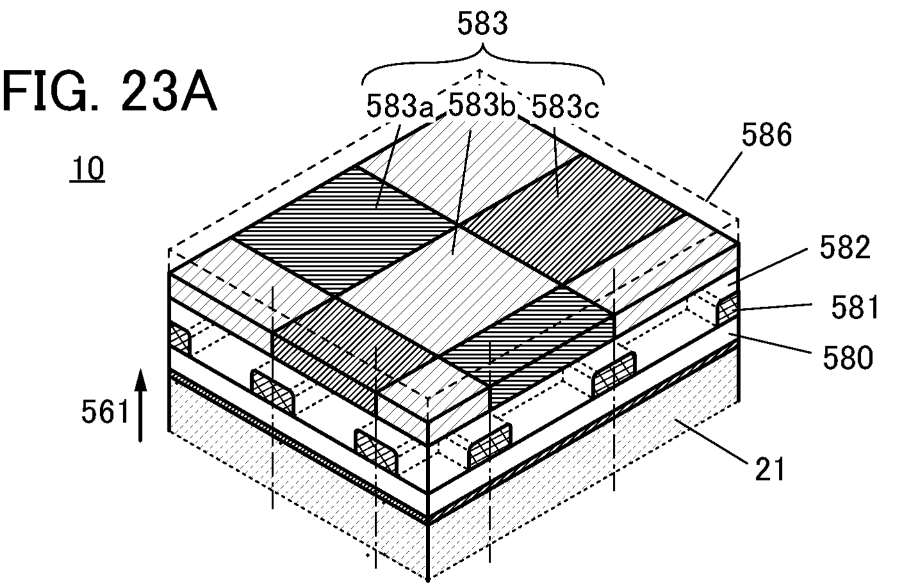
FIG. 23A to FIG. 23C are perspective views each illustrating a structure example of the imaging device.

FIG. 23A is a perspective view illustrating a structure example of a coloring layer (color filter) and the like included in the imaging device 10. An insulating layer 580 is formed over the layer 561 where the photoelectric conversion element 21 is formed. As the insulating layer 580, a silicon oxide film or the like with a high light-transmitting property with respect to visible light can be used. In addition, a silicon nitride film may be stacked as a passivation film. Furthermore, a dielectric film of hafnium oxide or the like may be stacked as an anti-reflection film.

A light-blocking layer 581 may be formed over the insulating layer 580. The light-blocking layer 581 has a function of preventing color mixing of light passing through the upper coloring layer. As the light-blocking layer 581, a metal layer of aluminum, tungsten, or the like can be used. In addition, the metal layer and a dielectric film having a function of an anti-reflection film may be stacked.

An insulating layer 582 can be provided as a planarization film over the insulating layer 580 and the light-blocking layer 581. In addition, a coloring layer 583 (a coloring layer 583*a*, a coloring layer 583*b*, a coloring layer 583*c*) is formed. When colors of R (red), G (green), B (blue), Y (yellow), C (cyan), M (magenta), and the like are assigned to the coloring layer 583*a*, the coloring layer 583*b*, and the coloring layer 583*c*, for example, a color image can be obtained.

An insulating layer 586 or the like having a light-transmitting property with respect to visible light can be provided over the coloring layer 583.

Figure 23B:
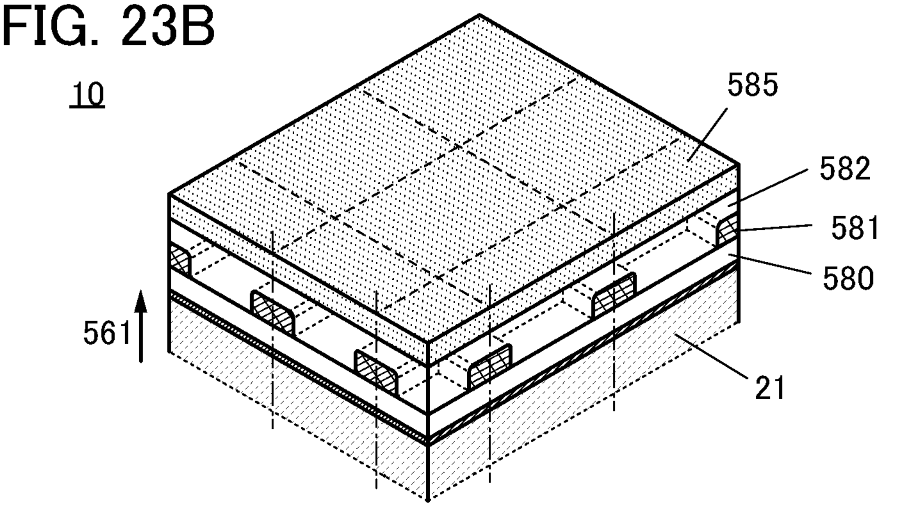

Furthermore, as illustrated in FIG. 23B, an optical conversion layer 585 may be used instead of the coloring layer 583. Such a structure enables the imaging device to obtain images in various wavelength regions.

For example, when a filter that blocks light having a wavelength shorter than or equal to that of visible light is used as the optical conversion layer 585, an infrared imaging device can be obtained. Alternatively, when a filter that blocks light having a wavelength shorter than or equal to that of near infrared light is used as the optical conversion layer 585, a far-infrared imaging device can be obtained. Alternatively, when a filter that blocks light having a wavelength longer than or equal to that of visible light is used as the optical conversion layer 585, an ultraviolet imaging device can be obtained.

Furthermore, when a scintillator is used as the optical conversion layer 585, the imaging device 10 can be an imaging device that obtains an image visualizing the intensity of radiation, which is used for an X-ray imaging device or the like. Radiation such as X-rays passes through an object and enters the scintillator, and then is converted into light (fluorescence) such as visible light or ultraviolet light owing to a photoluminescence phenomenon. Then, the light is detected by the photoelectric conversion element 21, so that image data is acquired. Moreover, the imaging device having this structure may be used in a radiation detector or the like.

A scintillator contains a substance that, when irradiated with radiation such as X-rays or gamma rays, absorbs energy of the radiation to emit visible light or ultraviolet light. For example, a resin or ceramics in which $Gd_2O_2S$:Tb, $Gd_2O_2S$:

Pr, $Gd_2O_2S$:Eu, BaFCl:Eu, NaI, CsI, $CaF_2$, $BaF_2$, $CeF_3$, LiF, LiI, ZnO, or the like is dispersed can be used as the substance.

In the photoelectric conversion element 21 using a selenium-based material, radiation such as X-rays can be directly converted into electric charge; thus, a structure that does not require the scintillator can be employed.

Figure 23C:
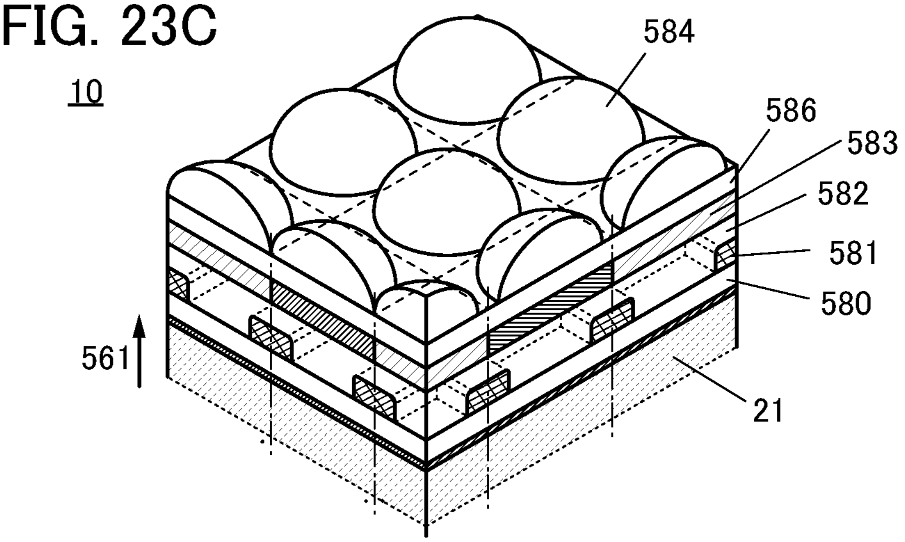

In addition, as illustrated in FIG. 23C, a microlens array 584 may be provided over the insulating layer 586 to have a region overlapping the coloring layer 583. Light passing through an individual lens of the microlens array 584 goes through the coloring layer 583 positioned thereunder and the photoelectric conversion element 21 is irradiated with the light. Furthermore, the microlens array 584 may be provided to have a region overlapping the optical conversion layer 585 illustrated in FIG. 23B.

<Imaging Device Structure Example_4>

Figure 24A:
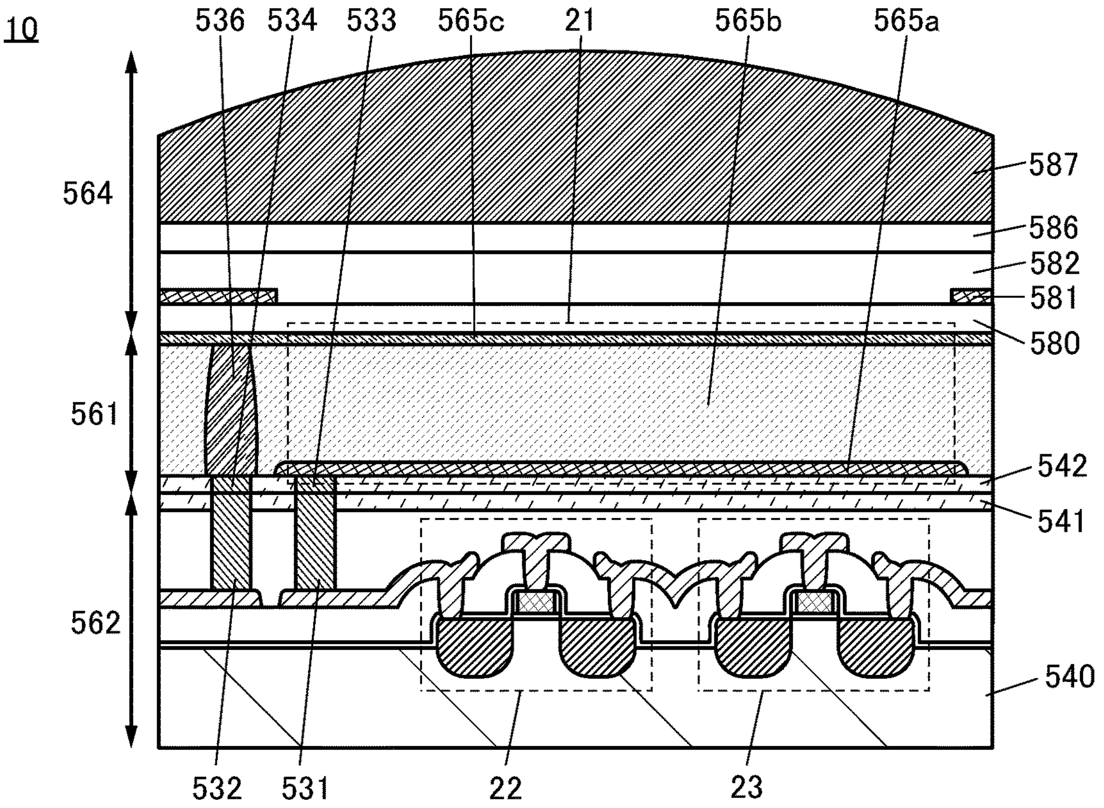
FIG. 24A and FIG. 24B are cross-sectional views each illustrating a structure example of the imaging device.

FIG. 24A is a diagram illustrating an example of the imaging device 10, and illustrates a structure example where the imaging device 10 illustrated in FIG. 19A is provided with a layer 564. The layer 564 is provided over the layer 561. The layer 564 includes the insulating layer 580, the light-blocking layer 581, the insulating layer 582, the insulating layer 586, and a coloring layer 587.

The insulating layer 580 is formed over the layer 561, and the light-blocking layer 581 and the insulating layer 582 are formed over the insulating layer 580. The insulating layer 586 is formed over the insulating layer 582, and the coloring layer 587 is formed over the insulating layer 586.

The coloring layer 587 can also function as a microlens. Thus, it is not necessary to form a microlens in addition to the coloring layer 587, and the imaging device 10 can be manufactured by a simple method. In addition, when light is delivered to an interface between substances with different refractive indices, part of the delivered light is reflected. For example, when light is delivered to an interface between a microlens and a layer such as an insulating layer provided to be in contact with a bottom of the microlens, part of the light is reflected. Therefore, when a microlens is not formed in addition to the coloring layer, attenuation of light delivered to the imaging device 10 until the light is received by the photoelectric conversion element 21 can be inhibited. Accordingly, the light detection sensitivity of the imaging device 10 can be increased.

Figure 24B:
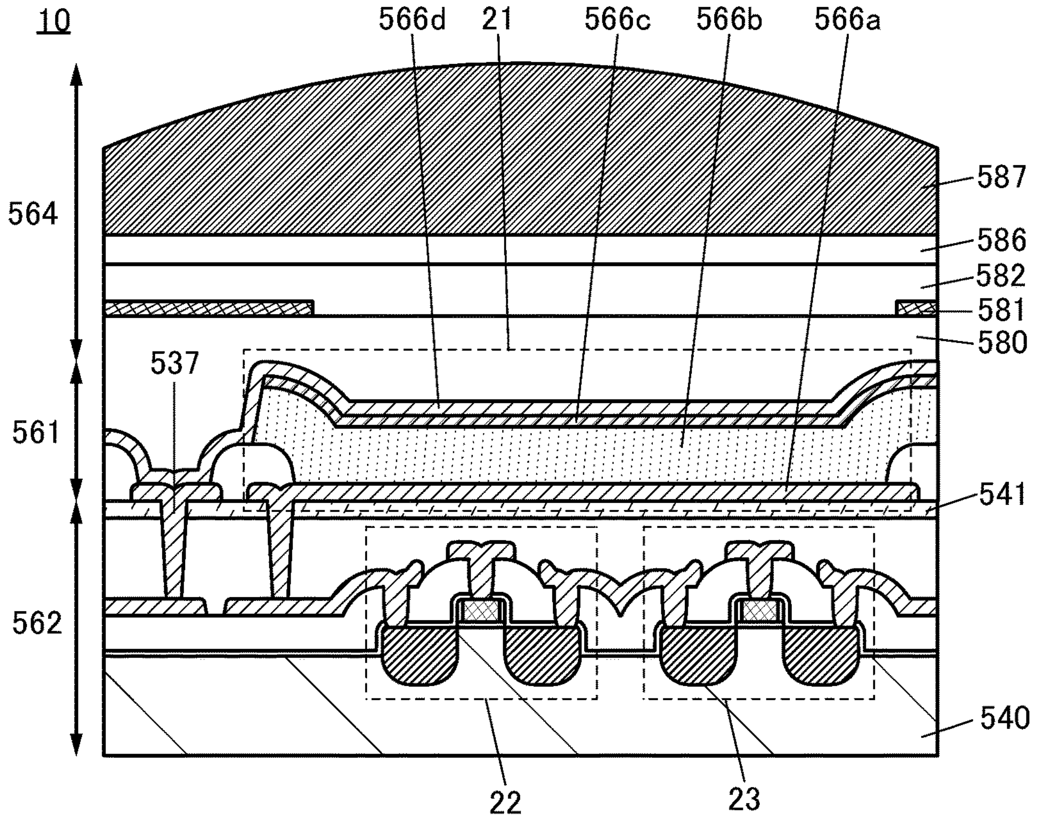
Figure 25A:
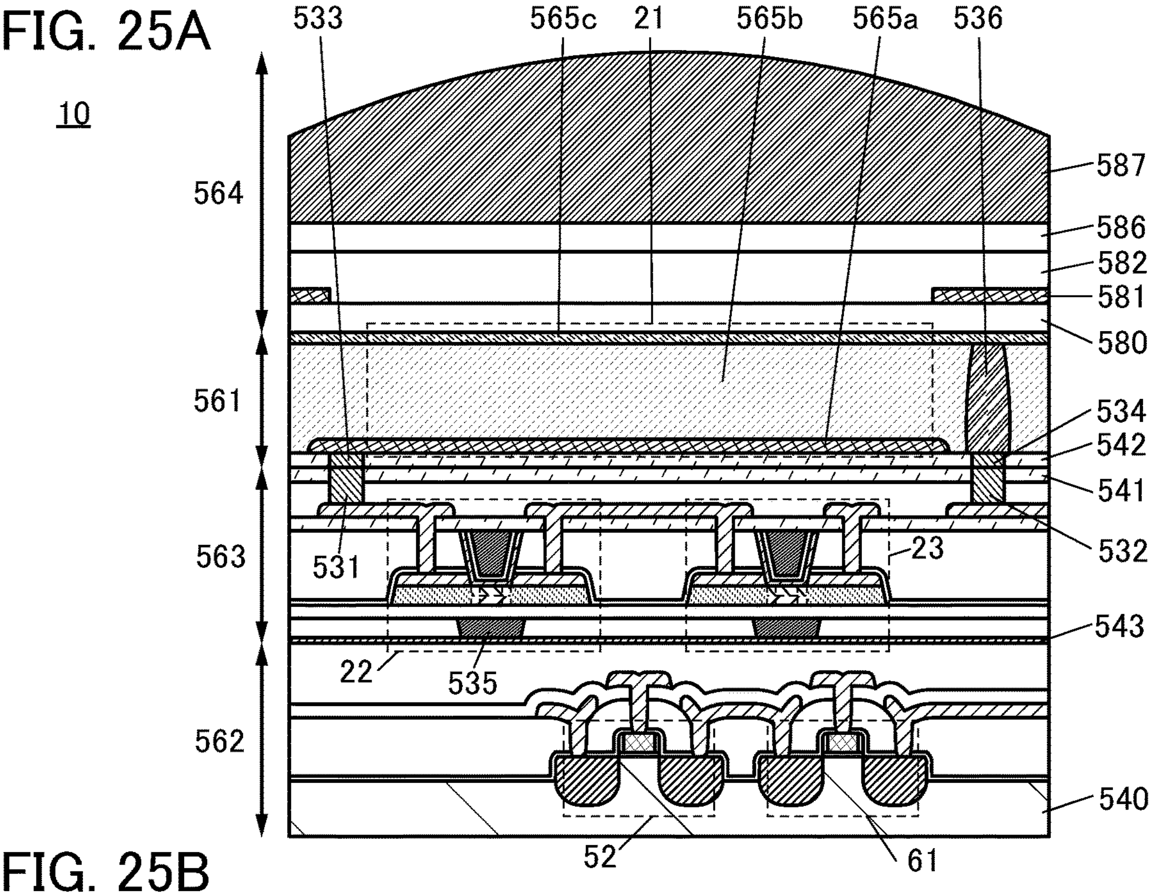
FIG. 25A and FIG. 25B are cross-sectional views each illustrating a structure example of the imaging device.
Figure 25B:
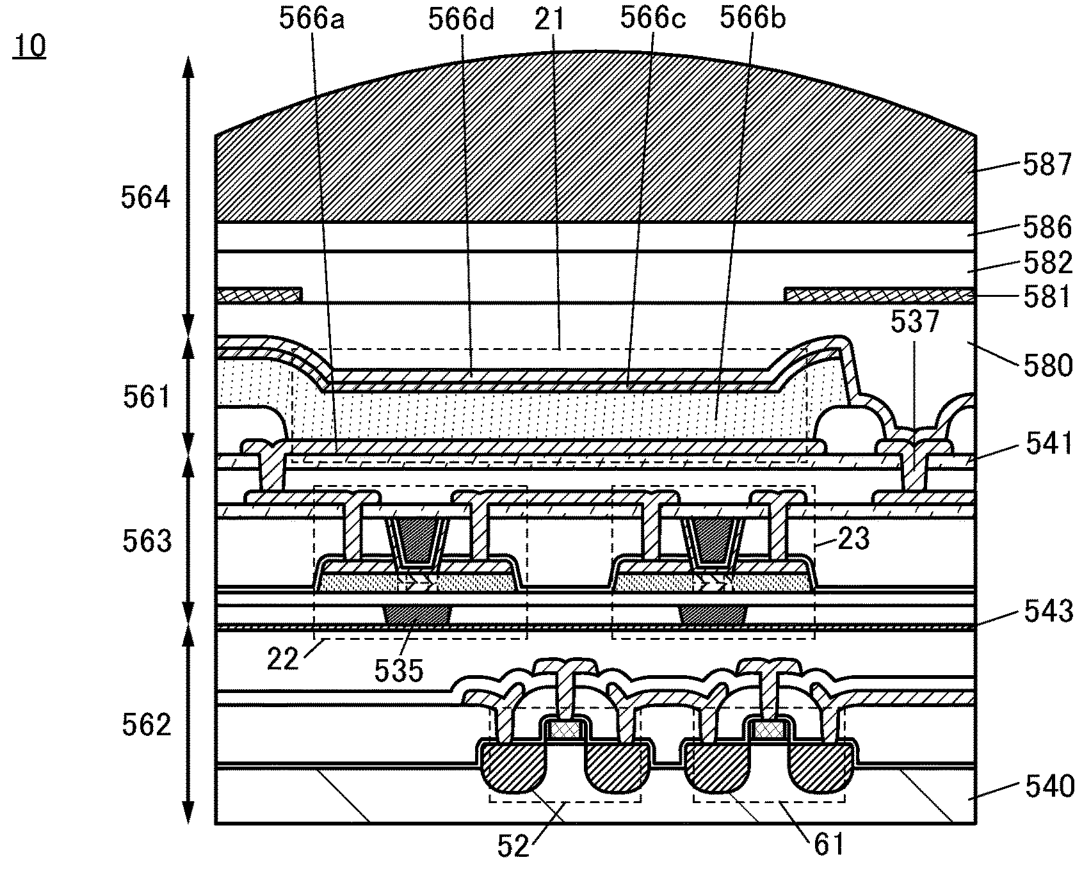

FIG. 24B, FIG. 25A, and FIG. 25B are diagrams each illustrating an example of the imaging device 10. FIG. 24B is a structure example where the imaging device 10 illustrated in FIG. 19B is provided with the layer 564. FIG. 25A is a structure example where the imaging device 10 illustrated in FIG. 21A is provided with the layer 564. FIG. 25B is a structure example where the imaging device 10 illustrated in FIG. 21B is provided with the layer 564. The structure of the layer 564 included in each of the imaging devices 10 illustrated in FIG. 24B, FIG. 25A, and FIG. 25B can be the same as the structure of the layer 564 included in the imaging device 10 illustrated in FIG. 24A.

Figure 26A:
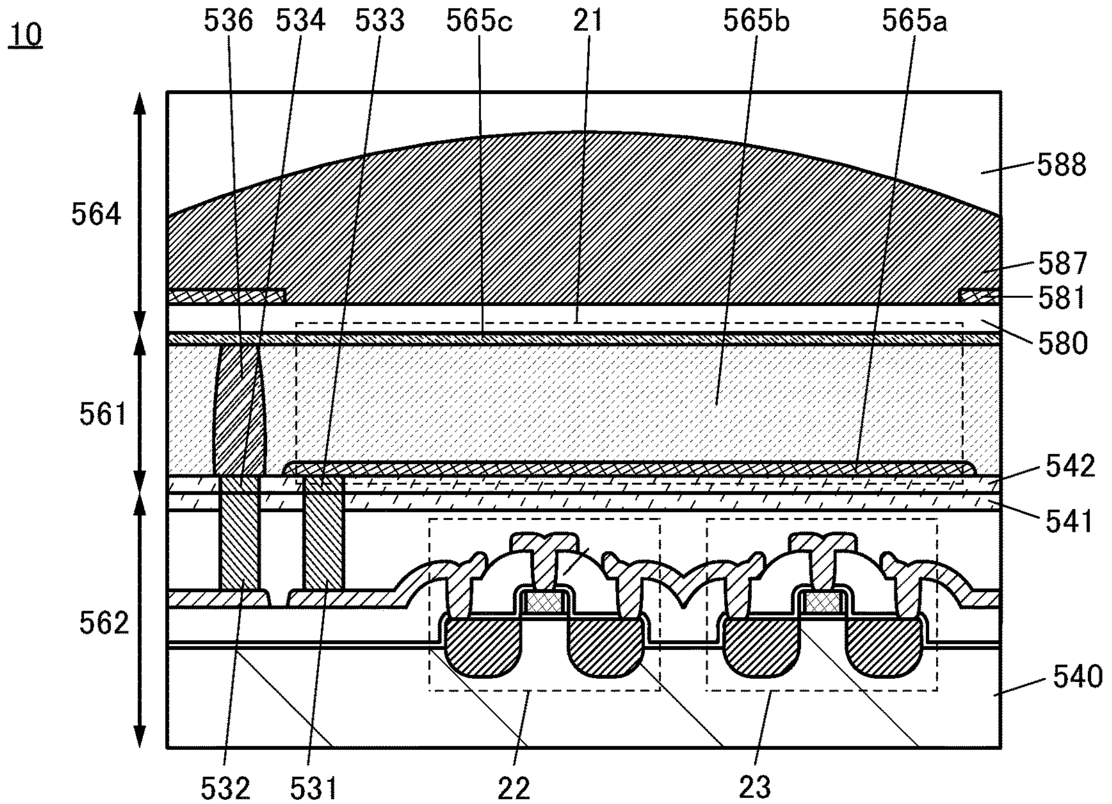
FIG. 26A and FIG. 26B are cross-sectional views each illustrating a structure example of the imaging device.

FIG. 26A is a diagram illustrating an example of the imaging device 10, and is a modification example of the imaging device 10 illustrated in FIG. 24A. The structure of the layer 564 in the imaging device 10 illustrated in FIG. 26A differs from that in the imaging device 10 illustrated in FIG. 24A. The layer 564 provided in the imaging device 10 illustrated in FIG. 26A includes the insulating layer 580, the light-blocking layer 581, the coloring layer 587, and an insulating layer 588.

The insulating layer 580 is formed over the layer 561, and the light-blocking layer 581 and the coloring layer 587 are formed over the insulating layer 580. As described above, the coloring layer 587 can also function as a microlens. Then, the insulating layer 588 is formed over the coloring layer 587. The insulating layer 588 can be a planarization film. The insulating layer 588 is a film having a light-transmitting property with respect to visible light, for example.

Figure 26B:
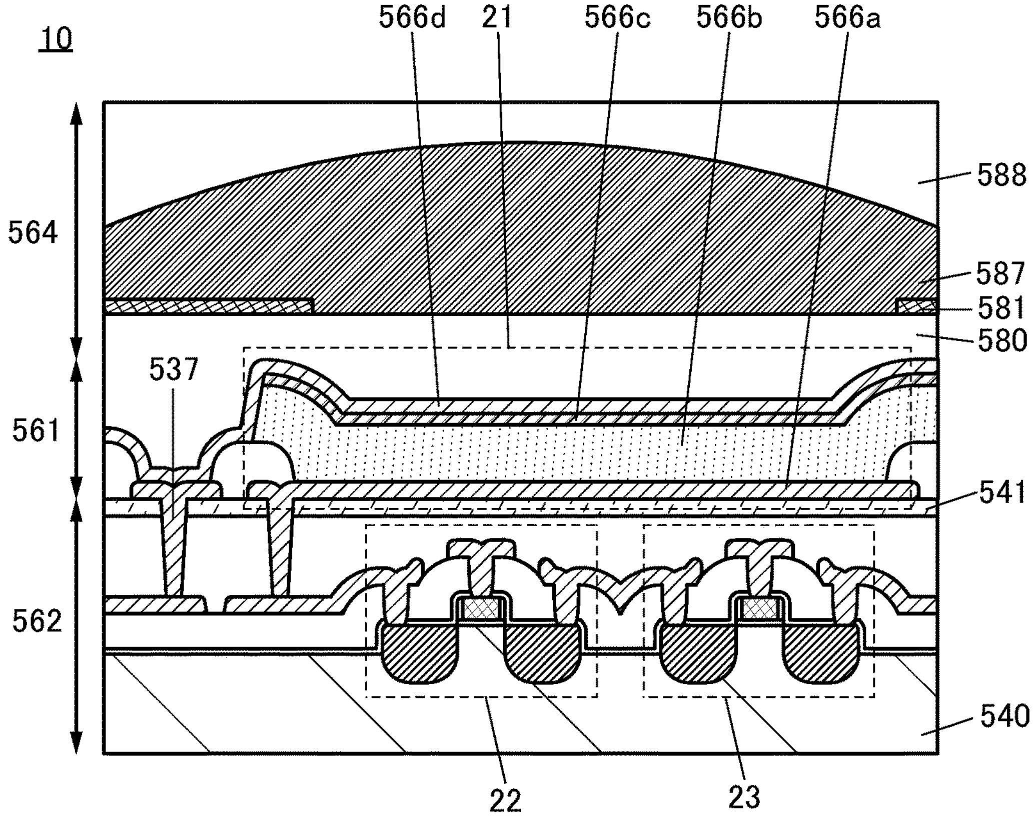
Figure 27A:
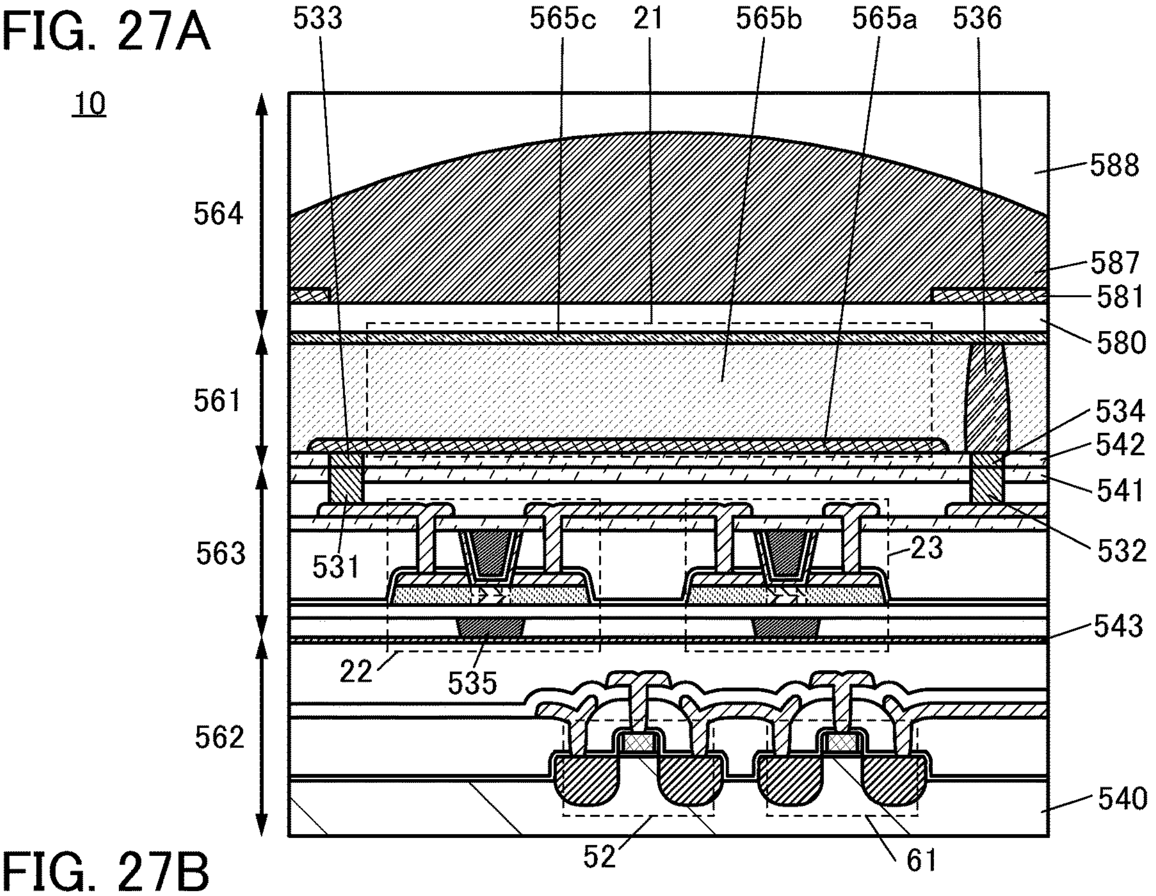
FIG. 27A and FIG. 27B are cross-sectional views each illustrating a structure example of the imaging device.
Figure 27B:
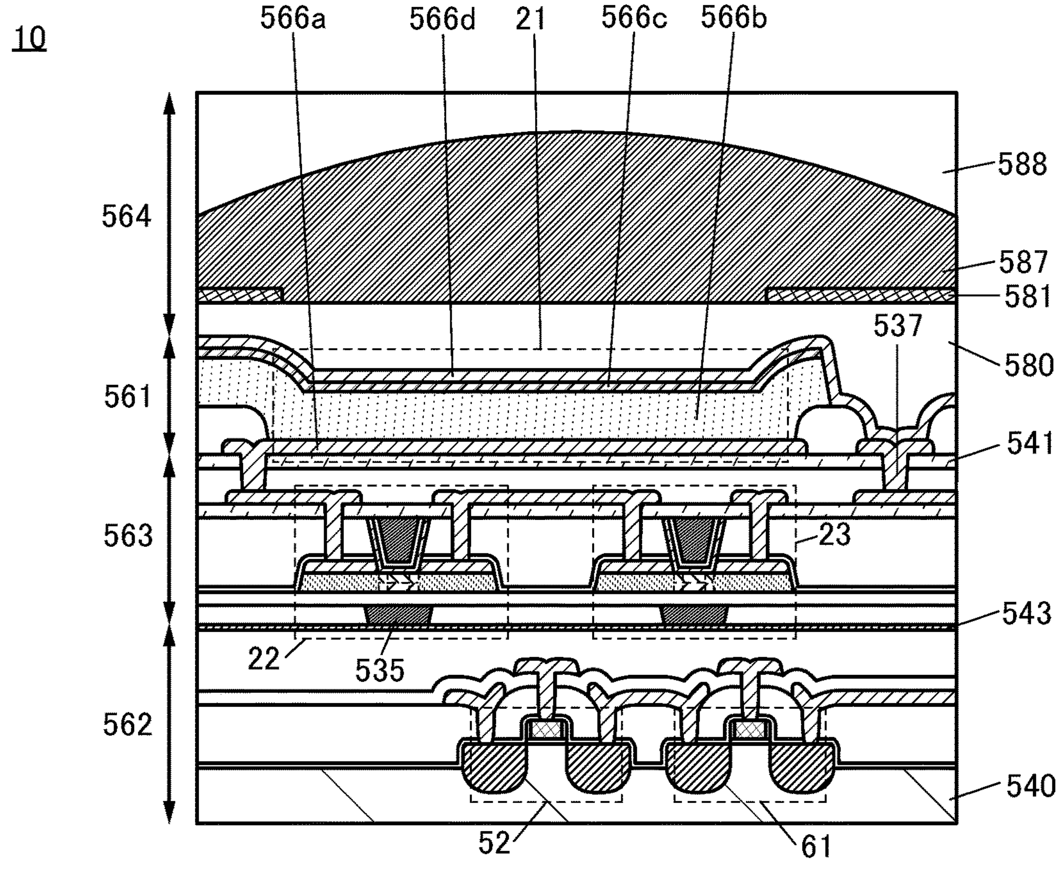

FIG. 26B, FIG. 27A, and FIG. 27B are diagrams illustrating examples of the imaging device 10, and are modification examples of the imaging devices 10 illustrated in FIG. 24B, FIG. 25A, and FIG. 25B, respectively. The layer 564 in the imaging device 10 illustrated in FIG. 26B, FIG. 27A, and FIG. 27B has a structure similar to that of the layer 564 illustrated in FIG.

Figure 28A:
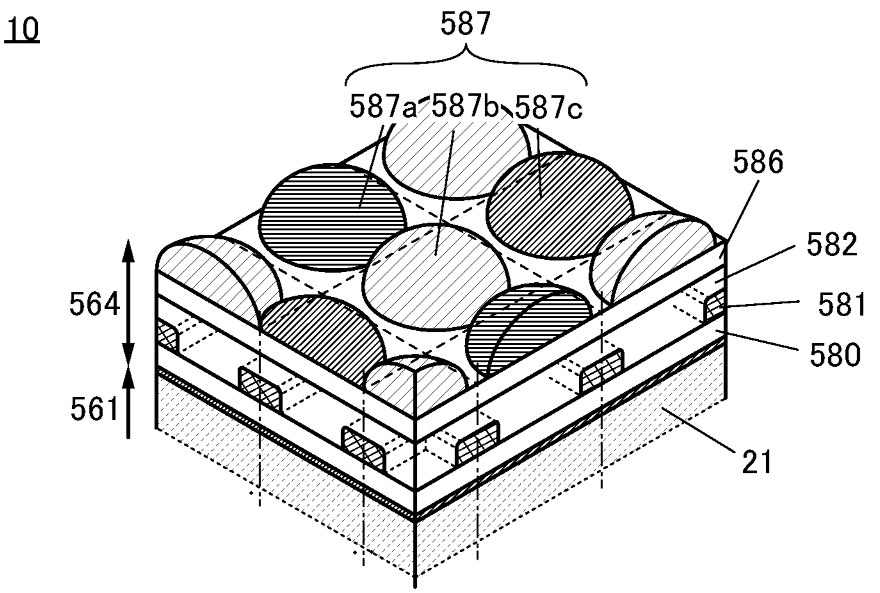
FIG. 28A and FIG. 28B are perspective views each illustrating a structure example of the imaging device.
Figure 28B:
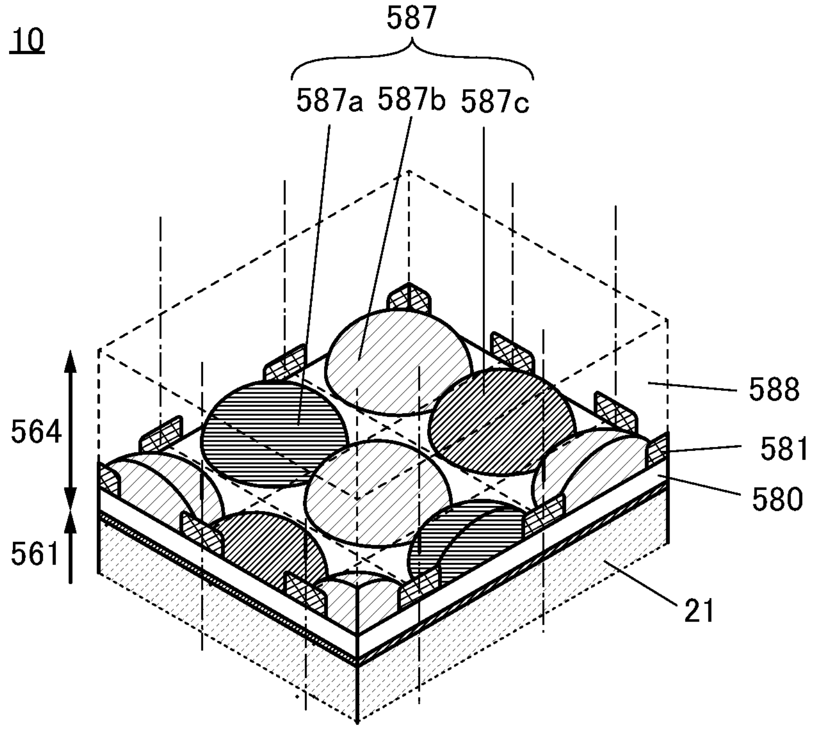

FIG. 28A is a perspective view illustrating a structure example of the layer 564 illustrated in FIG. 24A, FIG. 24B, FIG. 25A, and FIG. 25B. FIG. 28B is a perspective view illustrating a structure example of the layer 564 illustrated in FIG. 26A, FIG. 26B, FIG. 27A, and FIG. 27B. As illustrated in FIG. 28A and FIG. 28B, the coloring layer 587 (a coloring layer 587*a*, a coloring layer 587*b*, and a coloring layer 587*c*) is formed. When colors of R (red), G (green), B (blue), Y (yellow), C (cyan), M (magenta), and the like are assigned to the coloring layer 587*a*, the coloring layer 587*b*, and the coloring layer 587*c*, for example, a color image can be obtained.

This embodiment can be combined with the other embodiments as appropriate.

Embodiment 2

In this embodiment, a metal oxide (hereinafter also referred to as an oxide semiconductor) that can be used in the OS transistor described in the above embodiment will be described.

<Classification of Crystal Structures>

First, the classification of the crystal structures of an oxide semiconductor is described using FIG. 29A. FIG. 29A is a diagram showing the classification of crystal structures of an oxide semiconductor, typically IGZO (a metal oxide containing In, Ga, and Zn).

As shown in FIG. 29A, an oxide semiconductor is roughly classified into “Amorphous,” “Crystalline,” and “Crystal.” In addition, the term “Amorphous” includes completely amorphous. Furthermore, the term “Crystalline” includes CAAC, nc (nanocrystalline), and CAC. Note that in the classification of “Crystalline,” single crystal, poly crystal, and completely amorphous are excluded. Moreover, the term “Crystal” includes single crystal and poly crystal.

Note that the structures in the thick frame shown in FIG. 29A are in an intermediate state between “Amorphous” and “Crystal,” and belong to a new boundary region (new crystalline phase). In other words, these structures can be rephrased as structures completely different from “Amorphous,” which is energetically unstable, and “Crystal.”

Note that a crystal structure of a film or a substrate can be evaluated with an X-Ray Diffraction (XRD) spectrum. Here, FIG. 29B shows an XRD spectrum, which is obtained by GIXD (Grazing-Incidence XRD) measurement, of a CAAC-IGZO film classified into “Crystalline.” Note that a GIXD method is also referred to as a thin film method or a Seemann-Bohlin method. The XRD spectrum that is shown in FIG. 29B and obtained by GIXD measurement is hereinafter simply referred to as an XRD spectrum. Note that the CAAC-IGZO film shown in FIG. 29B has a composition in the vicinity of In:Ga:Zn=4:2:3 [atomic ratio]. In addition, the thickness of the CAAC-IGZO film shown in FIG. 29B is 500 nm.

As shown in FIG. 29B, a clear peak indicating crystallinity is detected in the XRD spectrum of the CAAC-IGZO film. Specifically, a peak indicating c-axis alignment is detected at $2\theta$ of around 31° in the XRD spectrum of the CAAC-IGZO film. Note that as shown in FIG. 29B, the peak at $2\theta$ of around 31° is asymmetric with respect to the axis of an angle at which peak intensity (intensity) is detected.

A crystal structure of a film or a substrate can also be evaluated with a diffraction pattern observed by a nanobeam electron diffraction (NBED) method (such a pattern is also referred to as a nanobeam electron diffraction pattern). FIG. 29C shows a diffraction pattern of the CAAC-IGZO film. FIG. 29C shows a diffraction pattern observed by NBED in which an electron beam is incident in a direction parallel to the substrate. Note that the CAAC-IGZO film shown in FIG. 29C has a composition in the vicinity of In:Ga:Zn=4:2:3 [atomic ratio]. In addition, in the nanobeam electron diffraction method, electron diffraction is performed with a probe diameter of 1 nm.

As shown in FIG. 29C, a plurality of spots indicating c-axis alignment are observed in the diffraction pattern of the CAAC-IGZO film.

<<Structure of Oxide Semiconductor>>

Note that oxide semiconductors might be classified in a manner different from that in FIG. 29A when classified in terms of the crystal structure. Oxide semiconductors are classified into a single crystal oxide semiconductor and a non-single-crystal oxide semiconductor, for example. Examples of the non-single-crystal oxide semiconductor include the CAAC-OS and the nc-OS. Other examples of the non-single-crystal oxide semiconductor include a polycrystalline oxide semiconductor, an amorphous-like oxide semiconductor (a-like OS), an amorphous oxide semiconductor, and the like.

Here, the CAAC-OS, the nc-OS, and the a-like OS are described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of a surface where the CAAC-OS film is formed, or the normal direction of the surface of the CAAC-OS film. In addition, the crystal region refers to a region having periodic atomic arrangement. Note that when atomic arrangement is regarded as lattice arrangement, the crystal region also refers to a region with uniform lattice arrangement. Furthermore, the CAAC-OS has a region where a plurality of crystal regions are connected in an a-b plane direction, and the region has distortion in some cases. Note that distortion refers to a portion where the direction of lattice arrangement changes between a region with uniform lattice arrangement and another region with uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. Alternatively, in the case where the crystal region is formed of a large number of fine crystals, the size of the crystal region is sometimes approximately several tens of nanometers.

In addition, in an In-M-Zn oxide (the element M is one kind or a plurality of kinds selected from aluminum, gallium, yttrium, tin, titanium, and the like), the CAAC-OS tends to have a layer-shaped crystal structure (also referred to as a layer-shaped structure) in which a layer containing indium (In) and oxygen (hereinafter an In layer) and a layer containing the element M, zinc (Zn), and oxygen (hereinafter an (M, Zn) layer) are stacked. Note that indium and the element M can be replaced with each other. Therefore, indium is sometimes contained in the (M, Zn) layer. Furthermore, the element M is sometimes contained in the In layer. Note that Zn is sometimes contained in the In layer. Such a layer-shaped structure is observed as a lattice image in a high-resolution TEM image, for example.

When the CAAC-OS film is subjected to structural analysis by out-of-plane XRD measurement with an XRD apparatus using $\theta/2\theta$ scanning, for example, a peak indicating c-axis alignment is detected at $2\theta$ of 31° or around 31°. Note that the position of the peak indicating c-axis alignment (the value of $2\theta$) might change depending on the kind, composition, or the like of the metal element contained in the CAAC-OS.

In addition, for example, a plurality of bright spots are observed in the electron diffraction pattern of the CAAC-OS film. Note that one spot and another spot are observed point-symmetrically with a spot of an incident electron beam passing through a sample (also referred to as a direct spot) as a symmetric center.

When the crystal region is observed from the particular direction, lattice arrangement in the crystal region is basically hexagonal lattice arrangement; however, a unit lattice is not always a regular hexagon and is a non-regular hexagon in some cases. In addition, pentagonal lattice arrangement, heptagonal lattice arrangement, and the like are included in the distortion in some cases. Note that a clear grain boundary cannot be observed even in the vicinity of the distortion in the CAAC-OS. That is, it is found that formation of a grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear grain boundary is observed is what is called polycrystal. It is highly probable that the grain boundary becomes a recombination center and captures carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, it can be said that a reduction in electron mobility due to the grain boundary is unlikely to occur. In addition, entry of impurities, formation of defects, or the like might decrease the crystallinity of an oxide semiconductor. This means that the CAAC-OS can also be referred to as an oxide semiconductor having small amounts of impurities and defects (oxygen vacancies or the like). Therefore, physical properties of an oxide semiconductor including the CAAC-OS become stable. Accordingly, the oxide semiconductor including the CAAC-OS is resistant to heat and has high reliability. In addition, the CAAC-OS is also stable with respect to high temperatures in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region greater than or equal to 1 nm and less than or equal to 10 nm, in particular, a region greater than or equal to 1 nm and less than or equal to 3 nm) has periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. In addition, there is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on the analysis method. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are obtained in the observed electron diffraction pattern when the nc-OS film is subjected to electron diffraction (also referred to as nanobeam electron diffraction) using an electron beam with a probe diameter close to or smaller than the size of a nanocrystal (e.g., greater than or equal to 1 nm and less than or equal to 30 nm).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

<<Composition of Oxide Semiconductor>>

Next, the CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Here, the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. Alternatively, for example, the first region has higher [In] and lower [Ga] than the second region. Moreover, the second region has higher [Ga] and lower [In] than the first region.

Specifically, the first region includes indium oxide, indium zinc oxide, or the like as its main component. In addition, the second region includes gallium oxide, gallium zinc oxide, or the like as its main component. That is, the first region can be referred to as a region containing In as its main component. Furthermore, the second region can be referred to as a region containing Ga as its main component.

Note that a clear boundary between the first region and the second region cannot be observed in some cases.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (On/Off function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current ($I_{on}$), high field-effect mobility (μ), and excellent switching operation can be achieved.

Oxide semiconductors have various structures and each have different properties. Two or more kinds among the amorphous oxide semiconductor, the polycrystalline oxide semiconductor, the a-like OS, the CAC-OS, the nc-OS, and the CAAC-OS may be included in an oxide semiconductor according to one embodiment of the present invention.

<Transistor Including Oxide Semiconductor>

Next, the case where the oxide semiconductor is used for a transistor is described.

When the oxide semiconductor is used for a transistor, a transistor with high field-effect mobility can be achieved. In addition, a highly reliable transistor can be achieved.

An oxide semiconductor having a low carrier concentration is preferably used for the transistor. For example, the carrier concentration of an oxide semiconductor is lower than or equal to $1\times10^{17}$ $cm^{-3}$, preferably lower than or equal to $1\times10^{15}$ $cm^{-3}$, further preferably lower than or equal to $1\times10^{13}$ $cm^{-3}$, still further preferably lower than or equal to $1\times10^{11}$ $cm^{-3}$, yet further preferably lower than $1\times10^{10}$ $cm^{-3}$, and higher than or equal to $1\times10^{-9}$ $cm^{-3}$. Note that in the case where the carrier concentration of an oxide semiconductor film is lowered, the impurity concentration in the oxide semiconductor film is lowered to decrease the density of defect states. In this specification and the like, a state with a low impurity concentration and a low density of defect states is referred to as a highly purified intrinsic or substantially highly purified intrinsic state. Note that an oxide semiconductor having a low carrier concentration is sometimes referred to as a highly purified intrinsic or substantially highly purified intrinsic oxide semiconductor.

In addition, a highly purified intrinsic or substantially highly purified intrinsic oxide semiconductor film has a low density of defect states and accordingly has a low density of trap states in some cases.

In addition, electric charge captured by the trap states in an oxide semiconductor takes a long time to disappear and might behave like fixed electric charge. Thus, a transistor whose channel formation region is formed in an oxide semiconductor having a high density of trap states has unstable electrical characteristics in some cases.

Accordingly, in order to stabilize electrical characteristics of the transistor, reducing the concentration in the oxide semiconductor is effective. In addition, in order to reduce the impurity concentration in the oxide semiconductor, the impurity concentration in a film that is adjacent to the oxide semiconductor is also preferably reduced. Examples of impurities include hydrogen, nitrogen, an alkali metal, an alkaline earth metal, iron, nickel, silicon, and the like.

<Impurities>

Here, the influence of each impurity in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

In addition, when the oxide semiconductor contains an alkali metal or an alkaline earth metal, defect states are formed and carriers are generated in some cases. Accordingly, a transistor using an oxide semiconductor that contains an alkali metal or an alkaline earth metal tends to have normally-on characteristics. Thus, the concentration of an alkali metal or an alkaline earth metal in the oxide semiconductor that is obtained by SIMS is lower than or equal to $1\times10^{18}$ atoms/cm$^3$, preferably lower than or equal to $2\times10^{16}$ atoms/cm$^3$.

In addition, an oxide semiconductor containing nitrogen easily becomes n-type by generation of electrons serving as carriers and an increase in carrier concentration. Thus, a transistor using an oxide semiconductor that contains nitrogen as the semiconductor tends to have normally-on characteristics. Alternatively, when nitrogen is contained in the oxide semiconductor, a trap state is sometimes formed. This might make the electrical characteristics of the transistor unstable. Therefore, the concentration of nitrogen in the oxide semiconductor that is obtained by SIMS is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

In addition, hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, in some cases, some hydrogen reacts with oxygen bonded to a metal atom and generates an electron serving as a carrier. Thus, a transistor using an oxide semiconductor that contains hydrogen tends to have normally-on characteristics. For this reason, hydrogen in the oxide semiconductor is preferably reduced as much as possible. Specifically, the hydrogen concentration in the oxide semiconductor that is obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics.

This embodiment can be combined with the description of the other embodiments as appropriate.

Embodiment 3

In this embodiment, examples of a package and a camera module in each of which an image sensor chip is placed will be described. For the image sensor chip, the structure of the imaging device can be used.

FIG. 30A1 is an external perspective view of the top surface side of a package in which an image sensor chip is placed. The package includes a package substrate 410 to which an image sensor chip 450 is fixed, a cover glass 420, an adhesive 430 for bonding them, and the like. Note that the image sensor chip 450 is illustrated in FIG. 30A3 to be described later.

FIG. 30A2 is an external perspective view of the bottom surface side of the package. A BGA (Ball grid array) in which solder balls are used as bumps 440 is provided on the bottom surface of the package. Note that, without being limited to the BGA, an LGA (Land grid array), a PGA (Pin Grid Array), or the like may be included.

FIG. 30A3 is a perspective view of the package, in which parts of the cover glass 420 and the adhesive 430 are not illustrated. Electrode pads 460 are formed over the package substrate 410, and the electrode pads 460 and the bumps 440 are electrically connected via through-holes. The electrode pads 460 are electrically connected to the image sensor chip 450 through wires 470.

In addition, FIG. 30B1 is an external perspective view of the top surface side of a camera module in which an image sensor chip is placed in a package with a built-in lens. The camera module includes a package substrate 411 to which an image sensor chip 451 is fixed, a lens cover 421, a lens 435, and the like. Furthermore, an IC chip 490 having functions of a driver circuit, a signal conversion circuit, and the like of the imaging device is provided between the package substrate 411 and the image sensor chip 451; thus, a structure as an SiP (System in package) is included. Note that the image sensor chip 451 and the IC chip 490 are illustrated in FIG. 30B3 to be described later.

FIG. 30B2 is an external perspective view of the bottom surface side of the camera module. A QFN (Quad flat no-lead package) structure in which lands 441 for mounting are provided on the bottom surface and side surfaces of the package substrate 411 is included. Note that this structure is an example, and a QFP (Quad flat package) or the above BGA may be provided.

FIG. 30B3 is a perspective view of the module, in which parts of the lens cover 421 and the lens 435 are not illustrated. The lands 441 are electrically connected to electrode pads 461, and the electrode pads 461 are electrically connected to the image sensor chip 451 or the IC chip 490 through wires 471.

The image sensor chip placed in a package having the above form can be easily mounted on a printed board or the like, and the image sensor chip can be incorporated in a variety of semiconductor devices and electronic devices.

This embodiment can be combined with the other embodiments as appropriate.

Embodiment 4

In this embodiment, examples of an electronic device in which the imaging device according to one embodiment of the present invention can be used will be described.

Examples of an electronic device in which the imaging device according to one embodiment of the present invention can be used include display devices, personal computers, image memory devices or image reproducing devices provided with storage media, cellular phones, game machines including portable game machines, portable data terminals, e-book readers, cameras such as video cameras and digital still cameras, goggle-type displays (head-mounted displays), navigation systems, audio reproducing devices (car audio players, digital audio players, and the like), copiers, facsimiles, printers, multifunction printers, automated teller machines (ATM), vending machines, and the like. FIG. 31A to FIG. 31F illustrate specific examples of these electronic devices.

Figure 31A:
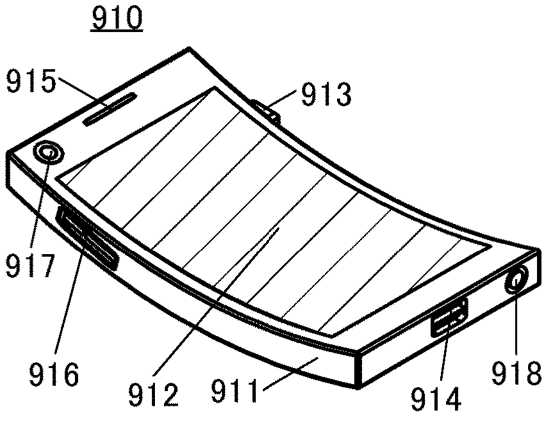
FIG. 31A to FIG. 31F are diagrams illustrating electronic devices.

FIG. 31A is an example of a cellular phone 910, which includes a housing 911, a display portion 912, an operation button 913, an external connection port 914, a speaker 915, a connector 916, a camera 917, an earphone jack 918, and the like. In the cellular phone 910, the display portion 912 can be provided with a touch sensor. A variety of operation such as making a call and inputting a character can be performed by touching the display portion 912 with a finger, a stylus, or the like. In addition, a variety of removable memory devices such as a memory card, for example, an SD card, a USB memory, and an SSD (Solid State Drive), can be inserted in the connector 916.

The imaging device according to one embodiment of the present invention can be applied to the cellular phone 910. For example, the imaging device according to one embodiment of the present invention can be applied to a component for acquiring imaging data in the cellular phone 910, such as the camera 917. The imaging device according to one embodiment of the present invention can perform some operation with a neural network. Thus, the cellular phone 910 can have an additional function such as an image recognition function. In addition, the power consumption of the cellular phone 910 can be reduced compared to the case where all the operation with the neural network is performed using software.

Figure 31B:
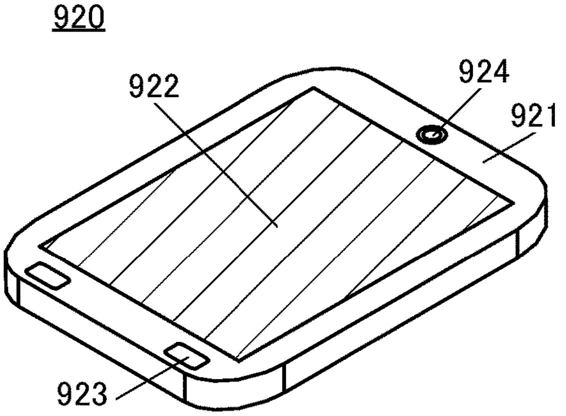

FIG. 31B is an example of a portable data terminal 920, which includes a housing 921, a display portion 922, a speaker 923, a camera 924, and the like. A touch panel function of the display portion 922 enables input and output of information. Furthermore, a character or the like in an image that is captured by the camera 924 can be recognized and the character can be voice-output from the speaker 923.

The imaging device according to one embodiment of the present invention can be applied to the portable data terminal 920. For example, the imaging device according to one embodiment of the present invention can be applied to a component for acquiring imaging data in the portable data terminal 920, such as the camera 924. The imaging device according to one embodiment of the present invention can perform some operation with a neural network. Thus, the portable data terminal 920 can have an additional function such as an image recognition function. In addition, the power consumption of the portable data terminal 920 can be reduced compared to the case where all the operation with the neural network is performed using software.

Figure 31C:
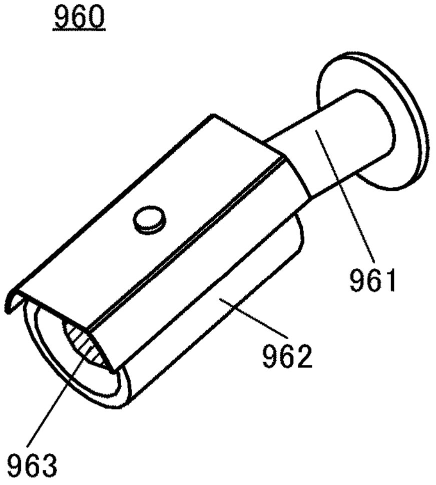

FIG. 31C is an example of a surveillance camera 960, which includes a fixture 961, a housing 962, a lens 963, and the like. The surveillance camera 960 can be mounted on a wall, a ceiling, or the like with the fixture 961. Note that a surveillance camera is a name in common use and does not limit the use thereof. A device that has a function of a surveillance camera can also be referred to as a camera or a video camera, for example.

The imaging device according to one embodiment of the present invention can be applied to the surveillance camera 960. For example, the imaging device according to one embodiment of the present invention can be applied to a component for acquiring imaging data in the surveillance camera 960. The imaging device according to one embodiment of the present invention can perform some operation with a neural network. Thus, the surveillance camera 960 can have an additional function such as an image recognition function. In addition, the power consumption of the surveillance camera 960 can be reduced compared to the case where all the operation with the neural network is performed using software.

Figure 31D:
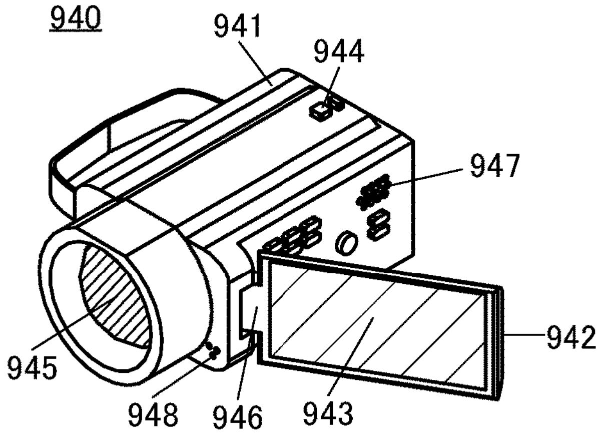

FIG. 31D is an example of a video camera 940, which includes a first housing 941, a second housing 942, a display portion 943, operation keys 944, a lens 945, a hinge 946, a speaker 947, a microphone 948, and the like. The operation keys 944 and the lens 945 can be provided in the first housing 941, and the display portion 943 can be provided in the second housing 942.

The imaging device according to one embodiment of the present invention can be applied to the video camera 940. For example, the imaging device according to one embodiment of the present invention can be applied to a component for acquiring imaging data in the video camera 940. The imaging device according to one embodiment of the present invention can perform some operation with a neural network. Thus, the video camera 940 can have an additional function such as an image recognition function. In addition, the power consumption of the video camera 940 can be reduced compared to the case where all the operation with the neural network is performed using software.

Figure 31E:
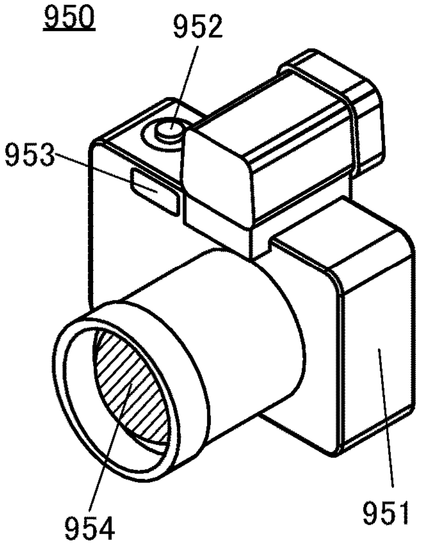

FIG. 31E is an example of a digital camera 950, which includes a housing 951, a shutter button 952, a light-emitting portion 953, a lens 954, and the like. The imaging device according to one embodiment of the present invention can be applied to the digital camera 950. For example, the imaging device according to one embodiment of the present invention can be applied to a component for acquiring imaging data in the digital camera 950. The imaging device according to one embodiment of the present invention can perform some operation with a neural network. Thus, the digital camera 950 can have an additional function such as an image recognition function. In addition, the power consumption of the digital camera 950 can be reduced compared to the case where all the operation with the neural network is performed using software.

Figure 31F:
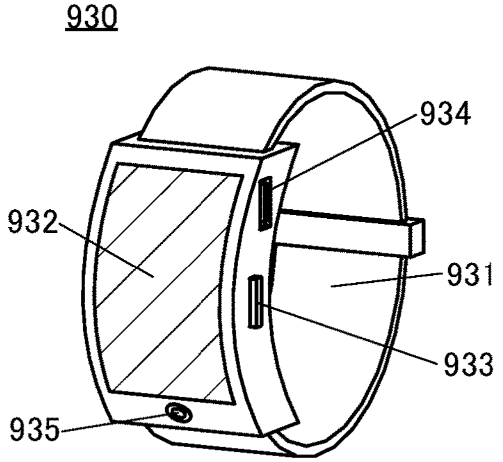

FIG. 31F is an example of a wristwatch-type information terminal 930, which includes a housing/wristband 931, a display portion 932, an operation button 933, an external connection port 934, a camera 935, and the like. The display portion 932 is provided with a touch panel for operating the information terminal 930. The housing/wristband 931 and the display portion 932 have flexibility and fit a body well.

The semiconductor device according to one embodiment of the present invention can be applied to the information terminal 930. For example, the imaging device according to one embodiment of the present invention can be applied to a component for acquiring imaging data in the information terminal 930, such as the camera 935. The imaging device according to one embodiment of the present invention can perform some operation with a neural network. Thus, the information terminal 930 can have an additional function such as an image recognition function. In addition, the power consumption of the information terminal 930 can be reduced compared to the case where all the operation with the neural network is performed using software.

Figure 32A:
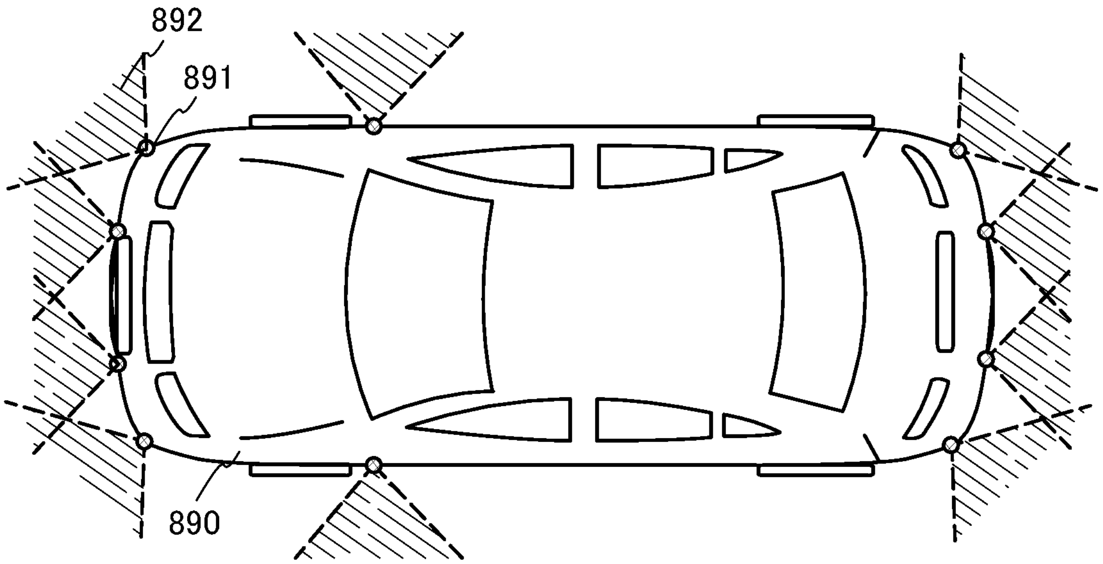
FIG. 32A and FIG. 32B are diagrams each illustrating a motor vehicle.
Figure 32B:
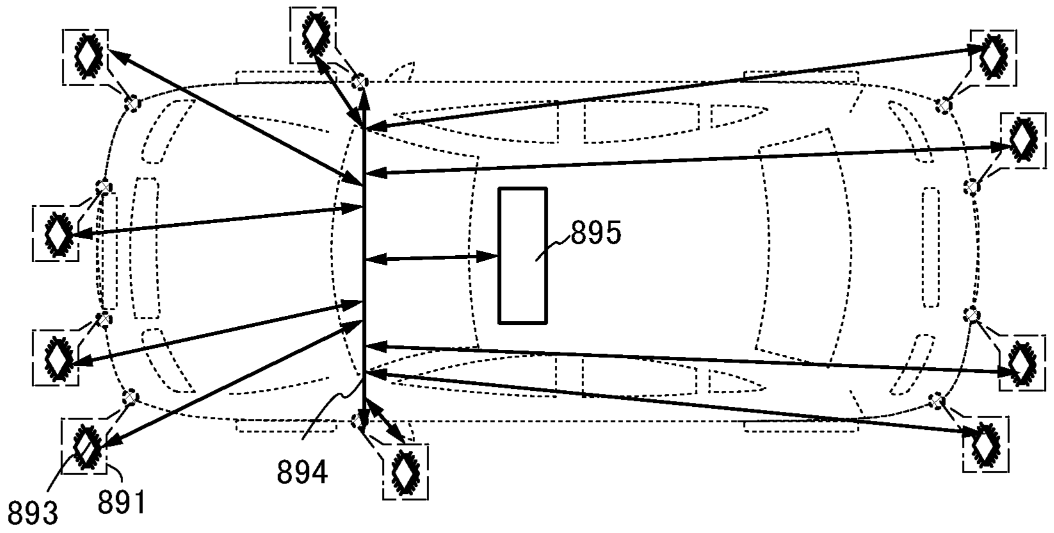

FIG. 32A illustrates an external view of a motor vehicle as an example of a moving object. FIG. 32B is a simplified diagram illustrating data transmission in the motor vehicle. A motor vehicle 890 includes a plurality of cameras 891 and the like. The motor vehicle 890 is also provided with a variety of sensors such as an infrared radar, a millimeter wave radar, and a laser radar (not illustrated) and the like.

The imaging device according to one embodiment of the present invention can be applied to the camera 891. The imaging device according to one embodiment of the present invention can perform some operation with a neural network. Thus, the camera 891 can have an additional function such as an image recognition function. In addition, the power consumption of the motor vehicle 890 can be reduced compared to the case where all the operation with the neural network is performed using software.

In the motor vehicle 890, an integrated circuit 893 can be used for the camera 891 and the like. In the motor vehicle 890, the camera 891 processes a plurality of images obtained in a plurality of imaging directions 892 in the integrated circuit 893 and collectively analyze the plurality of images through a bus 894 or the like using a host controller 895 or the like. Accordingly, the motor vehicle 890 can perform autonomous driving by judging surrounding traffic conditions, such as whether there is a guardrail or a pedestrian. In addition, the integrated circuit 893 can be used for a system for navigation, risk prediction, or the like.

When arithmetic processing of a neural network or the like is performed on obtained image data in the integrated circuit 893, for example, processing for the following can be performed: an increase in image resolution, a reduction in image noise, face recognition (for security reasons or the like), object recognition (for autonomous driving or the like), image compression, image compensation (a wide dynamic range), restoration of an image of a lensless image sensor, positioning, character recognition, and a reduction of glare and reflection.

Note that a motor vehicle is described above as an example of a moving object and may be any of a motor vehicle having an internal-combustion engine, an electric vehicle, a hydrogen vehicle, and the like. Furthermore, the moving object is not limited to a motor vehicle. Examples of moving objects also include a train, a monorail train, a ship, a flying object (a helicopter, an unmanned aircraft (a drone), an airplane, and a rocket), and the like, and these moving objects can include a system utilizing artificial intelligence when equipped with a computer according to one embodiment of the present invention.

This embodiment can be combined with the other embodiments as appropriate.

REFERENCE NUMERALS

10: imaging device, 11: cell array, 12: cell, 13: row driver circuit, 14: data generation circuit, 16: circuit, 17: arithmetic circuit, 21: photoelectric conversion element, 22: transistor, 23: transistor, 24: transistor, 25: transistor, 26: transistor, 27: transistor, 28: transistor, 29: source follower circuit, 32: wiring, 33: wiring, 35: wiring, 36: wiring, 37: wiring, 38: wiring, 41: wiring, 43: wiring, 44: wiring, 45: wiring, 46: wiring, 47: wiring, 48: wiring, 51: logic circuit, 52: transistor, 53: wiring, 54: A/D converter circuit, 61: transistor, 410: package substrate, 411: package substrate, 420: cover glass, 421: lens cover, 430: adhesive, 435: lens, 440: bump, 441: land, 450: image sensor chip, 451: image sensor chip, 460: electrode pad, 461: electrode pad, 470: wire, 471: wire, 490: IC chip, 531: conductive layer, 532: conductive layer, 533: conductive layer, 534: conductive layer, 535: back gate, 536: region, 537: conductive layer, 540: silicon substrate, 541: insulating layer, 542: insulating layer, 543: insulating layer, 545: semiconductor layer, 546: insulating layer, 561: layer, 562: layer, 563: layer, 564: layer, 565*a*: layer, 565*b*: layer, 565*c*: layer, 566*a*: layer, 566*b*: layer, 566*c*: layer, 566*d*: layer, 567*a*: layer, 567*b*: layer, 567*c*: layer, 567*d*: layer, 567*e*: layer, 580: insulating layer, 581: light-blocking layer, 582: insulating layer, 583: coloring layer, 583*a*: coloring layer, 583*b*: coloring layer, 583*c*: coloring layer, 584: microlens array, 585: optical conversion layer, 586: insulating layer, 587: coloring layer, 587*a*: coloring layer, 587*b*: coloring layer, 587*c*: coloring layer, 588: insulating layer, 701: gate electrode, 702: gate insulating film, 703: source region, 704: drain region, 705: source electrode, 706: drain electrode, 707: oxide semiconductor layer, 890: motor vehicle, 891: camera, 892: imaging direction, 893: integrated circuit, 894: bus, 895: host controller, 910: cellular phone, 911: housing, 912: display portion, 913: operation button, 914: external connection port, 915: speaker, 916: connector, 917: camera, 918: earphone jack, 920: portable data terminal, 921: housing, 922: display portion, 923: speaker, 924: camera, 930: information terminal, 931: housing/wristband, 932: display portion, 933: operation button, 934: external connection port, 935: camera, 940: video camera, 941: housing, 942: housing, 943: display portion, 944: operation key, 945: lens, 946: hinge, 947: speaker, 948: microphone, 950: digital camera, 951: housing, 952: shutter button, 953: light-emitting portion, 954: lens, 960: surveillance camera, 961: fixture, 962: housing, and 963: lens.

The invention claimed is:

1. An imaging device comprising:

a cell array where a plurality of cells are arranged in a matrix;

a logic circuit; and a read circuit, wherein each of the plurality of cells includes a photoelectric conversion element, wherein a first cell of the plurality of cells is configured to acquire imaging data using the photoelectric conversion element, wherein a second cell of the plurality of cells is configured to retain weight data, wherein each of the first cell and the second cell includes a first transistor, a second transistor, a third transistor, and a fourth transistor, wherein one electrode of the photoelectric conversion element is electrically connected to one of a source and a drain of the first transistor, wherein the other of the source and the drain of the first transistor is electrically connected to one of a source and a drain of the second transistor, wherein the one of the source and the drain of the second transistor is electrically connected to a gate of the third transistor, wherein one of a source and a drain of the third transistor is electrically connected to one of a source and a drain of the fourth transistor, wherein the other of the source and the drain of the fourth transistor is electrically connected to the read circuit, wherein the second cell is configured to retain the weight data supplied through the source and the drain of the second transistor, wherein the second cell is configured to output the weight data from the other of the source and the drain of the third transistor, and wherein the logic circuit is configured to calculate a product of the imaging data acquired by the first cell and the weight data retained by the second cell.

2. The imaging device according to claim 1, wherein the first cell is configured to output the imaging data as binary data from the other of the source and the drain of the third transistor, and wherein the second cell is configured to output the weight data as binary data from the other of the source and the drain of the third transistor.

3. The imaging device according to claim 1, wherein the first transistor and the second transistor each include a metal oxide in a channel formation region, and wherein the metal oxide contains In, Zn, and M, M being Al, Ti, Ga, Ge, Sn, Y, Zr, La, Ce, Nd, or Hf.

4. The imaging device according to claim 1, further comprising a coloring layer, wherein at least one of the first to fourth transistors has a region overlapping the photoelectric conversion element and the coloring layer, and wherein the coloring layer has a function of a microlens.

5. The imaging device according to claim 4, wherein the logic circuit includes a fifth transistor, and wherein the logic circuit has a region where the fifth transistor, at least one of the first to fourth transistors, the photoelectric conversion element, and the coloring layer overlap each other.

6. The imaging device according to claim 1, further comprising an A/D converter circuit, wherein each of the first cell and the second cell further includes a fifth transistor, wherein the one of the source and the drain of the fourth transistor is electrically connected to one of a source and a drain of the fifth transistor, wherein the one of the source and the drain of the fifth transistor is electrically connected to the A/D converter circuit, wherein the A/D converter circuit is electrically connected to the logic circuit, wherein a first potential is supplied to the other of the source and the drain of the third transistor, wherein a second potential is supplied to the other of the source and the drain of the fifth transistor, and wherein the first cell is configured to output the imaging data from the one of the source and the drain of the third transistor or the other of the source and the drain of the fourth transistor.

7. The imaging device according to claim 6, wherein the first transistor and the second transistor each include a metal oxide in a channel formation region, and wherein the metal oxide contains In, Zn, and M, M being Al, Ti, Ga, Ge, Sn, Y, Zr, La, Ce, Nd, or Hf.

8. The imaging device according to claim 6, further comprising a coloring layer, wherein at least one of the first to fifth transistors has a region overlapping the photoelectric conversion element and the coloring layer, and wherein the coloring layer has a function of a microlens.

9. The imaging device according to claim 8, wherein the logic circuit includes a sixth transistor, and wherein the logic circuit has a region where the sixth transistor, at least one of the first to fifth transistors, the photoelectric conversion element, and the coloring layer overlap each other.

10. The imaging device according to claim 1, wherein the other of the source and the drain of the third transistor is electrically connected to the logic circuit, and wherein the first cell is configured to output the imaging data from the other of the source and the drain of the third transistor or the other of the source and the drain of the fourth transistor.

11. An electronic device comprising:

the imaging device according to claim 1, and a display portion.

12. An imaging device comprising:

a cell array where a plurality of cells are arranged in a matrix;

a logic circuit; and a read circuit, wherein each of the plurality of cells includes a photoelectric conversion element, wherein each of the plurality of cells is configured to acquire imaging data using the photoelectric conversion element, wherein each of the plurality of cells is configured to retain weight data, wherein the logic circuit is configured to perform an arithmetic operation using first imaging data, second imaging data, first weight data, and second weight data in the case where, among the plurality of cells, a first cell acquires the first imaging data, a second cell acquires the second imaging data, a third cell retains the first weight data, and a fourth cell retains the second weight data, wherein each of the first cell, the second cell, the third cell, and the fourth cell includes a first transistor, a second transistor, a third transistor, and a fourth transistor, wherein one electrode of the photoelectric conversion element is electrically connected to one of a source and a drain of the first transistor, wherein the other of the source and the drain of the first transistor is electrically connected to one of a source and a drain of the second transistor, wherein the one of the source and the drain of the second transistor is electrically connected to a gate of the third transistor, wherein one of a source and a drain of the third transistor is electrically connected to one of a source and a drain of the fourth transistor, and wherein the other of the source and the drain of the fourth transistor is electrically connected to the read circuit.

13. The imaging device according to claim 12, wherein the logic circuit is configured to calculate the sum of a product of the first imaging data and the first weight data and a product of the second imaging data and the second weight data.

14. The imaging device according to claim 12, wherein the third cell is configured to retain the first weight data supplied through the source and the drain of the second transistor, wherein the fourth cell is configured to retain the second weight data supplied through the source and the drain of the second transistor, wherein the first cell is configured to output the first imaging data from the other of the source and the drain of the third transistor or the other of the source and the drain of the fourth transistor, wherein the second cell is configured to output the second imaging data from the other of the source and the drain of the third transistor or the other of the source and the drain of the fourth transistor, wherein the third cell is configured to output the first weight data from the other of the source and the drain of the third transistor, and wherein the fourth cell is configured to output the second weight data from the other of the source and the drain of the third transistor.

15. The imaging device according to claim 14, wherein the first cell is configured to output the first imaging data as binary data from the other of the source and the drain of the third transistor, and wherein the third cell is configured to output the first weight data as binary data from the other of the source and the drain of the third transistor.

16. The imaging device according to claim 12, further comprising a coloring layer, wherein at least one of the first to fourth transistors has a region overlapping the photoelectric conversion element and the coloring layer, and wherein the coloring layer has a function of a microlens.

17. The imaging device according to claim 12, further comprising an A/D converter circuit, wherein each of the first cell and the third cell includes a fifth transistor, wherein the one of the source and the drain of the fourth transistor is electrically connected to one of a source and a drain of the fifth transistor, wherein the other of the source and the drain of the fourth transistor is electrically connected to the read circuit, wherein the one of the source and the drain of the fifth transistor is electrically connected to the A/D converter circuit, wherein the A/D converter circuit is electrically connected to the logic circuit, wherein a first potential is supplied to the other of the source and the drain of the third transistor, wherein a second potential is supplied to the other of the source and the drain of the fifth transistor, wherein the third cell is configured to retain the first weight data supplied through the source and the drain of the second transistor, wherein the first cell is configured to output the first imaging data from the one of the source and the drain of the third transistor or the other of the source and the drain of the fourth transistor, and wherein the third cell is configured to output the first weight data from the one of the source and the drain of the third transistor.

18. An electronic device comprising:

the imaging device according to claim 12, and a display portion.

* * * * *